United States Patent [19]
Savoy et al.

[11] Patent Number: 5,341,133
[45] Date of Patent: Aug. 23, 1994

[54] KEYBOARD HAVING TOUCH SENSOR KEYS FOR CONVEYING INFORMATION ELECTRONICALLY

[75] Inventors: Robert L. Savoy, Arlington; J. Winfield Hill, Chestnut Hill, both of Mass.

[73] Assignee: The Rowland Institute for Science, Inc., Cambridge, Mass.

[21] Appl. No.: 697,950

[22] Filed: May 9, 1991

[51] Int. Cl.$^5$ .................. H03M 11/00; H03M 17/94; G06F 3/00
[52] U.S. Cl. ......................... 341/22; 341/26; 341/31; 345/158; 345/168; 345/173; 345/175; 250/208.4
[58] Field of Search ............ 341/21, 31, 22, 23, 341/26, 34; 250/553, 208.2, 208.3, 208.4, 208.5, 208.6, 227.22, 221, 215; 200/314, 317; 340/709, 712, 710, 711; 345/158, 160, 168, 170, 172, 173, 174–177

[56] References Cited

U.S. PATENT DOCUMENTS

| | | | |
|---|---|---|---|
| 3,996,476 | 12/1976 | Lazzara | 250/553 |
| 4,070,661 | 1/1978 | Marko | 250/208.6 |
| 4,254,333 | 3/1981 | Bergstrom | 250/221 |
| 4,311,990 | 1/1982 | Burke | 250/221 |
| 4,588,348 | 5/1986 | Beni et al. | 414/730 |
| 4,605,927 | 8/1986 | Katz et al. | 340/825.19 |
| 4,645,920 | 2/1987 | Carroll et al. | 250/221 |
| 4,684,801 | 8/1987 | Carroll et al. | 250/221 |
| 4,701,747 | 10/1987 | Isherwood et al. | 250/221 |
| 4,745,812 | 5/1988 | Amazeen et al. | 73/862.04 |
| 4,761,546 | 8/1988 | Ikari et al. | 250/208.5 |
| 4,888,532 | 12/1989 | Jösson | 250/208.6 |
| 4,893,025 | 1/1990 | Lee | 250/208.3 |
| 4,896,554 | 1/1990 | Culver | 340/710 |
| 4,908,574 | 3/1990 | Rhoades et al. | 324/675 |
| 4,908,845 | 3/1990 | Little | 379/51 |
| 4,920,260 | 4/1990 | Victor et al. | 250/221 |
| 4,937,443 | 6/1990 | Smoot | 341/31 |
| 5,012,082 | 4/1991 | Watanabe | 250/208.2 |
| 5,016,008 | 5/1991 | Gruaz et al. | 341/33 |

FOREIGN PATENT DOCUMENTS 3214306 10/1983 Fed. Rep. of Germany .
56-162135 12/1981 Japan .
WO8504295 9/1985 PCT Int'l Appl. .

OTHER PUBLICATIONS

"Robotic Tactile Sensing" by Kirk E. Pennywitt (an article in BYTE magazine, January 1986, pp. 177–200).
"Programmable Finger–Tracking Instrument Controllers" by Rubin and McAvinney (Computer Music Journal, vol. 14, No. 1, Spring, 1990), pp. 26–41.
"Evolution of the Keyboard Interface: The Bosendorfer 290 SE Recording Piano and the Moog Multiply-Touch-Sensitive Keyboards" by Moog and Rhea (Computer Music Journal, vol. 14, No. 2, Summer, 1990), pp. 52–60.
"Touch-and-Feel Interfaces: Built-in pointing devices replace mice in notebooks and laptops" (an article in BYTE magazine, Feb. 1991), pp. 223–226.
"Tactile sensing, 3-D vision, and more precise arm movements herald the hardware trends in industrial robots" by Roger Allan (Electronic Design, May 12, 1983), pp. 99–112.
P. 76 from Electronics (November 3, 1983).
The Journal of Intelligent Machines: Robotics Age (Nov. 1984, vol. 6, No. 11), "New Products" section.
"Silicon Succeeds in Tough Sensing" by Carl Kowalski (an article in Robotics Today, Apr. 1985, pp. 29–32).
B. V. Jayawant, J. D. McK Watson, and K. D. Baker, "Tactile Sensing in Robots".
"Silicon Sensors Allow Smooth Touch" by Joseph K. Corrado (an article in Design News, Nov. 19, 1984), pp. 108–109.
"Development of a System to Prevent Bedsores" by Funakubo, Dohi, Komeda, and Isomura (a paper in the Journal of the Faculty of Engineering, The University of Tokyo, vol. 38, No. 3, 1986, pp. 1–15).

*Primary Examiner*—John K. Peng
*Assistant Examiner*—A. M. Hill
*Attorney, Agent, or Firm*—Fish & Richardson

[57] ABSTRACT

A keyboard for an electronic device includes a first key having a touch surface which, in one mode, is responsive to pressing by a user's finger to indicate a selection associated with the first key, and an array of sensors exposed at the touch surface to detect, in another mode, the location where a finger is positioned on the touch surface as an indication of information to be conveyed by a user. The keyboard also includes a second key having an array of sensors which are exposed at a touch surface of the second key and which are sensitive to manipulations of a finger on the touch surface to provide signals used for switching the first key from the one mode to the other mode.

26 Claims, 16 Drawing Sheets

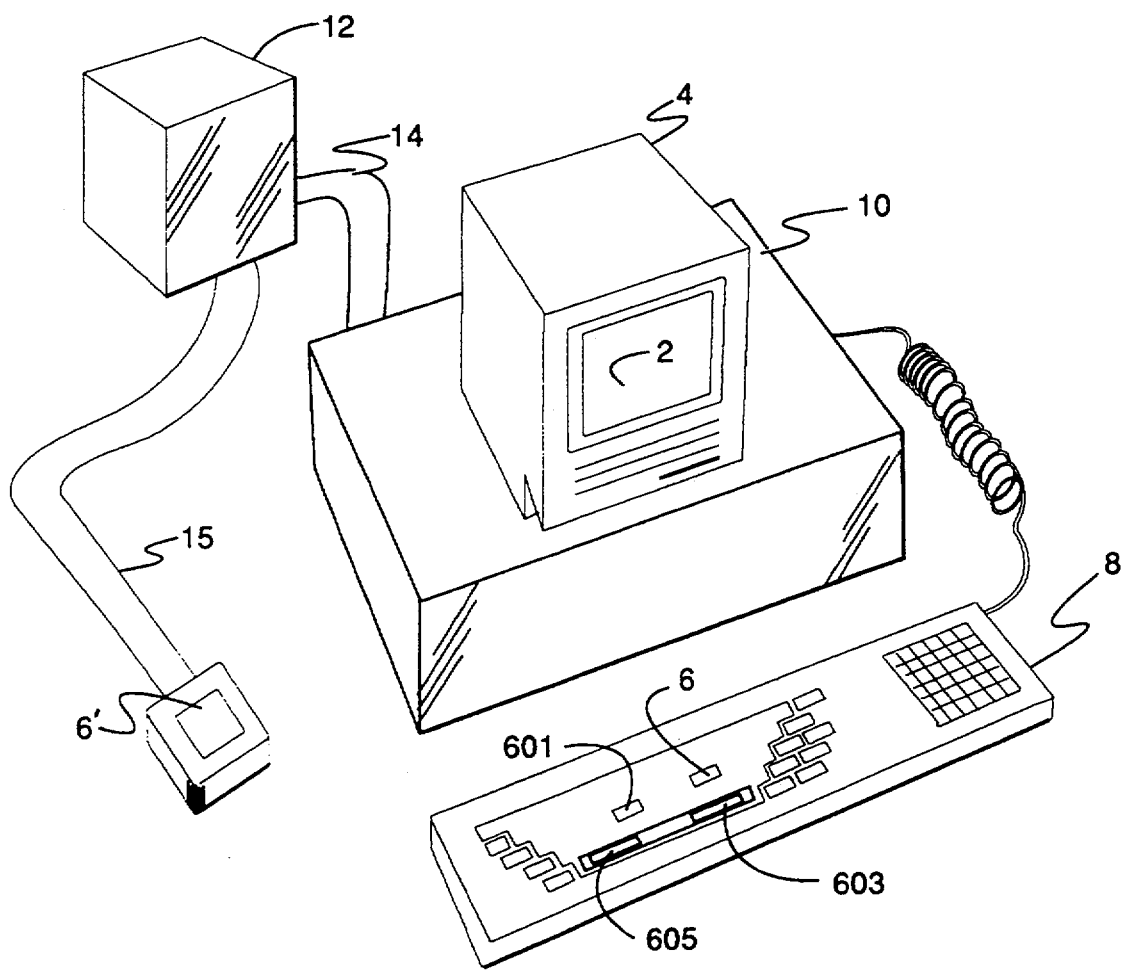
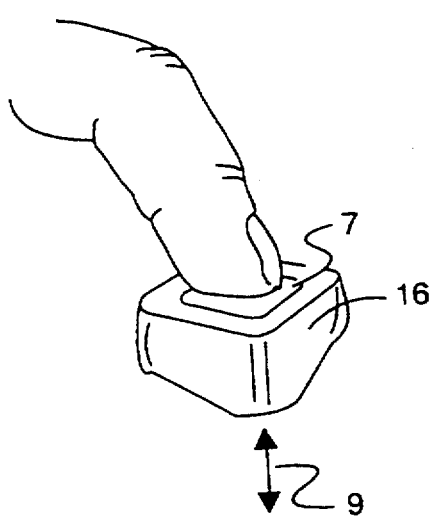
FIG. 1
FIG. 2

KEYBOARD HAVING TOUCH SENSOR KEYS FOR CONVEYING INFORMATION ELECTRONICALLY

BACKGROUND OF THE INVENTION

This invention relates to conveying information electronically.

A computer user, for example, typically enters information into the computer via a conventional keyboard which converts finger pressure on keys to corresponding character encoded signals, or via a pointing device (a mouse, trackball, joystick, digitizing tablet, or touch screen) which converts the user's hand and finger manipulations to signals representing, for example, positions of a cursor and selections to be made.

Some devices use light, instead of moving parts, as the medium through which the user can convey the information. In some touch screens, for example, light sources lined up along the top and left edges of a computer monitor send light beams toward corresponding sensors lined up along the right and bottom edges. When the user's finger interrupts the light beams, an X,Y coordinate position is determined, U.S. Pat. No. 4,684,801.

Robots sometimes use pressure sensors to aid robotic manipulations of real objects, Pennywitt, Robot Tactile Sensing, BYTE magazine, January, 1986. One such sensor, developed by Lord Corporation, has a deformable surface overlaid on an array of pins. Each pin, when depressed, interrupts a beam passing (parallel to the deformable surface) from a photo-emitter to a photo-detector.

Two other tactile devices, described in U.S. Pat. No. 4,588,348 and U.S. Pat. No. 4,745,812, both have 4-by-4 arrays of tactile sensors arranged in rectangular grids of approximately 6-by-6 millimeters or 0.25-by-0.25 inches. They respectively use magneto-resistive elements and piezo-resistive micro-machined micro-miniature silicon devices for pressure sensing. Both patents cite robotic tactile sensing as the primary application, but mention other potential applications. The device described in the '348 patent purportedly yields data about tangential forces and torque, as well as pressure.

Devices used for generating music have included air drums having rotational acceleration sensors, a Radio Drum which uses proximity sensors and multiple finger position and pressure sensors, and a Videoharp which uses a long neon tube and DRAM sensing of the interruption of light rays from the tube to the DRAM sensor, Rubine and McAvinney, Programmable Finger-Tracking Instrument Controllers, Computer Music Journal, Volume 14, number 1, spring, 1990.

Two other music generating devices are the Bosendorfer 290 SE Recording Piano, which uses mechanical interruption of light transmitted between light-emitting diodes and phototransistors to sense the one-dimensional position and velocity of the piano keys, and the Moog Multiply-Touch-Sensitive Keyboard, which uses resistive film as a dielectric for capacitively sensing the left-and-right and forward-and-back positions of an individual keyboard key, and uses another capacitive technology to sense the up-and-down position of the key. In both the Bosendorfer and the Moog, the goal is to sense and record the performer's finger movements in sufficient detail to permit accurately reproducing the performance, Computer Music Journal, Volume 14, number 2, summer, 1990.

SUMMARY OF THE INVENTION

In general, in one aspect, the invention features apparatus for enabling a human to use his finger or tongue to convey information electronically. A set of at least four sensors defines an action area within which the finger or tongue is manipulated to convey the information, the sensors being arranged to produce signal patterns by responding, other than via moving parts, to manipulations of the finger or tongue within the action area with finger or tongue pressures as small as zero, the signal patterns including signals for more than one of the sensors simultaneously. Circuitry is connected to respond to the signal patterns produced by the sensors and to provide corresponding information signals representing the information to be conveyed.

In general, in another aspect of the invention, the action area is no larger than one square inch.

In general, in another aspect of the invention, the action area is configured on a sphere-like surface.

In general, in another aspect, the invention features apparatus for enabling a human to use his finger or tongue to convey items of information electronically, each item of information having one of m possible values. The apparatus includes n (n at least an order of magnitude smaller than m) sensors defining an action area within which the finger or tongue is manipulated to convey the item of information, each of the n sensors being associated with a sensitive point in the action area, the sensitive points for different ones of the n sensors being spaced apart within the action area, the separations between adjacent sensitive points being small enough so that the finger or tongue may act on more than one sensitive point simultaneously. The sensors are arranged to produce signal patterns by responding, other than via moving parts, to the positioning of the finger or tongue within the action area with finger or tongue pressures as small as zero, different positionings of the finger or tongue producing at least m different possible signal patterns. Circuitry is connected to translate each signal pattern produced by the sensors to an information signal corresponding to an item of information to be conveyed.

In general, in another aspect, the invention features a key for a keyboard of an electronic device in which a key body is mounted to be movable in a direction to indicate selection of a character represented by the key. The key body has a touch surface to be pressed to cause the key to move. An array of sensors is exposed at and defines an action area at the touch surface to detect, without moving parts, the location where a finger is positioned on the touch surface as an indication of information to be conveyed by a user.

In general, in another aspect, the invention features a portable remote controller for an electronic device. The controller includes a touch surface, a set of at least four sensors defining an action area within which a finger of a user may be manipulated to indicate control instructions for the electronic device, the sensors being arranged to produce signal patterns in response, other than via moving parts, to manipulation of the finger within the action area at finger or tongue pressures as small as zero. A transmitter is included for wirelessly transmitting signals corresponding to the signal patterns produced by the sensors. A portable source of power is provided for the sensors and the transmitter.

Preferred embodiments of the invention include the following features. The circuitry is adapted to provide information about the position of a pointer on a computer display. The number of possible positions for the pointer on the computer display is at least three orders of magnitude greater than the number of sensors. The number of possible positions is at least 256×256, and the number of sensors is no greater than sixteen. The action area is situated on the upper surface of a key of a computer keyboard. Each sensor comprises electro-optical elements (e.g., a light emitting diode and a phototransistor) which operate in the infra-red spectrum. The beam source and beam detector are oriented (e.g., along parallel optical axes, perpendicular to the surface on which the active area lies) so that the beam detector can detect a beam originating from the beam source and which is reflected by the finger or tongue. A selection device is provided for enabling a user to indicate a selection relative to a position of the pointer on the display.

The sensors are arranged in a rectangular or linear array and number fewer than fifty (sixteen or twenty-five or thirty-six sensors arranged in a square).

The action area may be situated on the upper surface of a keyboard key (e.g., the J key) and there may be an additional set of sensors mounted on another key (e.g., the <SPACE> bar) of the keyboard. The additional set of sensors are arranged in a row defining a second action area within which a thumb is manipulated. The circuitry may be adapted to respond to motion of the thumb.

The action area may be generally flat, or three-dimensional (e.g., lying on a sphere-like surface). The action area may be smaller than ¾ square inches. The sensors and circuitry may be mounted in a self-contained unit together with a portable power supply, and a wireless transmitter. Mounts may be provided for attaching the self-contained unit inside the mouth. The sensors may be arranged in a row around the palate of the user's mouth.

The circuitry includes timing elements for causing the apparatus to operate in scans, a signal pattern being derived from the sensors for each scan. The circuitry includes analysis elements for generating a value (e.g., representing position, velocity or a point within a possible range of a continuous parameter, such as a parameter associated with video or audio signals) representative of the signal pattern for each scan, each signal pattern corresponding to information to be conveyed by the user. The circuitry includes a noise suppressor for reducing the effect of background noise on the signal patterns.

Each sensor of the array is adapted to provide an output signal having more (e.g., many more, such as could be represented by 12 bits) than two possible levels.

The sensors may be arranged in an array and the circuitry may include a center-of-mass computational element which determines a center of mass of output signals provided by the sensors using the signal from each sensor as a weight and the horizontal and vertical positions of that sensor within the array as coordinates.

Embodiments of the invention have many advantages. They may be made quite small, need have no moving parts, require as little as zero finger or tongue pressure for operation, and function with any reflective surface. They make it easier and more natural for people to convey information (e.g., two-dimensional position or motion information) to electronic devices, including computers, than conventional input devices, such as trackballs, joysticks, mechanical and optical mice, digitizing tablets, and touchscreens. They are fast (e.g., the entire array can be sampled at least 60 times per second) and easy and inexpensive to manufacture. The finger or tongue need not exert any pressure on the array. While small enough to fit on a standard key of a computer keyboard, they are also large enough to take full advantage of the manipulation capabilities of the tongue and finger. They are useable in a mouth, for quadriplegic people who have no use of their hands or feet, and for a variety of situations where it is inconvenient to use fingers to indicate position or velocity. They would be especially useful for computers that have graphical user interfaces and which, therefore, make extensive use of a pointing device, and especially for small laptop and notebook computers.

Other advantages and features will become apparent from the following description and from the claims.

DESCRIPTION

We first briefly describe the drawings.

FIG. 1 is a stylized perspective view of a computer with a sensor array mounted on a key of the keyboard.

FIG. 2 is a perspective view of a portion of a key.

Figure 4:
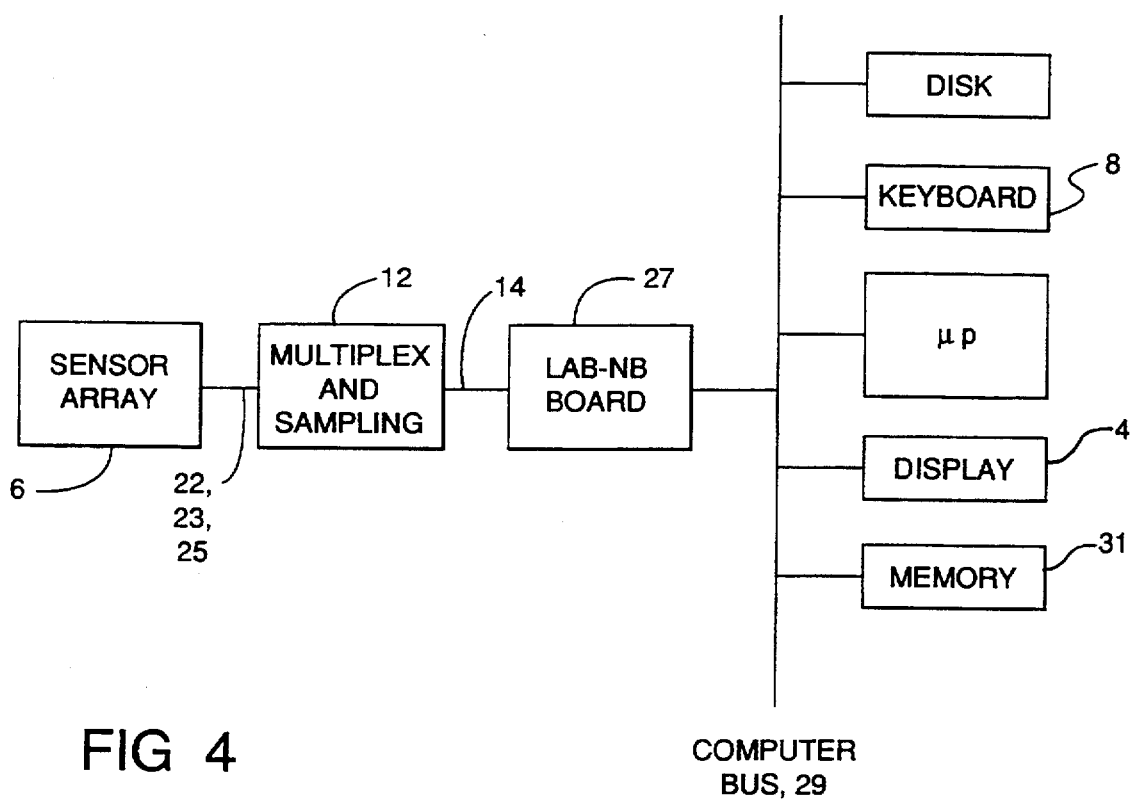
FIG. 4 is a block diagram of an information conveying system.

FIGS. 6a, 6b, 7, and 8 are schematic diagrams of portions of the multiplex and sampling circuitry of FIG. 4.

Figure 9:
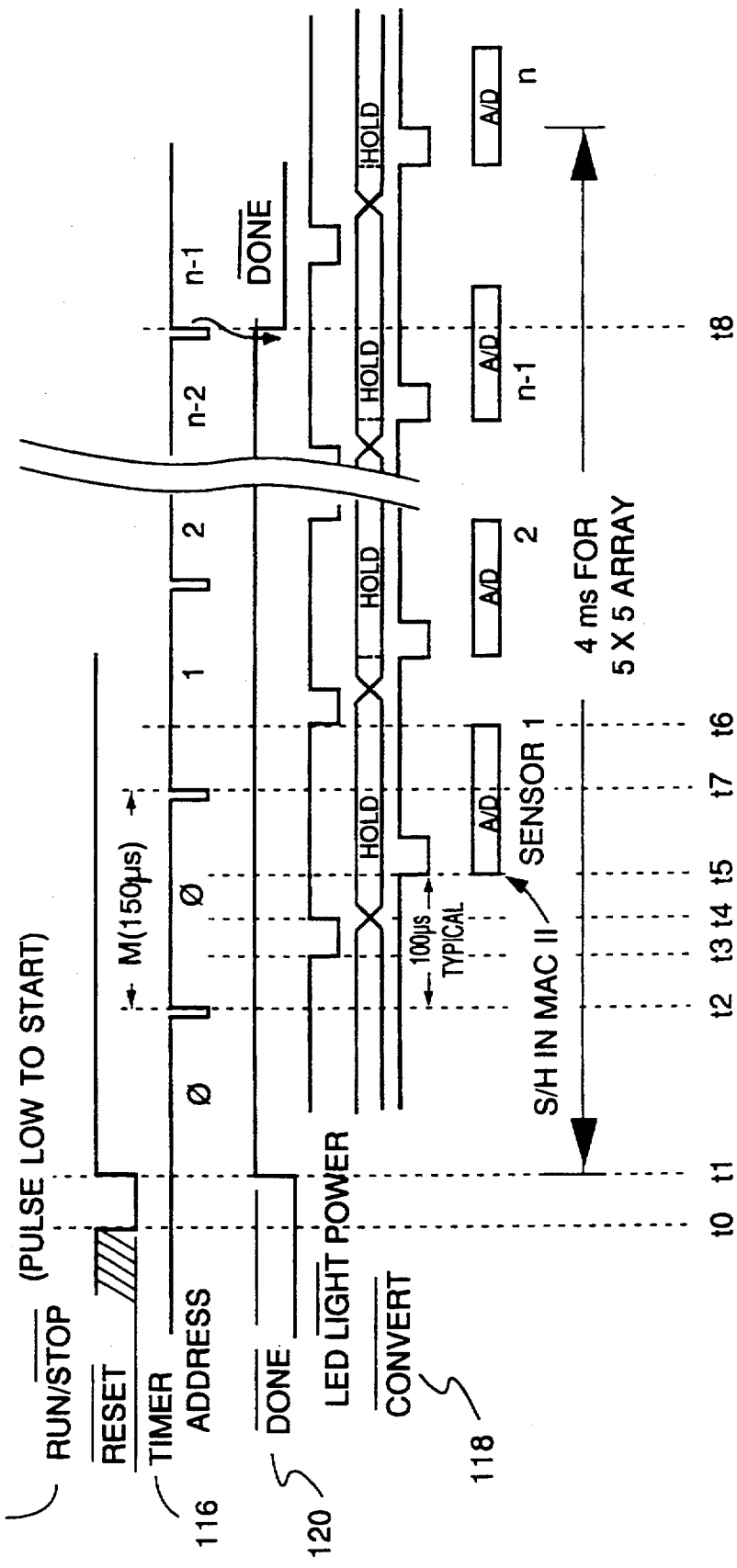
Figure 10:
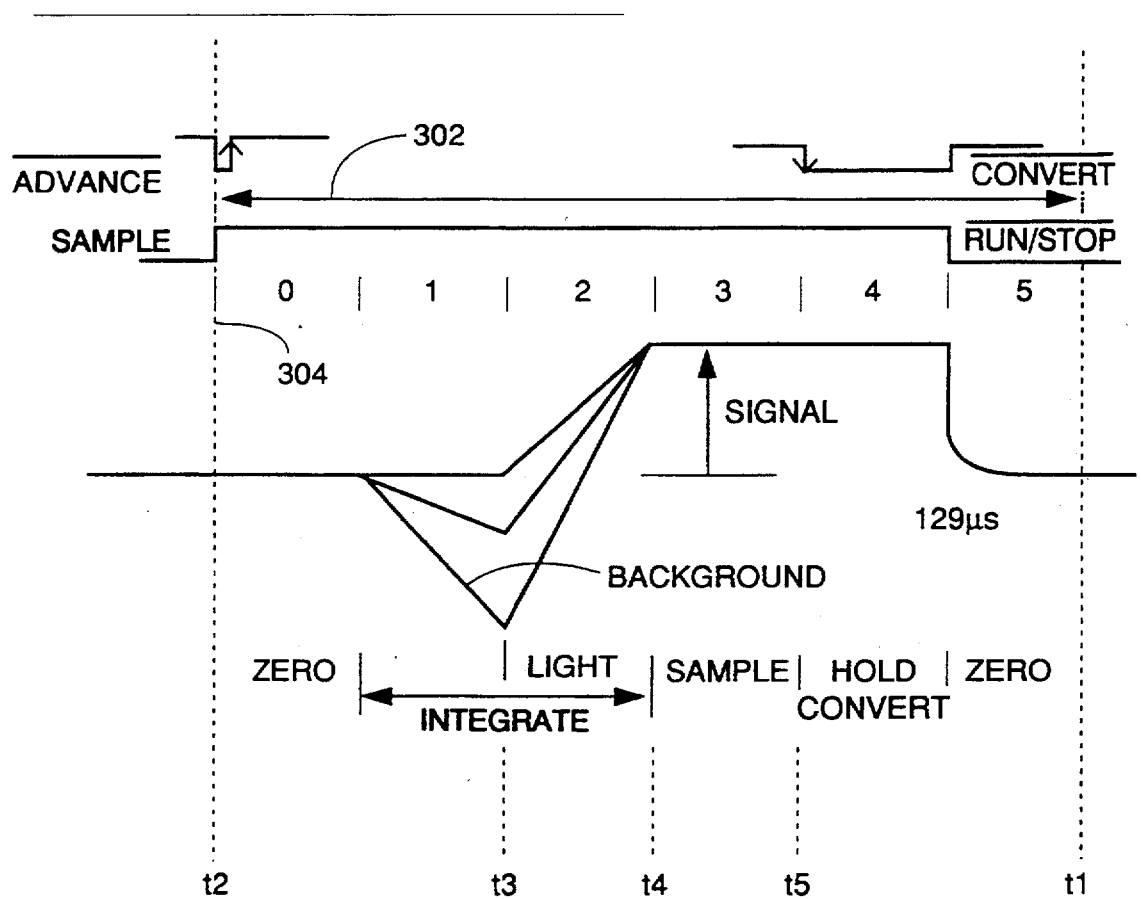

FIGS. 9 and 10 are timing diagrams.

Figure 11:
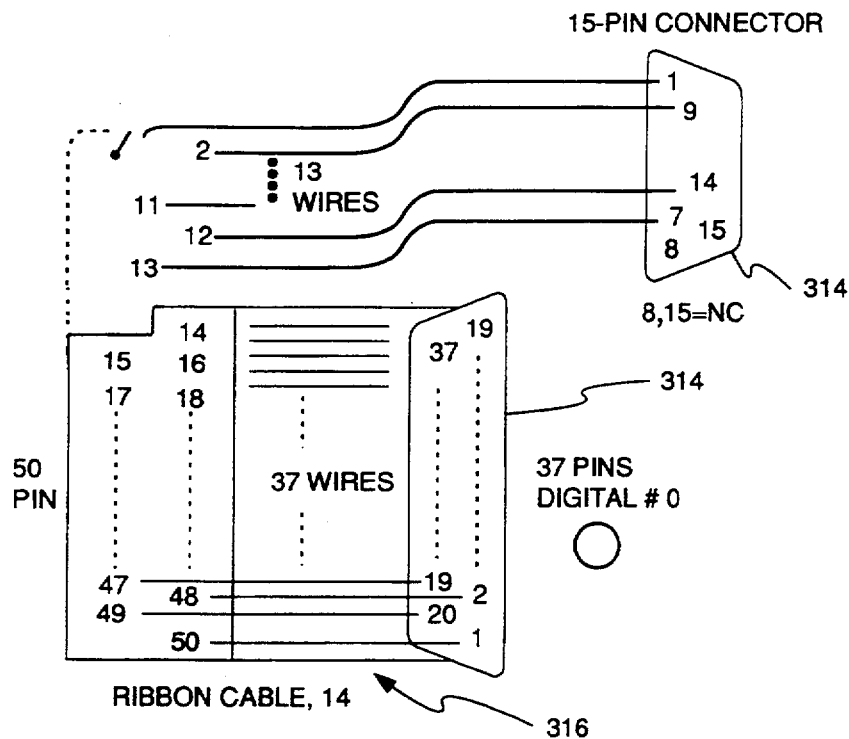
Figure 11:
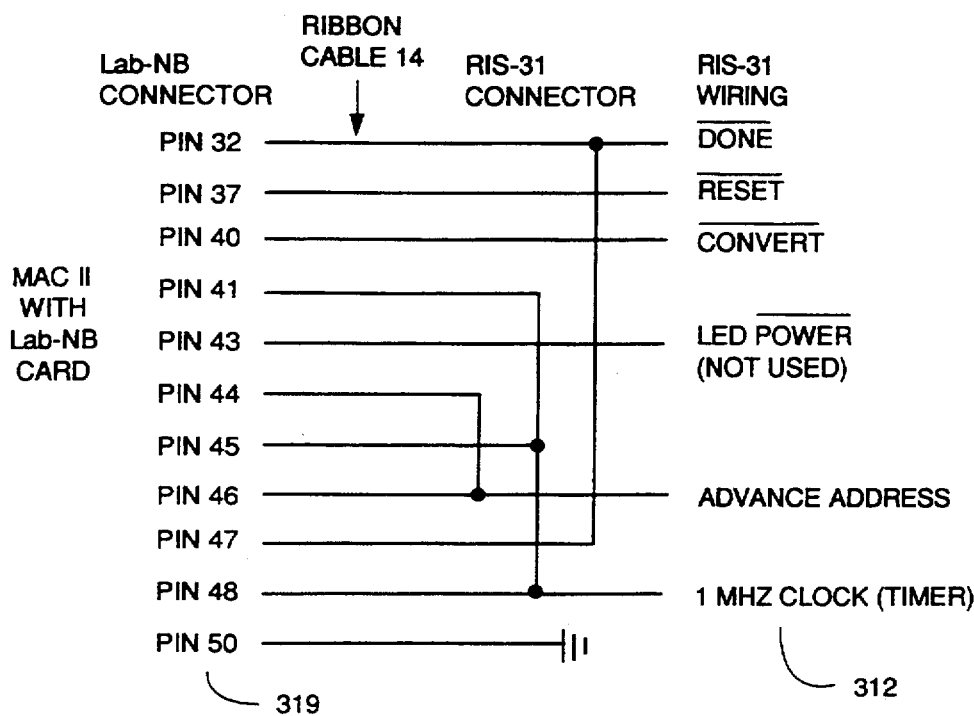

FIG. 11 is a wiring diagram for a ribbon cable used to connect the multiplex and sampling circuitry to a board in the computer.

Figure 12:
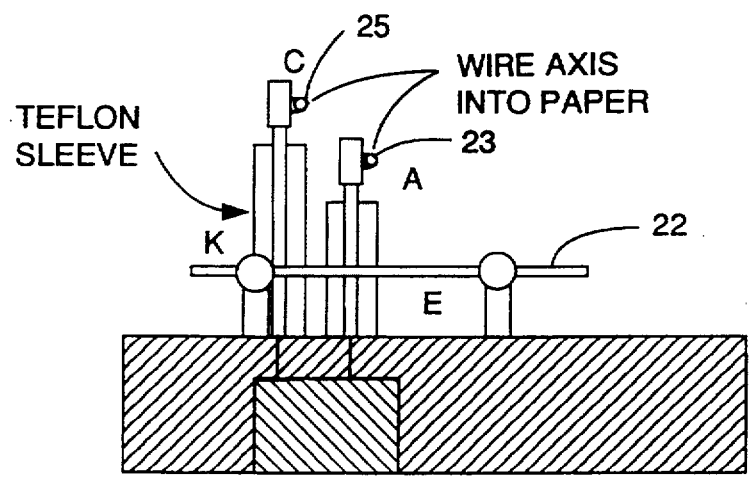

FIG. 12 is a side view, showing the soldering scheme, for a light-emitting diode (LED) and phototransistor (PT) pair.

Figure 13A:
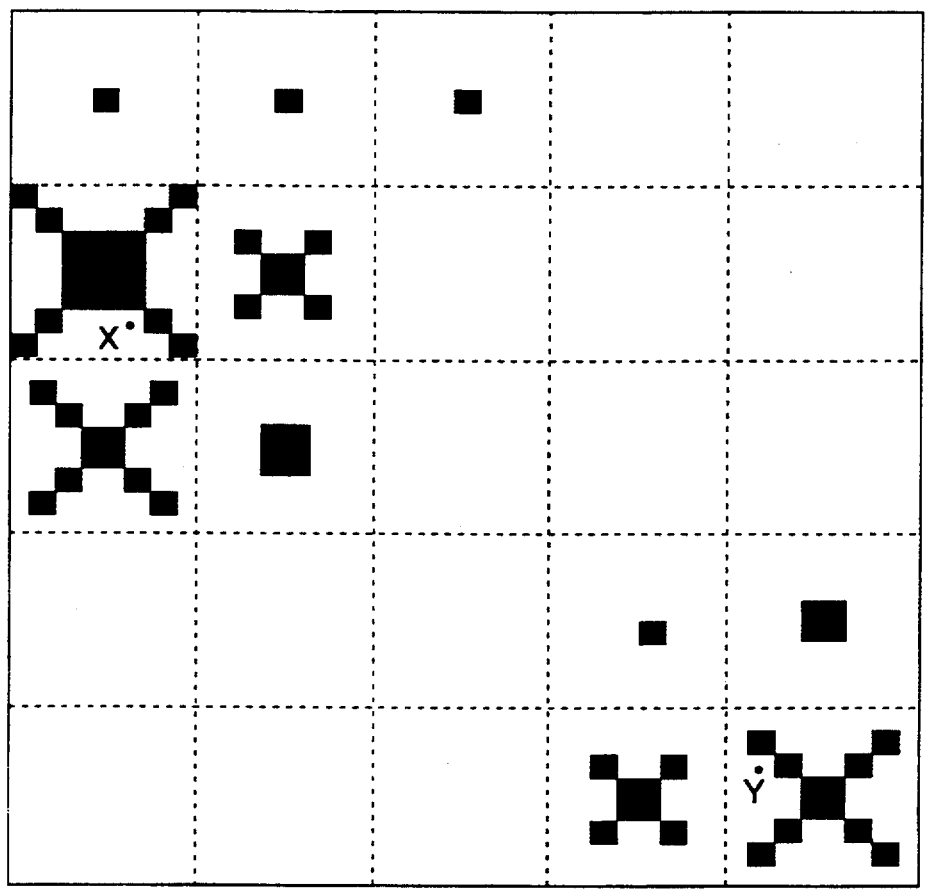
Figure 13B:
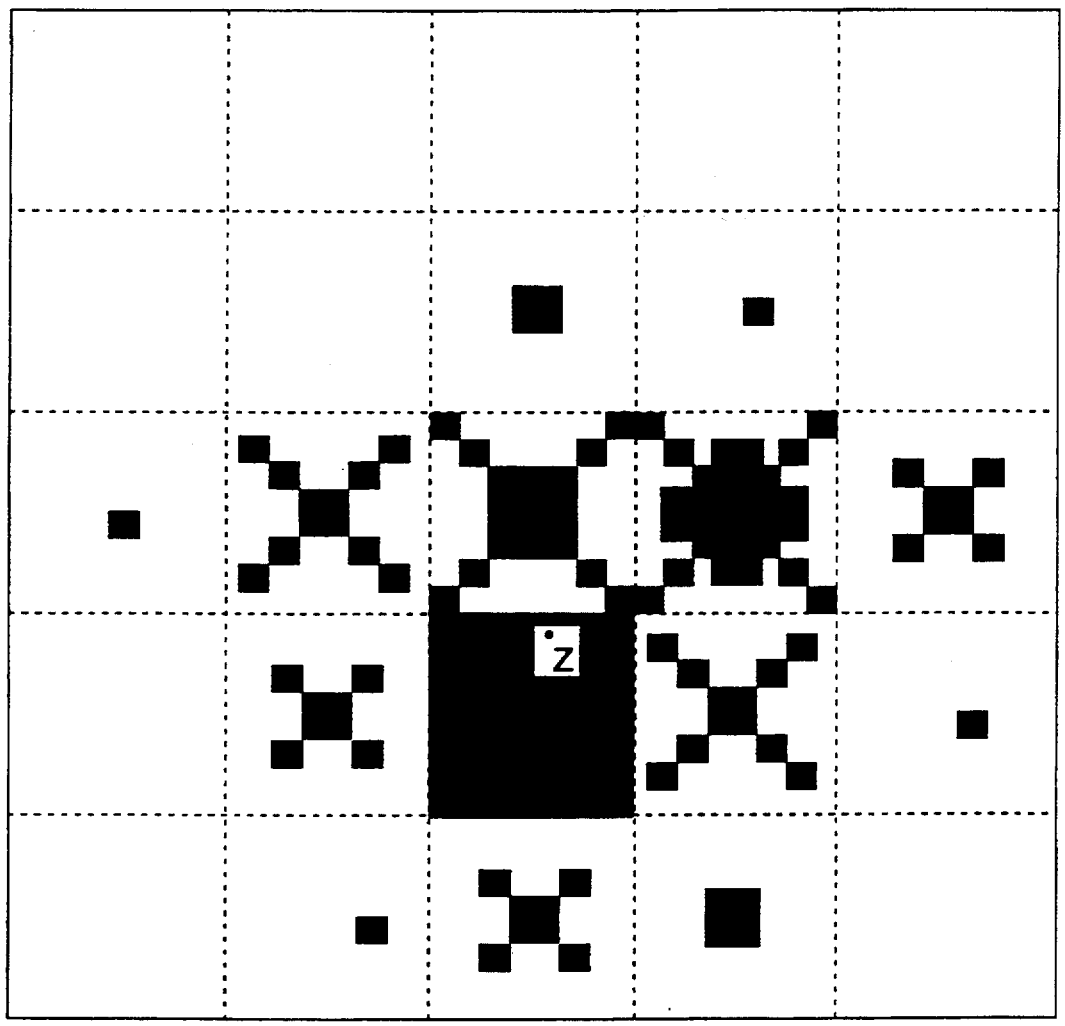

FIGS. 13A and 13B are diagrams of signal patterns resulting from placing, respectively, two fingers, and one finger on the sensor array.

Figure 14:
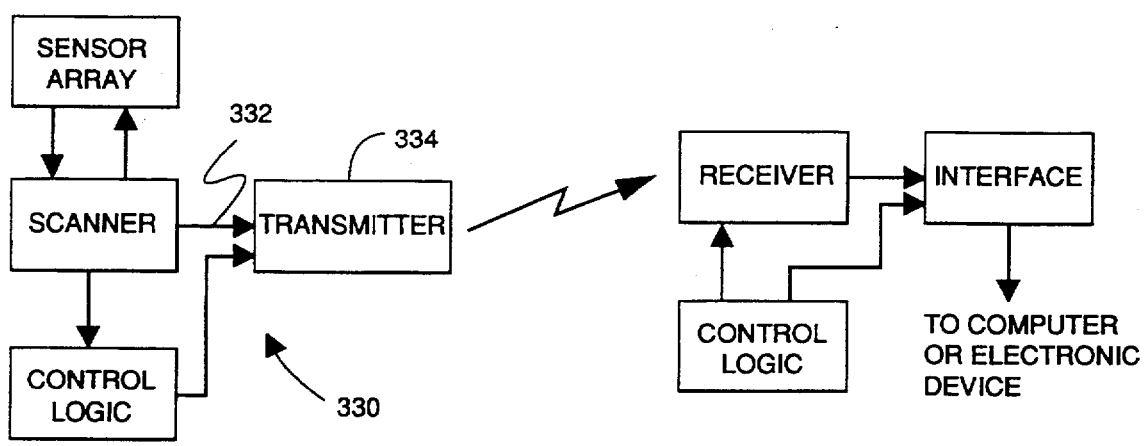

FIG. 14 is a block diagram of a wireless information conveying device.

Figure 15:
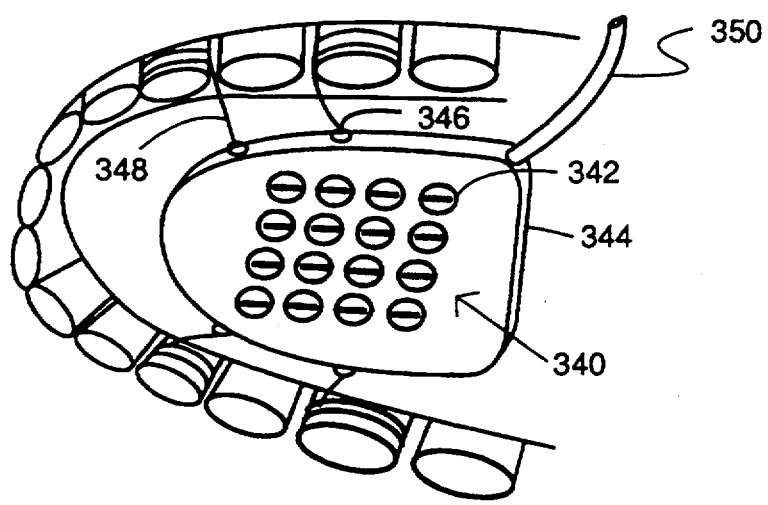

FIG. 15 is a perspective view of an upper palate with a sensor array.

Figure 16:
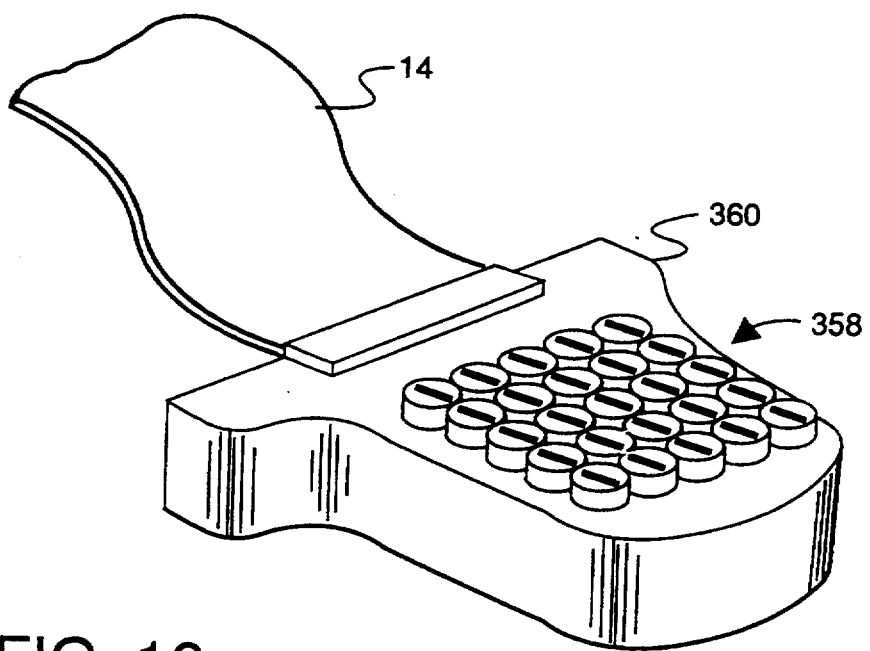

FIG. 16 is a perspective view of a sensor array.

Figure 17:
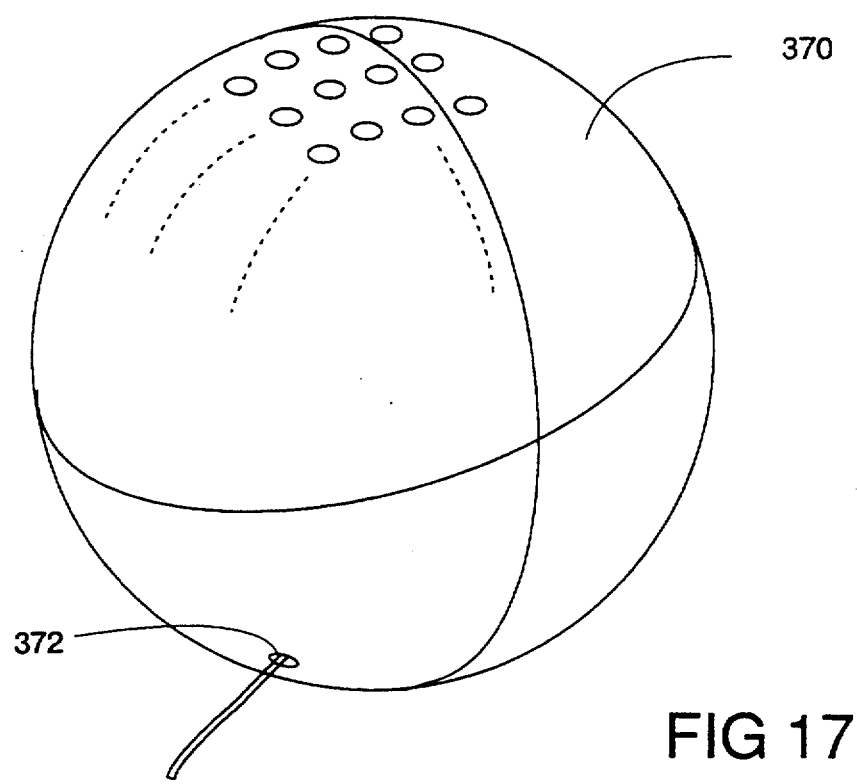

FIG. 17 is a perspective view of a sphere-like embodiment.

Figure 18:
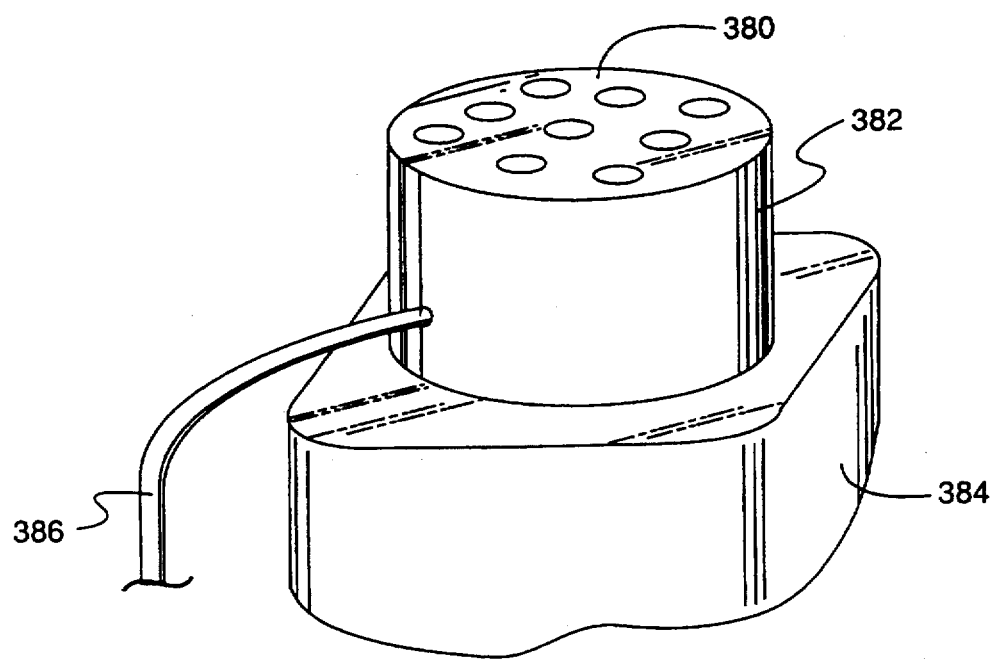

FIG. 18 is a perspective view of a key-type embodiment.

Referring to FIG. 1, to permit a computer user to easily control the position and movement of a cursor 2 on a computer display 4, an information conveying device may be provided which includes a sensor array located on one of the keys (e.g., the J key) of a keyboard 8 of, e.g., an Apple Macintosh IIci computer 10. In a preferred embodiment, information about the cursor positions and movements intended to be conveyed by the user is derived from the sensor array by a multiplex and sampling circuit (not shown) mounted in the keyboard (not shown) connected by a ribbon cable (not shown) to a circuit board (not shown) mounted in computer 10, and connected by wires (not shown) to sensor array 6. Note that, in another embodiment, multiplex and sampling circuitry 12 would be housed in a separate box, connected by ribbon cable 14 to the circuit board in the computer, and by a cable 15 to a freestanding sensor array 6' which could be somewhat larger than the one mounted on the key. Both embodiments are shown in FIG. 1 for convenience.

Referring to FIG. 2, sensor array 6 has an action area 7 exposed on the touch surface of the key 16; the user may move his finger across the action area to indicate desired positions and motions of the cursor. The key may be of the conventional kind which can be moved downward (arrows 9) by pushing down on the touch surface in order to indicate that the user intends to enter the character represented by the key. The touch surface of a typical key has dimensions on the order of ½ inch by ½ inch and the action area defined by the sensor array would fit within that area.

Figure 3:
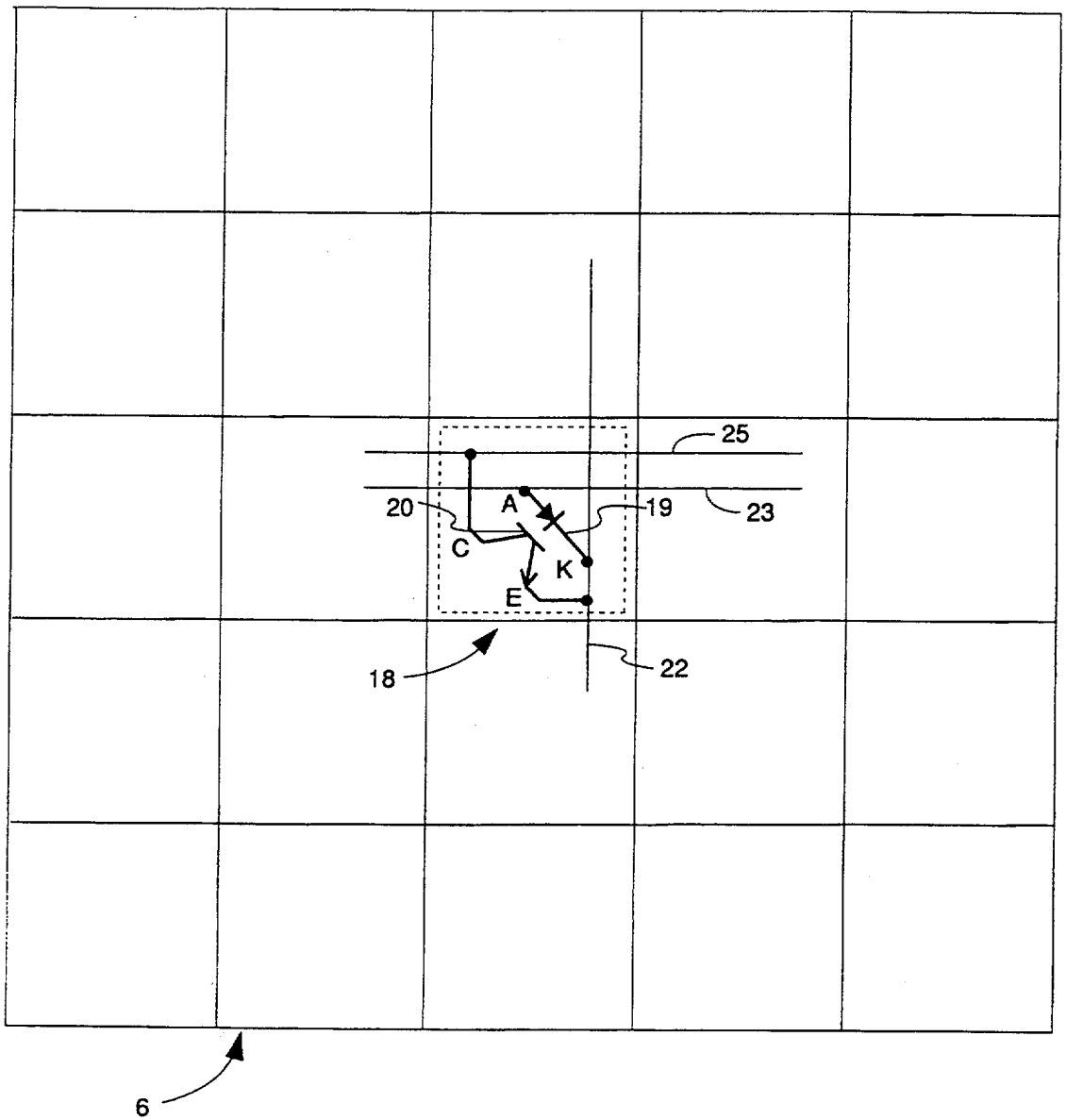
FIG. 3 is a schematic top view of the sensor array.

Referring to FIG. 18, the array (a 3-by-3 array shown) would be embedded in the key cap, which sits on a mechanical switch 384. Wires 386 would provide the connecting to the multiplex and sampling circuit, which could preferably be mounted directly in the keyboard, rather than requiring a separate housing as in FIG. 1. Referring to FIG. 3, the sensor array 6 could include, say, 25 photomicrosensors 18 (an example of such a photomicrosensor suitable for use in a 5-by-5 sensor array having an active area that would be larger than the top of a keyboard key is Model #EE-SY101 available from Omron Electronics Incorporated; implementations for use with a keyboard key would require smaller photomicrosensors than the named model, or fewer of them). The photomicrosensors would be arranged in a 5-by-5 square array (only one of the photomicrosensors is shown in detail). Each photomicrosensor 19 includes a light-emitting diode (LED) 18 aimed to emit infra-red (IR) light away from the photomicrosensor, i.e., out of the page toward the reader, and a phototransistor (PT 20) aimed (in parallel with the optical axis of the LED) to receive reflected IR light, i.e., light directed into the page from the reader. The cathode (K) of the LED and the emitter (E) of the PT are connected in common to a wire 22 which is also connected in similar fashion to the other photomicrosensors in the same column. The anode (A) of the LED is connected to a wire 23 which is connected in similar fashion to the other LEDs in the same row. The collector (C) of the PT is connected to a wire 25 which is connected in similar fashion to the other PTs in the same row. In total, there are five wires 22, five wires 23, and five wires 25 which lead from the sensor array and are used by the multiplex and sampling circuitry to drive and read the LED and PT of each photomicrosensor in turn. The sampling is done row by row in the course of a complete scan, and the scans are repeated at a rate (e.g., 60 Hz) which is fast enough to be responsive to typical finger motions in the action area.

When the user's finger is placed on, or even sufficiently near, to the action area, IR light from the LEDs is reflected by the finger to the PTs, generating currents. In each PT the resulting current depends on the amount of reflected light received. It is not necessary for the user's finger to exert any pressure at all on the action area, because the array operates optically. The photomicrosensors are spaced closely enough so that when the finger is placed on or near the action area, typically more than one of the photomicrosensors receives reflected light and generates a signal. (FIG. 13A shows a computer generated representation of the relative signal levels issued by photomicrosensors of the sensor array when two fingers are applied at points x and y; in FIG. 13B, one finger is applied at point z; note that for each photomicrosensor in the FIGS., the amount of black indicates the intensity of the signal; the patterns were designed simply to represent various signal levels.). Every position of the finger on or near the touch area generates a corresponding unique characteristic pattern of signals from the photomicrosensors. Thus, even though the array has only 25 photomicrosensors, by means of the circuitry and software associated with the information conveying device (described below), it is able to interpret the position of the finger with much higher resolution, thus enabling the user effectively to "point" to any one of a much larger number of possible positions on the display. Resolutions as fine as 256-by-256 points (a total of 65,536 possible positions) may be achieved with the sensor array of 5-by-5 (25 total) photomicrosensors. Furthermore, by frequently redetermining the position of the finger on the sensor array (at a scan rate as high as 60 Hz), the information conveying device is capable of determining the velocity and direction of motion of the finger across the action area; thus, velocity and direction of motion may be used to convey information to the computer.

Referring to FIG. 4, the multiplex and sampling circuitry 12 drives each LED in turn with a current, and transforms the current generated by the corresponding PT into a voltage. In a prototype implementation, the multiplex and sampling circuitry 12 is connected via a ribbon cable 14 to a National Instruments (NI) LAB-NB board 27, which is connected to a bus 29 of the computer. The computer controls the LAB-NB board 27 which, in turn, controls the operation of the multiplex and sampling circuitry, holds and samples the voltage generated by the multiplex and sampling circuitry, and performs an analog-to-digital (A-to-D) conversion of the voltage.

The digital output values from the LAB-NB board are stored in the memory 31 of the computer with a nominal resolution of 12 bits. Following each scan, the computer processes the stored digital data to determine, e.g., a corresponding X,Y coordinate position on the display and, e.g., moves the cursor on the display to the indicated position. The computer may also determine the velocity and direction of motion of the finger based on the position indicated by successive scans.

The LAB-NB board is initialized and configured by the computer to provide appropriate timing and control signals to the multiplex and sampling circuitry. The timing signals control when the multiplex and sampling circuitry sends current to each LED, when it collects the resulting PT-generated current, and when it transforms the collected current into a voltage. The computer configures the NI LAB-NB board for the proper array size (c-by-d where c and d are each in the range 1 to 8) based on instructions provided by the user. The computer also provides, in response to the user's command, the triggering signal which causes the LAB-NB board to begin the sampling process circuitry and the A-to-D conversion.

Figure 5:
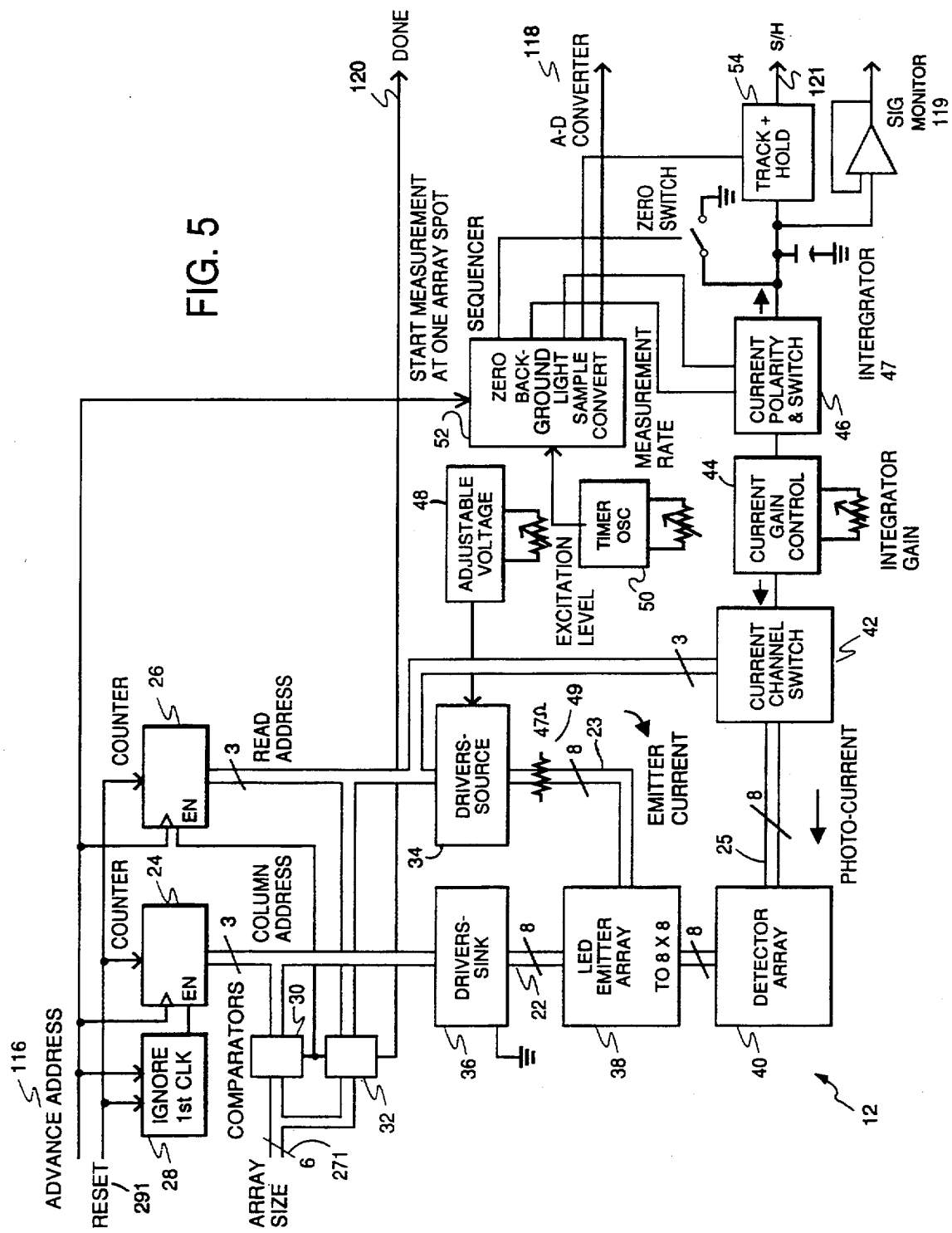
FIG. 5 is a block diagram of a multiplex and sampling circuit for use with the array of sensors of FIG. 3.
Figure 6A:
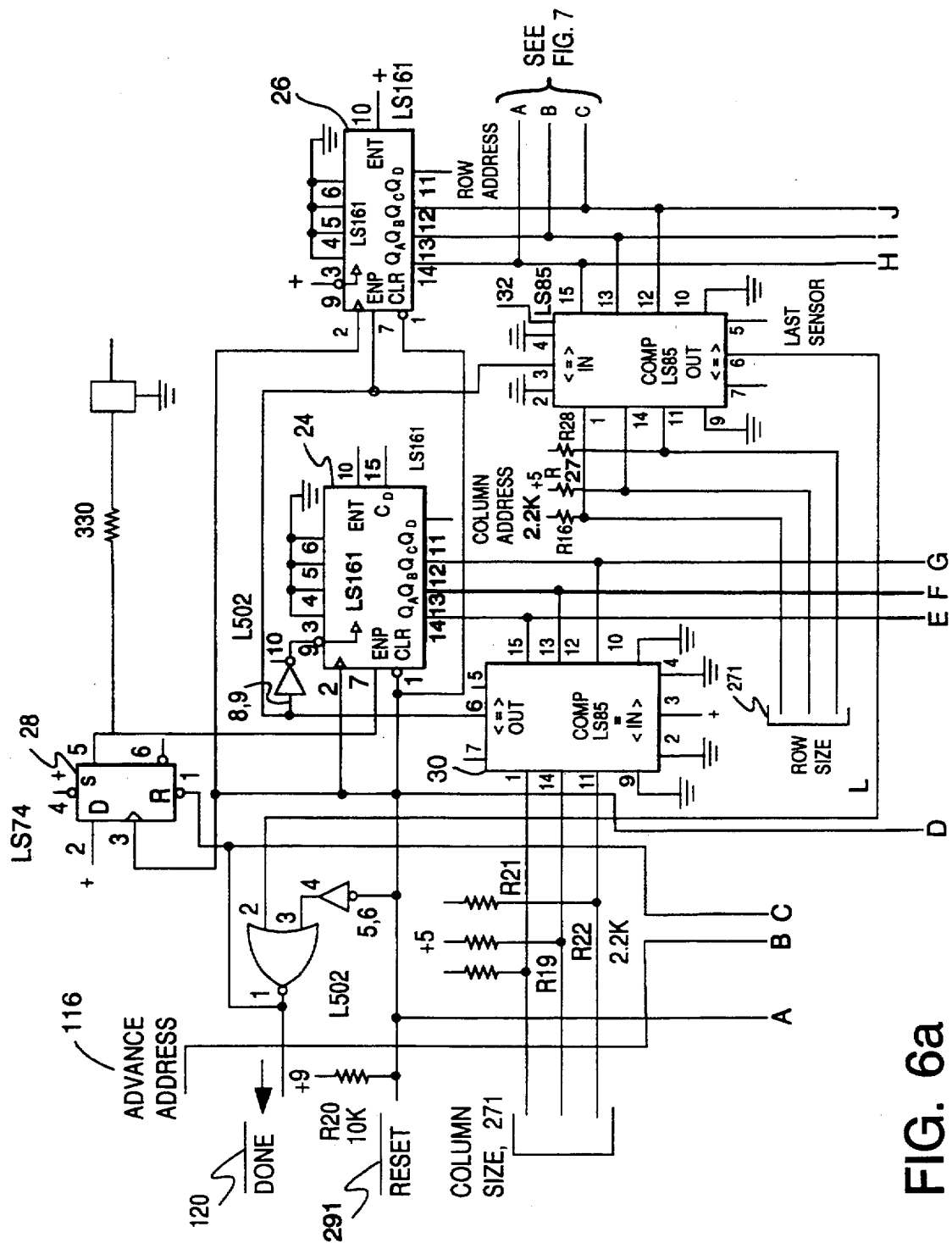
Figure 6B:
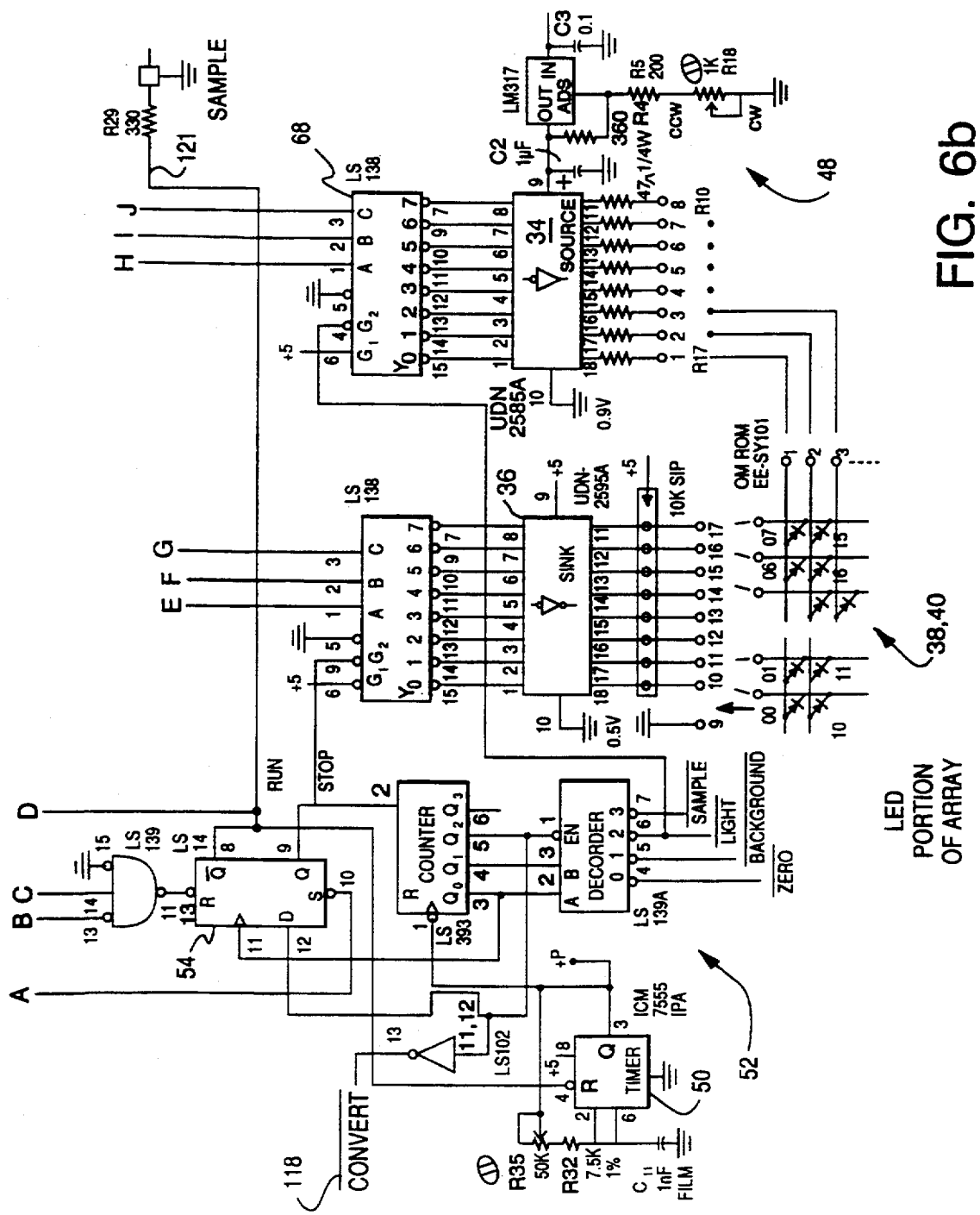
Figure 7:
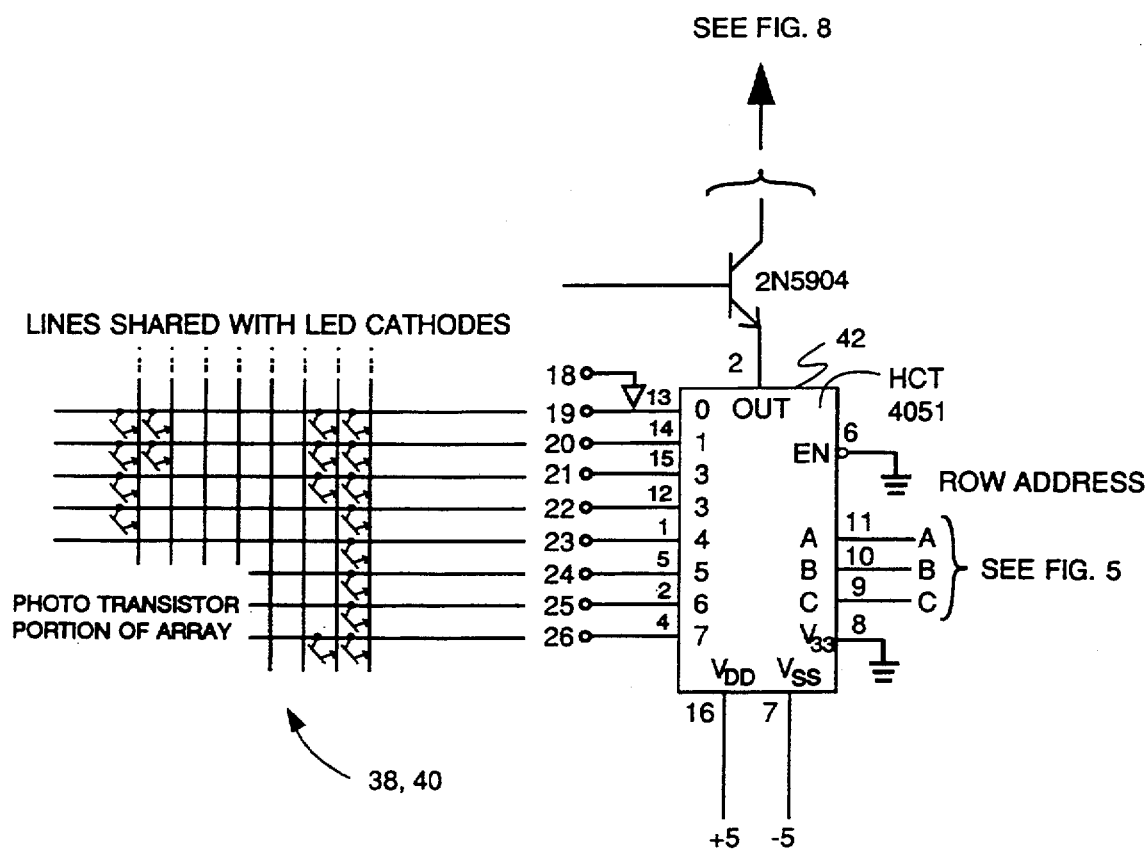
Figure 8:
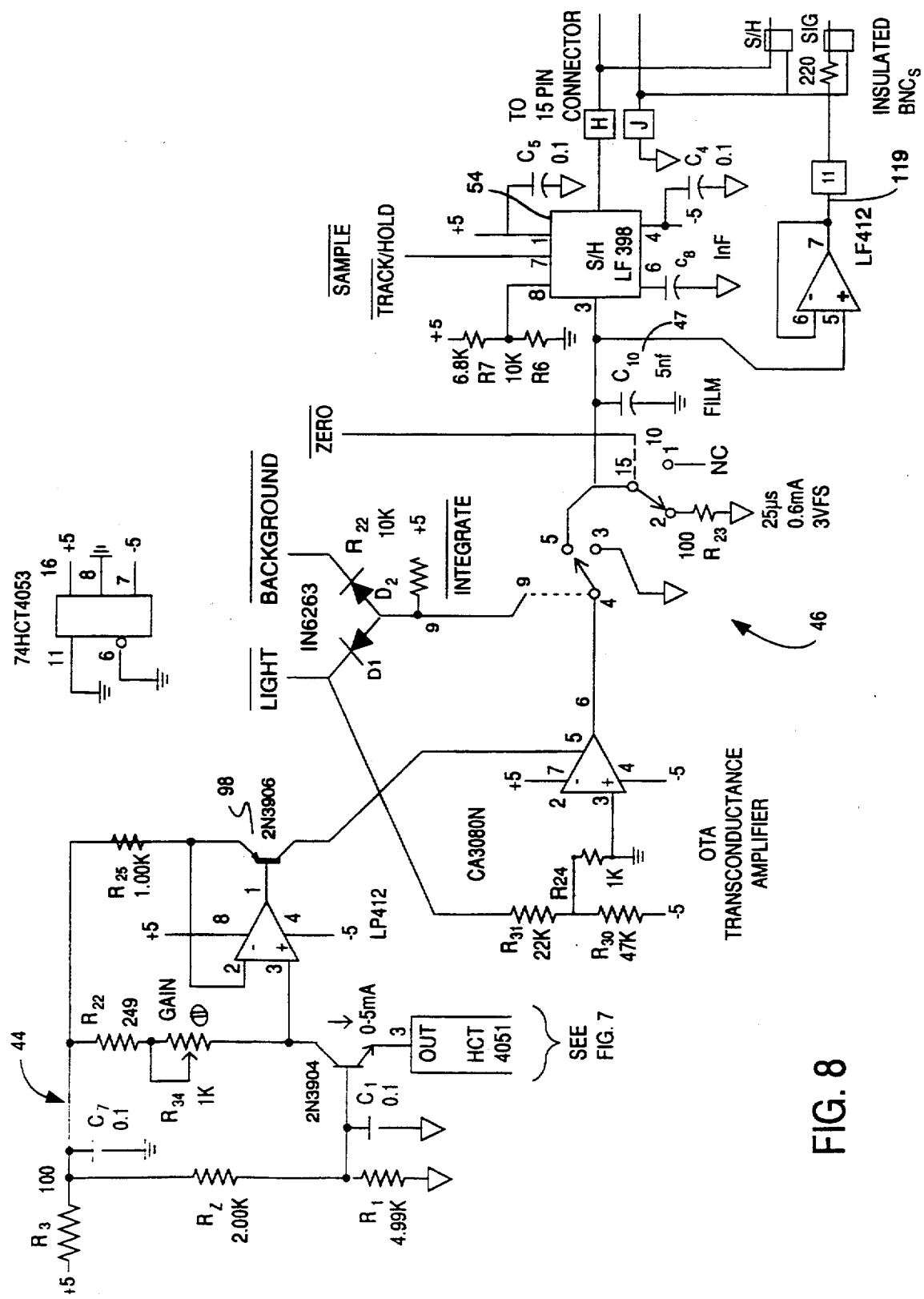

Referring to FIG. 5, the multiplex and sampling circuitry 12 is capable of handling an 8-by-8 array of photomicrosensors, including an LED emitter array 38 coupled to a detector array 40. During a sampling scan, successive LEDs in the emitter array are driven by current from row drivers 34, via lines 23, with the current being returned to column drivers 36 via lines 22, all in response to successive column and row addresses provided from counters 24 and 26. In a prototype implementation, drivers 34 are driven by an adjustable voltage source 48 and the current is determined by 47 ohm resistors 49. When the column and row counts reach the total number of columns and rows of the array (determined in comparators 30, 32, based on array column and row sizes 271 provided from the LAB-NB board) a signal is sent on the DONE line 120 and the counters are reset in preparation for the next sampling scan. (During scanning, the row counter is reset n times, once for each row).

During the sampling scan, the counters 24 and 26 are incremented in response to ADVANCE ADDRESS pulses 116 from the LAB-NB board. An element 28 causes the first advance address pulse in each sampling scan to be ignored so that the sampling will begin with address zero. Immediately before each sampling scan the counters are reset by a signal 291 from the LAB-NB board.

The currents generated by the detector array 40 are delivered via lines 25 to a current channel switch 42 which is tied to a current gain control 44 and in turn to a current polarity and switch circuit 46. Together these elements (and the integrator 47) collect and integrate the current signal in a manner designed to reduce the adverse effect of background light.

A sequencer 52 controls the timing of the operation of the current polarity and switch circuit 46 as well as a track and hold element 54. Output signals passing from the multiplex and sampling circuit include the not-DONE signal 120, an A-D CONVERT signal 118 which alerts the LAB-NB board to proceed with a conversion scan, a MONITOR signal 119 for testing, and a SAMPLE AND HOLD signal 121 which carries the integrated sample values.

FIGS. 6a, 6b, 7, and 8 show detailed circuit diagrams for the multiplex and sampling circuitry in which the reference numerals of FIG. 5 have been applied to corresponding circuitry.

Referring to FIG. 9, a sampling scan begins when the RESET line 291 from the LAB-NB board (from the PC7 digital output port) is pulsed low at time t0. At time t1, when the RESET signal returns high, the not-DONE signal of the previous scan goes high. Thereafter, the sampling scan is divided into sample intervals, each 150 microseconds long. The first interval begins at time t1 and ends at time t2 with the delivery of an ADDRESS-ADVANCE pulse from timer B2 of the LAB-NB board. A total of n-1 additional address advance pulses are delivered at subsequent intervals of 150 microseconds to define a total of n sampling intervals, numbered 0 through n-1. For a 5-by-5 array, the total sampling scan runs approximately 4 milliseconds. Using interval 1 as an example, during each interval, the LED is off except during a period between t3 and t4, governed by the LED LIGHT POWER signal. At time t4, the value of the output of the LED is sampled and held. At time t5, the CONVERT signal goes low, and the LAB-NB board proceeds to perform the A-to-D conversion beginning at t5 and ending at t6. Prior to t6, however, the next sampling interval begins at time t7 and overlaps the completion of the A-to-D conversion. After all but the final sensor have been sampled, the DONE signal is issued at time t8; the sampling of the final sensor is then performed.

Twenty-five microseconds after the beginning of each sampling interval, negative integration begins. Then the LED is turned on and for the subsequent 25 microseconds positive integration is executed. Then the signal is sampled and held.

The sampling is done in a way that compensates for the background light signal detected by the photomicrosensors (which are sensitive to a broad band of infrared light) in locations where background incandescent light and sunlight (which have substantial IR components) are present. Ordinary gelatin filters will not screen the ambient IR light and interference filters are expensive. In most wireless IR remote controllers for home use, the emitters are temporally modulated and then the detector outputs are filtered so that only signals of the appropriate frequency are subsequently processed.

Referring to FIG. 10, background light noise signals are reduced in the following way. The period 302 of one of the sampling intervals of FIG. 9 (a total of 150 microseconds) is considered to have six successive equal length subintervals (numbered 0 through 5 in the FIG.). During subinterval 0, the LED is off, the output signal of the PT is not integrated, and the integrator voltage is set to zero volts. During subinterval 1, the LED remains off and the current generated by the PT (which represents background noise) is integrated (in a negative sense). During subinterval 2, the LED is turned on and the integration of the PT current (which now represents both background noise and the signal of interest) continues, this time in the positive sense. Because the two subintervals 1 and 2 are of equal duration and the noise signal due to background light is assumed to be nearly constant over such a brief interval (e.g., 50 microseconds for the two subintervals), the integrated value of the background noise signal should be zero over the course of the two subintervals. Then only the LED-generated signal will remain in the integrated value and the effect of the background light will be effectively cancelled. During subinterval 3, the resulting integrated value is sampled and during subinterval 4 the sample is held and converted.

Referring again to FIG. 9, because the sample interval time is 150 microseconds and the sensor array has "n" sensors, it takes 150 multiplied by "n" microseconds to perform a scan of the entire sensor array. With a 5-by-5 array, the total scan time for the sensor array is 3.75 milliseconds. Thus, the sensor array can be sampled approximately 266 times per second (one divided by 3.75 milliseconds is approximately 266). As explained below, the stored sample values must be processed further to determine what information is being conveyed to the computer, if that processing is performed by the computer after the entire array has been sampled, the resulting number of times the array may be sampled per second is reduced, because the time required to process the sample values cuts into the time available to do the sampling. The sensor array can be sampled at a rate of approximately 133 times per second when the processing time is included. The array sampling rate could be increased by performing some of the data processing between the samplings of successive photomicrosensors in the array.

After the entire array of photomicrosensors has been sampled during a given sampling scan, the computer processes the stored sample set to determine what information is being conveyed by the user, e.g., a corresponding X,Y coordinate position on the display, and acts on that information, e.g., by moving the cursor to that position. Because the sensor array includes only a relatively small number of photomicrosensors, it is necessary to analyze the signal patterns represented by the stored sample values derived from the sensor array in order to infer what information is being conveyed (e.g., what position on the display is intended).

The analysis is performed by software running on the computer. A copy of the code, written in the "C" language, is attached as Appendix A. This code is intended for compilation by Symantek's "Think C" Version 4.0 compiler and may be run on an Apple Macintosh II ci computer with Finder 6.1.5 and System 6.0.5, with the LAB-NB board in slot 6. Many of the routines are concerned with testing and display functions on the computer; important routines applicable to the scanning and conversion are NatlInstBdDefinitions.h; NatlInstBdDeclarations.h;NatlInstInitializingRoutines.c; DataCollectionRoutines.c; MassageData.c; and UseGameWindow.c One strategy for analysis includes a "center-of-mass" analysis of the signal pattern to infer the coordinates of a point. The sample value derived from each photomicrosensor is interpreted as a weight and the horizontal and vertical positions of that photomicrosensor within the sensor array serve as the coordinates in the "center-of-mass" calculation. The horizontal and vertical coordinates of the inferred point are in the range 0.00... to 4.00... (for a 5-by-5 array) and are used to determine a coordinate position on the computer display by appropriate scaling, e.g., to a range 0 to 256. The scaled values may be further scaled to a range 20% larger to make it easier for the user's finger manipulations to reach the edges of the 256-by-256 display. Scaling may also be used to select a point within a subset of the screen (a software generated window, for example). Although the stored digital sample values have a nominal resolution of 12 bits, they are scaled to fewer bits for the "center-of-mass" calculation.

The information conveying device may also be used to control incremental motion. When used as a "tablet", the absolute position of a finger on the sensor array is always mapped to a fixed position on the computer screen. That is, position of the cursor is always mapped directly to position on the sensor array When used as a "mouse" incremental motion of the finger on the array is mapped to motion of the cursor on the computer screen. In particular, when the finger first touches the sensor array, the location of the finger is noted and remembered, but the cursor position is not changed. When the finger then moves, the change is implemented in the cursor relative to its starting position. Thus, the motion is "incremental".

To smooth the motion of the cursor on the display, data from, e.g., four complete sensor array sampling scans are averaged on a running basis. Although the averaging process slows down the responsiveness of the cursor, the slowing is barely noticeable.

Similar signal pattern analysis has also been used with a 2-by-2 array and a 4-by-4 array of photomicrosensors for operation with a 256-by-256 display grid, using appropriate scale factors. Degradation of performance for the 4-by-4 array (which is smaller than 0.75-by-0.75 inches) is minimal. The 2-by-2 array produced noticeable degradation. However, the 2-by-2 array provides acceptable performance with a 100-by-100 pixel resolution display. With both the 2-by-2 array and the 4-by-4 array, the digital sample values processed by the computer are scaled to 7 bits for use in the "center-of-mass" calculations, not 5 bits as described above. (Presently, all calculations are done with 10 bits).

An additional step in processing the stored digital sample values includes normalizing the data with respect to the individual variability of PT sensitivity and LED light generating power.

The computer software may include a wide variety of other algorithms for analyzing sample patterns and sequences of sample patterns, including velocity calculations.

Referring to FIG. 11, the LAB-NB board connector pins 310 are shown with respect to the signals 312 carried on the corresponding wires of the ribbon cable 14, as well as the connections between the ribbon cable leads 316 and the connectors 314 to the multiplex and sampling circuitry.

FIG. 12 shows the wiring scheme for the terminals of the LED and PT.

In embodiments which include the sampling and scanning circuitry as part of the keyboard, data would be passed via the "Apple Desktop Bus", which makes power available to the keyboard and other peripheral devices, such as the mouse.

Although the sensor array 6 provides a pointing function, the user often also needs to be able to indicate a selection after having pointed to a location on the display. For example, while intensively using the keyboard of a computer (e.g., during text editing), one suddenly may need to select from among several options displayed, e.g., on a graphically displayed menu, or else to select some portion of text for deleting, copying, or modifying. The selection process typically requires pointing motions plus one or two clicks of, e.g., a mouse selection button.

Furthermore, when the sensor array is located on a key, the key is frequently being touched for the purpose of entering the character which it represents. A mouse or trackball, by contrast, would remain untouched during keyboard use.

The desired selection capability and the alternate treatments to be accorded the J key could be achieved by the following enhancements of the sensor array.

Buttons for the user to indicate desired actions to be taken by the computer, could be added to the information conveying device. For instance, a pressure or acceleration sensor could be added to the housing of the device to serve as a switch when pressure or movement was applied. But, in fact, such additional switches may not be necessary. In the case of a sensor array on a key of a keyboard, depressing the key could serve the same function as pushing a button. Alternatively, tapping lightly on the sensor array could yield a characteristic signal (as a function of time) and it is straightforward to interpret such a signal as a button push.

Alternatively, referring again to FIG. 1, a second 4-by-4 sensor array 601 could be mounted on the F key to serve the left index finger. Either or both of the index fingers then would naturally be available for pointing (or, more generally, for supplying continuously variable inputs). Also, a line of photomicrosensors 603 (i.e., a 1×4 sensor array) could be embedded in the right hand side of the <SPACE> bar, and another sensor array 605 in the left hand side of the <SPACE> bar.

The main function of the linear sensor arrays on the <SPACE> bar is to enable the user to tell the computer when he intends to use the key-mounted sensor array as a pointing device rather than as a character key. For example, the translation software which attends to the <SPACE> bar sensor arrays may be arranged to recognize a sweep of the right thumb from left-to-right across the linear sensor array embedded in the right side of the space bar as indicating that thereafter the J key sensor array will control the position of the pointer until, say, the J key is again depressed. That would indicate selection (analogous to clicking a mouse button), and would also terminate J key sensor activity.

Two left-to-right sweeps of the thumb across the <SPACE> bar could indicate that, when the J key is next depressed, it should be interpreted as if a button is held down and remains held down until the J key is depressed a second time.

Thus, virtually all pointing and selecting techniques implemented in known devices (e.g., mice) may be implemented using the information entry device of the invention. And additional capabilities not easily implemented in conventional pointing and selecting devices can also be implemented. For example, with sensor arrays on both the F and J keys, and linear sensor arrays on both sides of the <SPACE> bar, it is possible to provide both left-hand and right-hand capabilities on a single keyboard. And both the left and right hands can simultaneously be controlling separate pointers, or different aspects of a computer display.

OTHER EMBODIMENTS

Sensor Array

Instead of fabricating the sensor array by hand-soldering individual photomicrosensors (each having 4 terminal wires, for a total of 100 wires for a 5-by-5 array), printed circuit boards could be designed to simplify the assembly process. Alternatively, the sensor array could be made in a single package. Because the chips that constitute the emitters and detectors would be tiny compared with hand-soldered implementations, a much greater density of emitter/detector pairs could be obtained. (This may or may not be desirable, depending upon the processing power and timing requirements of a particular application.)

Integrated construction would also permit flexibility as to the geometry of the emitters. It may be possible to use a much smaller number of emitters, possibly even limited to one, while the detectors remained at whatever density was desired. Among other things this may permit the sensor array to be fabricated as one large chip, rather than in many pieces.

The resulting small electro-optical system would be particularly valuable in portable, laptop, and notebook-type computers. The system could fit entirely within a conventional computer keyboard.

The orientations of the emitters and detectors need not be perpendicular to the surface, nor parallel to each other. Varying these orientations (and the associated plastic optics used to guide and collect the light) should enhance the ability of the sensor array to detect signals near the edges of the array; it also should permit greater control of the effects of pressing harder with the finger or tongue.

System

The functions of driving the sensor array, performing analog-to-digital conversion of the samples and data processing of the converted, stored sample values need not be performed by the multiplex and sampling circuitry, the LAB-NB board, and the computer as described above. Rather they could be performed by a small number of commercially available electronic parts, or even by a (perhaps custom designed) single chip.

Miniaturization of the electronics would permit placing the sensor arrays and all of the processing electronics in the keyboard itself. Power could even be drawn from the computer's bus, for example, the Apple Desktop Bus (ADB) that is used to power and get data from the keyboard and mouse of a Macintosh II.

Wireless Operation

Referring to FIG. 14, miniaturization would also permit the creation of a self-contained, highly portable, battery operated information conveying device 330 in which the raw sample values 332, or more likely the processed information derived from sample value patterns, could be digitally encoded for transmission via infrared light (as in home electronic remote controllers) or radio frequencies (as in automobile alarm systems and remote controlled model airplanes, cars and boats).

A hand-held version could be used to control a pointer for computer video games, or pointers in a slide projector (used in conjunction with appropriate apparatus within the slide projector). It could also be used with a graphical user interface for remote control of on-screen devices such as ones used for televisions and video tape recorders.

Continuously variable controls of typical electronic devices (such as the volume, balance, and tone controls of compact disk players) are normally mounted on the electronic device. Button operated remote controllers for such electronic equipment must be held down for a variable period to control the variable inputs. A wireless version of the present device could be used to improve such remote control devices.

The Tongue

Instead of running one's finger over the surface of a sensor array, it is possible to use one's tongue.

The wetness of the tongue provides such good optical coupling between the LEDs and the PTs that the device operates much closer to saturation than when a dry finger is used. The tongue is also more fluid in its configuration than a finger and changes shape more dramatically when pressed against the sensor array, thus making it somewhat harder to localize the position in absolute terms. While performance is thus somewhat degraded using the tongue rather than the fingers, it must be emphasized that the tongue is definitely effective as a pointing appendage to control the device.

The operating performance using the tongue could possibly be enhanced by, for instance, decreasing the emitted light of the LEDs (by using less current, or an optical filter) to bring the quantity of light reflected by the tongue into a better operating range.

Referring to FIG. 15, the array 340 of sensors 342 are housed in a package 344 that includes mounting rings 346 to permit mounting the package in the upper palate via dental wires 348 attached to the upper teeth. If the package is connected to the external circuitry by wires 350, the arrangement may be awkward. If the array is to be used in the mouth for extended periods of time, it would be desirable to make the array wireless and battery-powered. Information from the array could be transmitted to the electronics via infra-red light or radio frequencies.

Implementing such a scheme without power and signal wires going in and out of the mouth would likely require designing custom integrated circuits, in the usual way.

By making the array small (less than 0.75 inches on a side), it could be fitted easily in most mouths. The array, electronics, and associated battery could be supported by dental wire 348 attached (more or less permanently) to the upper teeth (say the canine teeth, or those adjacent the canines ).

Use of the tongue would be highly effective for, e.g., quadriplegics who have use of the tongue and mouth, and would enable them to interact in a relatively natural way with computers.

Use of the tongue could also be valuable as an additional voluntarily controlled pointer even for people who have use of their hands. For instance, if the output of the device was used to control servo mechanisms attached to spotlights, a surgeon could be using both hands in an operation, while moving the spotlights to desired positions. Magicians could control a wide variety of devices in a smooth and natural (and mysterious) way via a remote controller in the mouth.

When the device is located in the mouth, and the hands are either unusable or occupied in other tasks, an alternative to the keyboard and mouse-type switches may be provided to indicate selections or button pushed. One method would be to tap the array momentarily with the tongue and interpret the resulting characteristic signal pattern as a click of the button. Another scheme would be to mount (using dental techniques) a sensor (e.g., an accelerometer) on a tooth in the lower jaw. "Clicking" the upper and lower teeth together would produce a large accelerometer signal which could substitute for touching a key or a mouse switch. More elaborate software could be used to detect signal patterns corresponding to characteristic motions (gestures) of the tongue to indicate letters (for "typing") or other frequent actions.

Instead of arranging the sensors in a tight array, individual photomicrosensors could be arranged around the inside of the upper palate to serve as a kind of keyboard for someone limited to use of the tongue.

Complex equipment operators (aircraft and helicopter pilots, construction machinery operators, operators of remote controlled robots) may be able to make use of the tongue as an additional mode of conveying information to the equipment.

Recognizing that the tongue is one of the most sensitive and mobile parts of the body, the device could be used for entertainment value (e.g., in video games played by tongue movement) as well as productive value.

One application may be in the context of radiologic brain scans of children, who typically do not keep their heads still enough. By employing a bite-bar and tongue-controlled video game, the children may be more willing to keep their heads in fixed position, without requiring sedation.

Other Variations

Other types of data processing in addition to the normalization and "center-of-mass" calculations described above could also be performed. For instance, data processing can be performed to determine the velocity of the reflective object, i.e., finger, passed over the array.

The information conveying device can substitute for a mouse, a tablet, or even a joystick. That is, it can enable a user to control the pointer position over a portion of the computer screen and later pickup where it was last touched (i.e., the relative position movement of a mouse); it can control the pointer position over the entire screen (i.e., the absolute position movement of a tablet); and it can control velocity of the movement of the pointer on a screen (i.e., the velocity control of a joystick).

The 1×4 sensor array described previously for use on the <SPACE> bar of a keyboard could, alternatively, be embedded in steering wheel of a car, and used to control the volume of a radio. Wires could connect the sensor array to the control circuitry mounted behind the dash board.

Referring to FIG. 16, a computer pointing device sensor array 358 could be housed in a separate package 360, rather than being mounted in a key (this arrangement could correspond to sensor array 6' in FIG. 1). This would permit a larger number of sensors.

Although the embodiments described above all have small action areas, large area devices would also be useful. Because activity at more than one sensor is derived and analyzed simultaneously, a wide variety of functions could be carried out by motions of one or more fingers or other implements on the surface of a large area device. A device larger than a keyboard top but still relatively small could be mounted on a keyboard in a location near to the conventional keys.

Furthermore, referring to FIG. 17, the action area could lie on a sphere-like surface 370 (e.g., a true sphere of diameter 3" with 64 sensors on the top hemisphere, or an egg-shape, or some other convenient 3-dimensional shape). Wires could be routed internally to a port 372, or the device could be made wireless.

Note that, while the description given above and the claims refer to the finger and tongue, other parts of the body, including the nose and elbow may also be used with the sensor arrays, and references to finger and tongue are intended to encompass elbow and nose.

Other embodiments are within the following claims.

```
/*****************************************************************
*                                                               *
*         This header file contains definitions.                *
*         It allocates NO space.                                *
*         All page numbers refer to the Lab-NB User Manual.     *
*                                                               *
*****************************************************************/
                /* NOTE: The Mac IIci has only three slots,
                         but they are numbered 4,5,6          */
```

```
#define MAC_II_SLOT          6       /* The slot number in which the board sits   */
#define BASE_ADDRESS  0xE00000 /* Slot 6 requires this address: see p 3-3
                                      Slot 1:  900000
                                      Slot 2:  A00000
                                      Slot 3:  B00000
                                      Slot 4:  C00000
                                      Slot 5:  D00000
                                      Slot 6:  E00000                              */ define TIMER_B0             0       /* The code number for Timer B0              */
define MODE_B0              2       /* mode for "rate generator"                 */
#define COUNT_B0             2       /* divide base rate by 2   (max=200)         */
define BIN_BCD_B0           0       /* 16-bit counter, rather than 4 decade BCD  */ define TIMER_B1             1       /* The code number for Timer B1              */
define MODE_B1              1       /* mode for "programmable one-shot"          */
/*#define COUNT_B1          50       /* # of microsecs that power to LEDs is on   */
#define COUNT_B1            50       /* # of microsecs that power to LEDs is on   */
define BIN_BCD_B1           0       /* 16-bit counter, rather than 4 decade BCD  */ define TIMER_B2             2       /* The code number for Timer B2              */
define MODE_B2              2       /* mode for "rate generator"                 */
/*#define COUNT_B2         150       /* Pulse every 150 microseconds              */
#define COUNT_B2           150       /* Pulse every 100 microseconds              */
#define BIN_BCD_B2           0       /* 16-bit counter, rather than 4 decade BCD  */

/****
 *
 *      InitNatlInstBd
 *
 *      This routine just puts the National Instrument Board in a
 *      known initial configuration, as described in the LAB-NB User's
 *      Manual on pages 3-35 and 3-36.
 *
 *      Although I've named the routine "InitNatlInstBd", there is no
 *      reason why it can't be called more than once.  (This is NOT the
 *      case for most Macintosh routines that are called "Init...")
 *
 ****/ include "NatlInstBdDeclarations.h"

void    InitNatlInstBd(void);
void    SetUpNatlInstBd (int sizeH, int sizeV);
void    SetUpBTimers(void);
void    SetUpDigPorts(void);
void    SetUpSensorArraySize(int, int);

void InitNatlInstBd(void)    /* No known way to fail, here, so nothing is returned */
{
    int DummyValue;
    *CounterAModeAdr    =    (char) 0x38  ;
    *CounterAModeAdr    =    (char) 0x78  ;
    *IntrptControlAdr   =    (char) 0x00  ;
    *ADConfigAdr        =    (int)  0x0000 ;
    *ADClearAdr         =    (char) 0x00  ;
    DummyValue          =    *ADFIFOAdr   ;
    *DAC0DataAdr        =    (int)  0x0000 ;
    *DAC1DataAdr        =    (int)  0x0000 ;
}                                       /**** end of InitNatlInstBd ****/

/****
 *
 *      SetUpNatlInstBd
```

```c
#include "NatlInstBdDefinitions.h"

/************************************************************************
 *                                                                      *
 *      This is the Addresses file, for setting up the hardware.        *
 *      All page numbers refer to the Lab-NB User Manual                *
 *                                                                      *
 *      The idea is to make all the board register addresses            *
 *      available globally.  Here, space is set aside and the values    *
 *      are defined.                                                    *
 *                                                                      *
 *      This data is taken from page 3-2, Table 3-1                     *
 *                                                                      *
 ************************************************************************/ int  *ADConfigAdr       =  (int *) (BASE_ADDRESS  +  0x08000);
char *ADStatusAdr       =  (char *)(BASE_ADDRESS  +  0x08000);
int  *ADFIFOAdr         =  (int *) (BASE_ADDRESS  +  0x08010);
char *ADClearAdr        =  (char *)(BASE_ADDRESS  +  0x08010);

char *DACConfigAdr      =  (char *)(BASE_ADDRESS  +  0x58000);
int  *DAC0DataAdr       =  (int *) (BASE_ADDRESS  +  0x58010);
int  *DAC1DataAdr       =  (int *) (BASE_ADDRESS  +  0x58020);
int  *DAC2DataAdr       =  (int *) (BASE_ADDRESS  +  0x58030);

char *CounterA0DataAdr  =  (char *)(BASE_ADDRESS  +  0x40000);
char *CounterA1DataAdr  =  (char *)(BASE_ADDRESS  +  0x40010);
char *CounterA2DataAdr  =  (char *)(BASE_ADDRESS  +  0x40020);
char *CounterAModeAdr   =  (char *)(BASE_ADDRESS  +  0x40030);

char *CounterB0DataAdr  =  (char *)(BASE_ADDRESS  +  0x48000);
char *CounterB1DataAdr  =  (char *)(BASE_ADDRESS  +  0x48010);
char *CounterB2DataAdr  =  (char *)(BASE_ADDRESS  +  0x48020);
char *CounterBModeAdr   =  (char *)(BASE_ADDRESS  +  0x48030);

char *PortAAdr          =  (char *)(BASE_ADDRESS  +  0x50000);
char *PortBAdr          =  (char *)(BASE_ADDRESS  +  0x50010);
char *PortCAdr          =  (char *)(BASE_ADDRESS  +  0x50020);
char *DigControlAdr     =  (char *)(BASE_ADDRESS  +  0x50030);

char *IntrptControlAdr  =  (char *)(BASE_ADDRESS  +  0x10000);
char *IntrptStatusAdr   =  (char *)(BASE_ADDRESS  +  0x10000);
char *TimerIntrptClrAdr =  (char *)(BASE_ADDRESS  +  0x18000);

*
 *    Calls a number of routines to set things up for data collection
 *
 ****/ void SetUpNatlInstBd (int sizeH, int sizeV)
 {
   SetUpBTimers();
   SetUpDigPorts();
   SetUpSensorArraySize(sizeH,sizeV);
 }                                          /**** end of SetUpNatlInstBd ****/
/****
 *
 *      SetUpBTimers
 *
 *    This routine sets the timers as we want them to be for data collection
 *
 ****/
```

```c
void SetUpBTimers(void)
{
   unsigned char    CounterB0Command, CounterB0LSB, CounterB0MSB  ;
   unsigned char    CounterB1Command, CounterB1LSB, CounterB1MSB  ;
   unsigned char    CounterB2Command, CounterB2LSB, CounterB2MSB  ;
            /*
             *  First, set up Timer B0.
             *
             *  Set up timer B0 to be a rate generator. Base rate is
             *  2 MegaHertz, but that is divided by COUNT_B0, which
             *  is 2, resulting in a 1 MegaHertz rate.  This rate is
             *  used by the other timers, as RIS-31 is wired.
             */
   CounterB0Command   =   (TIMER_B0<<6) + (3<<4) + (MODE_B0<<1) + BIN_BCD_B0 ;
   CounterB0LSB       =    (COUNT_B0 & 0x00FF)          ;/* LSB of COUNT_B0 */
   CounterB0MSB       =   ((COUNT_B0 & 0xFF00) >> 8 )   ;/* MSB of COUNT_B0, shifted */
   *CounterBModeAdr   =   CounterB0Command    ;
   *CounterB0DataAdr  =   CounterB0LSB        ;
   *CounterB0DataAdr  =   CounterB0MSB        ;

/*
             *  Next, set up Timer B1.
             *
             *  Timer B1 controls the the power to the LEDs.  It
             *  is supposed to turn them on for COUNT_B1 microseconds
             *  at the beginning of every COUNT_B2 microsecond
             *  interval.  (It gets units of microseconds by virtue of
             *  the 1 MegaHertz rate established by timer B0).
             */
   CounterB1Command   =   (TIMER_B1<<6) + (3<<4) + (MODE_B1<<1) + BIN_BCD_B1 ;
   CounterB1LSB       =    (COUNT_B1 & 0x00FF)          ;/* LSB of COUNT_B1 */
   CounterB1MSB       =   ((COUNT_B1 & 0xFF00) >> 8 )   ;/* MSB of COUNT_B1, shifted */
   *CounterBModeAdr   =   CounterB1Command    ;
   *CounterB1DataAdr  =   CounterB1LSB        ;
   *CounterB1DataAdr  =   CounterB1MSB        ;
            /*
             *  Finally, set up Timer B2.
             *
             *  Set up timer B2 to be a rate generator. Base rate is
             *  1 MegaHertz (set by B0), but that is divided by
             *  COUNT_B1, which currently set at 100, resulting in a
             *  10 KHertz rate.  This is the fastest rate that
             *  individual sensors can be sampled.  In short, once
             *  cycle is started, a new sensor is sampled each 100
             *  microseconds (or whatever COUNT_B1 currently says).
             *  that the whole cycle can be started once every 100
             */
   CounterB2Command   =   (TIMER_B2<<6) + (3<<4) + (MODE_B2<<1) + BIN_BCD_B2 ;
   CounterB2LSB       =    (COUNT_B2 & 0x00FF)          ;/* LSB of COUNT_B2 */
   CounterB2MSB       =   ((COUNT_B2 & 0xFF00) >> 8 )   ;/* MSB of COUNT_B2, shifted */
   *CounterBModeAdr   =   CounterB2Command    ;
   *CounterB2DataAdr  =   CounterB2LSB        ;
   *CounterB2DataAdr  =   CounterB2MSB        ;

return;
}                                          /**** end of SetUpBTimers ****/

/****
```

```
*
*       SetUpBDigPorts
*
*       This routine sets the Digital Ports as we want them to be for data collection
*
****/
void SetUpDigPorts(void)
{
/*
    The stuff below is of historical interest and may of interest in the future, when
    we may want to use interrupts.  For now, I've just configured the ports using the
    simplest arrangement: Port A output, Port B output, Port C High Bits output, Port C
    Low Bits, input.

Old Stuff:
    This routine is one of the easiest to write, but hardest to understand.
    The problem is that the manual is rather obscure about exactly how the
    command words work.  For example, I'm trying to set Port A in Mode 1 Input
    (so that bits 6 and 7 of Port C are available for output).  Port B has to
    be set for output, because that is how the sensor array size is established.
    I don't think it matters whether Port B is in Mode 0 or Mode 1, but it
    looks like it needs to be in Mode 1 for bit 2 of Port C to be enabled for
    interrupts.  We don't need interrupt features now, but might want them later.

So, I'm going to put Group A in Mode 1 / Input,   and
                        Group B in Mode 1 / Output.

It is not certain, but it looks like I can do all that with a single control
    word.  See p. 3-58 (for Group A Mode 1 / Input and PC6,PC7 output), and
            See p. 3-60 (for Group B Mode 1 / Output).
*/
/*  unsigned char DigControlByte = 0xB4;*//*This was the old stuff...*/
    unsigned char DigControlByte = 0x81;/* A Out, B Out, C Hi Out C Lo In, All Mode 0
                                            See p. 3-56 Fig 3-1 */
/*
    If I wanted to use PortA for input (and I probably will shortly) it should suffice to:

unsigned char DigControlByte = 0x91;  A In, B Out, C Hi Out, C Lo In, All Mode 0 */

*DigControlAdr  =   DigControlByte;
    return;
}                                           /**** end of SetUpDigPorts ****/

/****
*
*       SetUpSensorArraySize
*
    Used to be restricted to a square array, as indicated below:
*
*       This routine sets the Digital PortB lower 3 bits with the Sensor
*       Array Size minus 1.  (The RIS-31 box thinks 0=>1x1, 1=>2x2, 2=>3x3,
*       ..., 7=>8x8 arrays)

But now can use a rectangular array, up to 8x8, as before.  Also, sizeH or
    sizeV go from 1-8, but the size passed to the port is one less than those numbers.

*
****/
```

```c
void SetUpSensorArraySize(int sizeH, int sizeV)
{
    unsigned char PortB;
    PortB=(sizeH-1) | (sizeV-1)<<3 ; /* sizeH in low 3 bits and sizeV in next 3 bits */
    *PortBAdr   =   PortB;
}

/****
 *
 *      This routine is adapted from the Lab-NB User Manual.
 *      General ideas came from page 3-50, which refers to the
 *      "Freerun Acquisition Mode; Posttrigger Mode". However
 *      there were several confusing and/or wrong things in it.
 *
 *      I believe the order shown IS in fact necessary to make this
 *      thing work as we desire. The last step in this routine, called
 *      Step 2, is the critical one. I think it must be last.
 *
 ****/ include "NatlInstBdVariables.h"
include "DataVariables.h"

void    InitializeForASweep(void);
void    TriggerASweep(void);
int     CollectASweep(void);           /* Return "1" for "okay", "0" if not */ void InitializeForASweep(void)
{
    unsigned int ADConfigWord=0x0101; /* See page 3-6,7,8. Channel 0 only, Gain=1 */
    int DummyValue;

*CounterAModeAdr    =   (unsigned char) 0x38   ;   /* Step 3. p.3-46 */
    {int i,j; j=0; for (i=0;i<10;i++) j+=1;}
    *CounterAModeAdr    =   (unsigned char) 0x78   ;   /* Step 1. p.3-46 */
    {int i,j; j=0; for (i=0;i<10;i++) j+=1;}
    /*
     *    Step 4 has two parts. First write (anything) to the AD Clear
     *    Register, then read the AD FIFO once to clear the garbage that is
     *    generated when the Clear Register was written.
     */
    *ADClearAdr         =   (unsigned char)   0    ;   /* Step 4.1 p. 3-46 */
    {int i,j; j=0; for (i=0;i<10;i++) j+=1;}
    DummyValue          =               *ADFIFOAdr ;   /* Step 4.2 p. 3-46 */
    {int i,j; j=0; for (i=0;i<10;i++) j+=1;}
    *CounterAModeAdr    =   (unsigned char) 0x70   ;   /* Step 5   p. 3-46 */
    {int i,j; j=0; for (i=0;i<10;i++) j+=1;}
    *ADConfigAdr        =                       0  ;   /* Why this? */
    {int i,j; j=0; for (i=0;i<10;i++) j+=1;}
    *ADConfigAdr        =           ADConfigWord   ;   /* Step 2.  p. 3-46 */
    {int i,j; j=0; for (i=0;i<10;i++) j+=1;}
    /*
     *      Step 5' is the actually triggering of sweep, by toggling bit 7 of PortC.
     *      Step 6 is to service the AD FIFO as conversions come in.
     */ return;                 /* no error is possible               */
}           /* end of InitializeForASweep */
```

```
/****
    According to Winfield, all I have to do to actually trigger a sweep is
    to oscillate bit 7 of Port C from low to high.

(Note: in a previous incarnation this was done using the
    "single bit set/reset control word" feature (See p. 3-64 and other
    preceeding sections). This is an "unusual" feature because it is not
    done by writing to Port C directly, but rather by writing to the
    Digital Control Register. This was necessary because complicated modes
    were being used for Port C, in order to allow an interrupt line to be
    read. This generated problems, so, for now, we are just using plain old
    MODE 0 for all ports, including C. The code below was from the old
    version:

unsigned char SetBit7ofPortC_ControlByte   = 0x0F;
        unsigned char ResetBit7ofPortC_ControlByte = 0x0E;
        *DigControlAdr  =   ResetBit7ofPortC_ControlByte;
        *DigControlAdr  =   SetBit7ofPortC_ControlByte;

but now we use the more straighforward code below. However, the above
    code worked, even with the fancy mode settings.)
*/ void TriggerASweep(void)
{
    unsigned char portCByte;
    int i,j;
    portCByte   =   0x00;
    *PortCAdr   =   portCByte;
    {int i,j; j=0; for (i=0;i<10;i++) j+=1;}
    portCByte   =   0x80;
    *PortCAdr   =   portCByte;
    /*{int i,j; j=0; for (i=0;i<10;i++) j+=1;}*/
}                       /* end of Trigger a Sweep  */ int CollectASweep(void) /* Return "1" for "okay", "0" if not */
{
    unsigned char adStatus, portC, boxStillRunning, somethingHappened, gata0,gata1;
    unsigned char overrun, overflow, davail;
    long weirdCounter;
    int i,j,n_elements,temData,davail_first;
    int idiag[64], jdiag[64];
    n_elements = sizeOfSensorArray * sizeOfSensorArray;

for(i=0;i<64;i++)idiag[i]=jdiag[i]=0;
    InitializeForASweep();
    TriggerASweep();
    sensorCellCount = 0;

weirdCounter=0;
    davail_first=1;
    for (i=0;i<sizeSentToBoxH;i++)
    {
     for(j=0;j<sizeSentToBoxV;j++)
     {
        /* first, wait until davail happens the first time!*/
        if(davail_first==1) do
        {   adStatus            =   *ADStatusAdr;
```

```
        davail            = adStatus & (unsigned char) 0x01;
    }while (!davail);     /* end of do...while */
    davail_first=0;

do
    {
        /****
         *
         *      Keep reading status register until overrun, or overflow
         *      or data vailable, or until bit 2 of Port C goes low.
         *
         */
        adStatus            = *ADStatusAdr;
        portC               = *PortCAdr;
        boxStillRunning     = portC & (unsigned char) 0x04;
        somethingHappened   = adStatus & ((unsigned char)0x0D);
        /*if(!boxStillRunning) {int i,j=0;for(i=0;i<10000;i++) j+=1;adStatus =
            *ADStatusAdr;}*/

}while (!somethingHappened && boxStillRunning );     /* end of do...while */ davail=adStatus & (unsigned char) 0x01;
    gata0 =adStatus & (unsigned char) 0x02;
    gata1 =adStatus & (unsigned char) 0x10;
    jdiag[i*sizeSentToBoxV+j]=10000 + gata0/0x02 +10*(gata1/0x10) +
        100*davail +1000*(boxStillRunning/4);
    overrun=adStatus & (unsigned char) 0x08;
    if (overrun != 0)
    {
        sweepStatus = 2;      /* There has been an overrun error: Covert signals too close
                                 together. */
        return 0;
    } overflow=adStatus & (unsigned char) 0x04;
    if (overflow != 0)
    {
        sweepStatus = 3;      /* There has been an overflow error. FIFO overflowed. */
        return 0;

}
    if (davail == 0) weirdCounter+=1; /* Means box done line is set, but in the new
                                         version, this may not mean that it is really
                                         done! There may be more conversion signals
                                         yet to come. On the other hand, we don't want
                                         to loop, waiting, forever, so the invention of
                                         weirdCounter. */ if (weirdCounter >= 1000) /* have been waiting for a long time... */
    {
        sweepStatus = 4;
        return 0;
    }
    if (davail != 0) /* Ready to convert something, so: */
    {
        /*temData=(int) 2*sensorCellCount;*/
        temData=*ADFIFOAdr; /* Read the FIFO, but only keep data if....*/
        if(i<sizeOfSensorArray && j<sizeOfSensorArray) /*increment the count only
            within expected array */
```

```
            {
                rawData[sensorCellCount]=temData; /* Get here when Davail == 1, whether or
                                                  * not the box is still running. (So,
                                                  * gets the last reading in that case.)
                                                  */
                idiag[sensorCellCount]=10000+i+10*j+100*(gata0/2) + 1000*(gata1/16);
                sensorCellCount+=1;
            }

}
    } /* end of for (j=0...) */
    } /* end of for (i=0...) */
    sweepStatus = 0; /* If we get here, got the desired number of readings */
    /*for (i=0;i<15;i++) (rawData[i+1]=*ADFIFOAdr;temData=0; for(j=0;j<100;j++) temData+=1;)*/
    return 1; /* Everything is ok */
}                                              /* end of CollectASweep */ include <stdio.h>
include "AllPrototypes.h"
#include "DataVariables.h"
#include "ControlVariables.h"
#include "WindowVariables.h"

void ComputeCursorPosition(void);

void ActionOnResizingSensorArray(void)
{
    DisposeWindow(controlWindow);
    InitializeData();
    InitializeControlWindow();
    InitializeDisplayWindow();
} void InitializeMinMax(void)
{
    int i;
    for (i=0;i<sizeOfSensorArray*sizeOfSensorArray;i++)
    {
        minData[i] = 3000;   /* This is greater than can be reached */
        maxData[i] =-3000;   /*This is less than can be reached */
    }
}                    /* end of InitializeMinMax */ void UpdateMinMax(void)
{
    int i;
    for (i=0;i<sizeOfSensorArray*sizeOfSensorArray;i++)
    {
        if (rawData[i] < minData[i]) minData[i] = rawData[i];
        if (rawData[i] > maxData[i]) maxData[i] = rawData[i];
    }
}                    /* end of UpdateMinMax */ void RangeAndValidData(void)
{
    int i;
    for (i=0;i<sizeOfSensorArray*sizeOfSensorArray;i++)
```

```
        {
        rangeData[i] = maxData[i] - minData[i];
        if (rangeData[i]!=0) validSensor[i] = 1; else validSensor[i]=0;
        }
    }                   /* end of RangeAndValidData */ void ScaleTheData(void)  /* This routine also keeps track of when the range data needs to be
    changed */
{
    int i;
    for (i=0;i<sizeOfSensorArray*sizeOfSensorArray;i++)
    {
     if(validSensor[i])
        {
            scaleData[i] =(int) (((long)(rawData[i]-minData[i])*(long)scaleValue)/
                ((long)rangeData[i]));
            if((scaleData[i]<0)||(scaleData[i]>scaleValue))
                {
                    if (rawData[i] < minData[i]) minData[i] = rawData[i];
                    if (rawData[i] > maxData[i]) maxData[i] = rawData[i];
                    rangeData[i] = maxData[i] - minData[i];
                    scaleData[i] =(int) (((long)(rawData[i]-minData[i])*(long)scaleValue)/
                        ((long)rangeData[i]));
                }
        }
    }
}                       /* end of ScaleTheData */ void CalcMCM(void)    /* Calculate the Center of Mass and Mass */

{
    int i,j,index,tem;
    mass=0; centerOfMassV=0; centerOfMassH=0;
    for (i=0;i<sizeOfSensorArray;i++)
    { for (j=0;j<sizeOfSensorArray;j++)
        { index=i*sizeOfSensorArray+j;
    if(validSensor[index]*validSensorOverride[index]) /* only compute for live cells */
    {
                            /* following lines threshold the reading */
        tem=scaleData[index];
        if(tem<(scaleValue/10)) tem=0;  /* ? ignore things less than 10% ?-*/
        mass += tem;

centerOfMassH += (long) i  *  (long) tem;
        centerOfMassV += (long) j  *  (long) tem;
    }
  }
} if(historyReady==1) /* slide in a new number, compute average */
{
        historyM[historyCount]      =   mass;
        historyCMH[historyCount]    =   centerOfMassH;
        historyCMV[historyCount]    =   centerOfMassV;
```

```
            historyCount+=1;
            if(historyCount==useHistoryN) historyCount=0;

massAve  =  centerOfMassAveH  =  centerOfMassAveV  =  0;
            for (i=0;i<useHistoryN;i++)
            {
                massAve              += historyM[i];
                centerOfMassAveH     += historyCMH[i];
                centerOfMassAveV     += historyCMV[i];
            }
            massAve              = massAve/useHistoryN;
            centerOfMassAveH     = centerOfMassAveH/useHistoryN;
            centerOfMassAveV     = centerOfMassAveV/useHistoryN;
    }
    if(historyReady==0)
    {
        if(historyCount<useHistoryN)
        {
            historyM[historyCount]=mass;
            historyCMH[historyCount]=centerOfMassH;
            historyCMV[historyCount]=centerOfMassV;
            historyCount+=1;
            if(historyCount==useHistoryN)
            {
                historyCount=0;
                historyReady=1;
            }
        }
    }
    if(useHistory&&historyReady) {mass=massAve;
                                  centerOfMassH=centerOfMassAveH;
                                  centerOfMassV=centerOfMassAveV;}
    plotCount+=1; if(plotCount>=npts)plotCount=0;
    y1[plotCount]=mass;
    if(mass!=0)y2[plotCount]=(moveWidth*centerOfMassH)/(mass*(long)(sizeOfSensorArray-1));
        else y2[plotCount]=-40;
    if(mass!=0)y3[plotCount]=(moveHeight*centerOfMassV)/(mass*(long)(sizeOfSensorArray-1));
        else y3[plotCount]=-40;

if(showBarGraph)
    {
        int i,j;
        plotCountBar+=1; if(plotCountBar>=nptsBar)plotCountBar=0;
        for(i=0;i<sizeOfSensorArray*sizeOfSensorArray;i++)
        {
            if (nptsBar>1) for(j=0;j<nptsBar-1;j++) yBar[i][j]=yBar[i][j+1]; /*Slide old
                stuff and...*/
            yBar[i][nptsBar-1]=scaleData[i];                /* Write latest at end */
        }
        if(nptsBar>1) for(j=0;j<nptsBar-1;j++)
        {
            yBar[25][j]=yBar[25][j+1]; /* mass */
            yBar[26][j]=yBar[26][j+1]; /* center of mass X */
            yBar[27][j]=yBar[27][j+1]; /* center of mass Y */
        }
        yBar[25][nptsBar-1]=y1[plotCount]; /* mass */
        yBar[26][nptsBar-1]=y2[plotCount]; /* center of mass X */
        yBar[27][nptsBar-1]=y3[plotCount]; /* center of mass Y */
```

```
    } if(plotSensor) /* Replace y3 with an individual sensor. */
    {
        int i;
        y3[plotCount]=0;
        for (i=0;i<sizeOfSensorArray*sizeOfSensorArray;i++)
            if(GetCtlValue(plotHndlArray[i])) y3[plotCount]+=scaleData[i];
    } if(useSensorButton)
    {
        char forOutput[30]; /* This is room for 29 characters + the terminating zero in C */
        Rect temRect; GrafPtr savePort; GetPort(&savePort); SetPort(displayWindow);
        SetRect(&temRect,0,125,80,135);
        EraseRect(&temRect);
        TextFont(22);
        TextFace(0);
        TextSize(9);
        MoveTo(0,135);/* First move is an absolute "MoveTo" in local coordinates.
                        All subsequent moves are relative "Move"s.     */
        sprintf(forOutput,"%41d (%41d,%41d) ",mass,centerOfMassH,centerOfMassV);
        DrawString(CtoPstr(forOutput));
        SetPort(savePort);
    }
    ComputeCursorPosition();
}                                               /** end of CalcMCM **/ void CalcMore(void)
{
    return;
}                                               /** End of CalcMore ***/ void ComputeCursorPosition(void)   /* Compute the actual coordinates of cursor position */
{
    long offSetH,offsetV;
    long temCenterOfMassH, temCenterOfMassV;
    if(mass>0 && (!useThreshold || mass>massThreshold))/*watch out for zero mass case?*/
    {
                    /* First, scale the data to size of rectangle (possibly transformed) */
        if(transformInteract) /* tranform h/v */
        {
            temCenterOfMassH= (moveWidth*centerOfMassV)/(mass*(long)(sizeOfSensorArray-1));
            temCenterOfMassV= (moveHeight*centerOfMassH)/(mass*(long)(sizeOfSensorArray-1));
            centerOfMassH=temCenterOfMassH;
            centerOfMassV=temCenterOfMassV;
        }
        else
        {
            centerOfMassH=(moveWidth*centerOfMassH)/(mass*(long)(sizeOfSensorArray-1));
            centerOfMassV=(moveHeight*centerOfMassV)/(mass*(long)(sizeOfSensorArray-1));
        }

/*          Then, enlarge by 10% all around            */
```

```
        centerOfMassH  =  (   120L*centerOfMassH  -   (120L*moveWidth)/10L    ) / 100L ;
        centerOfMassV  =  (   120L*centerOfMassV  -   (120L*moveHeight)/10L   ) / 100L ;

/*          Now do offsets and Windows              */ if(moveInScreen && transformInteract)
        {
            testMouse.h=screenBits.bounds.right-centerOfMassH;
            testMouse.v=screenBits.bounds.top+centerOfMassV;
        }
        if(moveInScreen && !transformInteract)
        {
            testMouse.h=centerOfMassH;
            testMouse.v=centerOfMassV;
        }
        if(moveInWindow)  /*Have to get Global coordinates of gameWindowBounds.
                        Note: We are already in the game Window's port, so it is okay
                            to use LocalToGlobal without setting the window. */
        {
            Point upperLeft;
            upperLeft.h=gameErase.left;
            upperLeft.v=gameErase.top;
            LocalToGlobal(&upperLeft);
            if(playingGame && !transformInteract) {
                testMouse.h=upperLeft.h+gameErase.left+centerOfMassH;
                testMouse.v=upperLeft.v+gameErase.top+centerOfMassV; }
            if(playingGame && transformInteract) {
                testMouse.h=upperLeft.h+gameErase.right-centerOfMassH;
                testMouse.v=upperLeft.v+gameErase.top+centerOfMassV; }
        }
        testIncMouse.h=testIncMouse.v=testJoyMouse.h=testJoyMouse.v=0;
        if(moveInScreen && !transformInteract)
        {   int temh=((testMouse.h-moveWidth/2)/10);
            int temv=((testMouse.v-moveHeight/2)/10);
            testJoyMouse.h=(temh*temh*temh)/300;
            testJoyMouse.v=(temv*temv*temv)/300;

if(controllingCursor==1) /* when not active, just report location on sensor,
                                when active, position it correctly */
            {
                testIncMouse.h=(ourMousePos.h-ourOffSet.h)+(testMouse.h-moveWidth/2)/5;
                testIncMouse.v=(ourMousePos.v-ourOffSet.v)+(testMouse.v-moveHeight/2)/5;
            }
            else
            {
                testIncMouse.h=(testMouse.h-moveWidth/2)/5;
                testIncMouse.v=(testMouse.v-moveHeight/2)/5;
            }
        }
    }/* end of if(mass>0)...soon to be if(mass>massThreshold) */
} include "AllPrototypes.h"
include "ControlVariables.h"
#include "DataVariables.h"
#include "WindowVariables.h"
#include "GameVariables.h"

int SuddenIncrease(void);
int SuddenDecrease(void);
```

```c
void UseGameWindow(int code)
{
    static int mouseIsDown;  /* 0 or 1 , depending */
    int     opSysErr;
    if( playingGame )
    {
        if(mass>massRunningThreshold && controllingCursor==0 && mouseControl)
        { /* This is the position stamp for first controlling the cursor */
            GetMouse(&ourMousePos);  /* Record the current mouse position */
            LocalToGlobal(&ourMousePos); /* Translate that to global coordinates */
            ourOffSet=testIncMouse;  /* Record the latest position on the sensor array */
        }
        if(mass<massRunningThreshold && controllingCursor==1) controllingCursor=0;

if(!mouseIsDown && mass>massRunningThreshold)
        {
            if(SuddenIncrease())
            {       /* HighLight Box on Mouse Down Within a Box */
                /*
                opSysErr=PostEvent(mouseDown,(long)0);
                mouseIsDown=1;
                */
            }
        } if(mouseIsDown && massPrevious>massRunningThreshold) /* On sudden decrease,
            act as if MouseUp: beep and generate new target */
        {
            if(SuddenDecrease())
            {
                opSysErr=PostEvent(mouseUp,(long)0);
                mouseIsDown=0;
            }
        }
        massPrevious=mass;

if( mass>massThreshold && (historyReady==1) )
        {
            if(tabletControl)MousePos(testMouse);
            if(joyStickControl)IncrementMousePos(testJoyMouse);
            if(mouseControl&&controllingCursor)MousePos(testIncMouse);
            if(mouseControl&& !controllingCursor)controllingCursor=1; /* Do this here! so it
                                                                        doesn't happen the
                                                                        first time when on */
        }
    }
} int SuddenIncrease(void)
{
    return ((mass-massPrevious)*(long)scaleValue)/mass  >  massDownThreshold;
} int SuddenDecrease(void)
{
    return ((massPrevious-mass)*(long)scaleValue)/massPrevious  >  massUpThreshold;
} extern CursHandle myCursorHandle,openCursorHandle[5],moveCursorHandle[9];
extern CursPtr myCursorPtr,arrowPtr,openCursorPtr[5],moveCursorPtr[9],useCursorPtr[27];
```

```
extern  WindowPtr dataWindow, gameWindow, displayWindow, controlWindow;
extern  WindowPtr plotWindow, barGraphWindow;
extern  Point testMouse, testIncMouse, testJoyMouse, ourMousePos, ourOffSet;
extern  Rect gameWindowBounds,gameErase;
extern  Rect dataErase; /*This a kluge just for DoModalError...*/
void    SetUpPlotRects(Rect *plotRectPassed, Rect *gridRectPassed);
void    DrawGridOutline(void);
void    FindMinMaxOfArray(int *min, int *max, int npts, int array[]);
void    FindRangeAndOffset(int *range, int *offset, int min, int max);
void    LabelAxes(char *labelX, char *labelY);
void    LabelEndPoints(int minXPassed, int maxXPassed, int minYPassed, int maxYPassed);
void    PlotLineAuto(int npts, int x[], int y[]);
void    PlotLineRanged(int npts, int x[], int y[], int minXpassed, int maxXpassed,
            int minYpassed, int
void    PlotLineAutoAndLabel(int npts, int x[], int y[]);
void    PlotIt(int npts, int x[], int y[]);
void    PlotItBar(int npts, int x[], int y[]);
void    SetUpPlotRects(Rect *plotRectPassed, Rect *gridRectPassed);
void    DrawGridOutline(void);
void    FindMinMaxOfArray(int *min, int *max, int npts, int array[]);
void    FindRangeAndOffset(int *range, int *offset, int min, int max);
void    LabelAxes(char *labelX, char *labelY);
void    LabelEndPoints(int minXPassed, int maxXPassed, int minYPassed, int maxYPassed);
void    PlotLineAuto(int npts, int x[], int y[]);
void    PlotLineRanged(int npts, int x[], int y[], int minXpassed, int maxXpassed,
            int minYpassed, int
void PlotLineAutoAndLabel(int npts, int x[], int y[]);
void    PlotIt(int npts, int x[], int y[]);
void    PlotItBar(int npts, int x[], int y[]);
#include "NatlInstBdDefinitions.h"

/****************************************************************************
*                                                                           *
*           This is the Addresses file, for setting up the hardware.        *
*           All page numbers refer to the Lab-NB User Manual                *
*                                                                           *
*           The idea is to make all the board register addresses            *
*           available globally.  Here, space is set aside and the values    *
*           are defined.                                                    *
*                                                                           *
*           This data is taken from page 3-2, Table 3-1                     *
*                                                                           *
****************************************************************************/ extern  int   *ADConfigAdr;
extern  char  *ADStatusAdr;
extern  int   *ADFIFOAdr;
extern  char  *ADClearAdr;

extern  char  *DACConfigAdr;
extern  int   *DAC0DataAdr;
extern  int   *DAC1DataAdr;
extern  int   *DAC2DataAdr;

extern  char  *CounterA0DataAdr;
extern  char  *CounterA1DataAdr;
extern  char  *CounterA2DataAdr;
extern  char  *CounterAModeAdr;

extern  char  *CounterB0DataAdr;
extern  char  *CounterB1DataAdr;
```

```c
extern char *CounterB2DataAdr;
extern char *CounterBModeAdr;

extern char *PortAAdr;
extern char *PortBAdr;
extern char *PortCAdr;
extern char *DigControlAdr;
extern char *IntrptControlAdr;
extern char *IntrptStatusAdr;
extern char *TimerIntrptClrAdr;
#include "NatlInstBdDefinitions.h"

/***********************************************************************
 *                                                                     *
 *       This is the Addresses file, for setting up the hardware.      *
 *       All page numbers refer to the Lab-NB User Manual              *
 *                                                                     *
 *       The idea is to make all the board register addresses          *
 *       available globally.  Here, space is set aside and the values  *
 *       are defined.                                                  *
 *                                                                     *
 *       This data is taken from page 3-2, Table 3-1                   *
 *                                                                     *
 ***********************************************************************/ extern int   *ADConfigAdr;
extern char  *ADStatusAdr;
extern int   *ADFIFOAdr;
extern char  *ADClearAdr;

extern char  *DACConfigAdr;
extern int   *DAC0DataAdr;
extern int   *DAC1DataAdr;
extern int   *DAC2DataAdr;

extern char *CounterA0DataAdr;
extern char *CounterA1DataAdr;
extern char *CounterA2DataAdr;
extern char *CounterAModeAdr;

extern char *CounterB0DataAdr;
extern char *CounterB1DataAdr;
extern char *CounterB2DataAdr;
extern char *CounterBModeAdr;

extern char *PortAAdr;
extern char *PortBAdr;
extern char *PortCAdr;
extern char *DigControlAdr;
extern char *IntrptControlAdr;
extern char *IntrptStatusAdr;
extern char *TimerIntrptClrAdr;
#define MAX_SENSOR_SIZE     8 /* The maximum number of sensors on a side */
#define MAX_HISTORY        32 /* The maximum number of previous sweeps to
                                 be stored in historical arrays       */
#define MAX_POINTS        904 /* The largest plotting arrays */
#define MAX_BARS          128 /* The largest bar graphBarGraph arrays */
#define MAX_BAR_PLOTS      36 /* The number of bar graphs to be plotted */
#include "DataDefinitions.h"
int rawData[MAX_SENSOR_SIZE*MAX_SENSOR_SIZE];
int minData[MAX_SENSOR_SIZE*MAX_SENSOR_SIZE];
int maxData[MAX_SENSOR_SIZE*MAX_SENSOR_SIZE];
```

```c
int rangeData[MAX_SENSOR_SIZE*MAX_SENSOR_SIZE];
int scaleData[MAX_SENSOR_SIZE*MAX_SENSOR_SIZE];
int validSensor[MAX_SENSOR_SIZE*MAX_SENSOR_SIZE];
int validSensorOverride[MAX_SENSOR_SIZE*MAX_SENSOR_SIZE];
int historyData[MAX_HISTORY][MAX_SENSOR_SIZE*MAX_SENSOR_SIZE];
int scaleValue=1000;
long centerOfMassH=-1,centerOfMassV=-1,centerOfMassAveH=-1,centerOfMassAveV=-1;
long mass=-1, massThreshold, massAve=-1;
long massPrevious=0, massRunningThreshold,massDownThreshold,massUpThreshold;
long historyM[MAX_HISTORY], historyCMH[MAX_HISTORY], historyCMV[MAX_HISTORY];
int  historyCount=0, historyReady=0;
int sweepStatus=-1;
int sensorCellCount=-1; /* Number of readings on the latest sweep */
long sweepCount=-1;
int plotCount, npts, x[MAX_POINTS],y1[MAX_POINTS],y2[MAX_POINTS],y3[MAX_POINTS];
int plotCountBar, nptsBar,xBar[MAX_BARS],yBar[MAX_BAR_PLOTS][MAX_BARS];
int sizeOfSensorArray,sizeSentToBoxH,sizeSentToBoxV;

int sizeMenuCode,targetMenuCode,windowMenuCode;
int showDisplay8,showDisplay16,showDisplay;
int useSensorButton,transformInteract,showData;
int plotSensor,autoScalePlot1,autoScalePlot2,autoScalePlot3;
int collectingData,processingData;
int initializingArray,singleSweep,pauseOnBadSweep;
int useHistory,useThreshold;
int tabletControl,mouseControl,joyStickControl;
int moveInWindow,moveInScreen;
long moveWidth,moveHeight;
int controllingCursor,playingGame,plotting,showBarGraph,continuousBarPlotting;

ControlHandle cntrlHndlArray[60];
ControlHandle plotHndlArray[25];

int arraySizeCode,targetSizeCode,boardSizeCode,useHistoryCode;
int targetSize, useHistoryN;

int dataWindowCode;
int freezePlot,freezeBars;
extern int  numberOfRows,numberOfCols,numberOfTargets;
extern int  firstBoxCode,lastBoxCode,targetBoxCode;
void Toggle(int *oneOrZero);
int Parity(int);
int IntPower(int base, int exp);
#include "DataDefinitions.h"
extern int sizeOfSensorArray,sizeSentToBoxH,sizeSentToBoxV;
extern int rawData[MAX_SENSOR_SIZE*MAX_SENSOR_SIZE];
extern int minData[MAX_SENSOR_SIZE*MAX_SENSOR_SIZE];
extern int maxData[MAX_SENSOR_SIZE*MAX_SENSOR_SIZE];
extern int rangeData[MAX_SENSOR_SIZE*MAX_SENSOR_SIZE];
extern int scaleData[MAX_SENSOR_SIZE*MAX_SENSOR_SIZE];
extern int validSensor[MAX_SENSOR_SIZE*MAX_SENSOR_SIZE];
extern int validSensorOverride[MAX_SENSOR_SIZE*MAX_SENSOR_SIZE];
extern int historyData[MAX_HISTORY][MAX_SENSOR_SIZE*MAX_SENSOR_SIZE];
extern int scaleValue;
extern long centerOfMassH,centerOfMassV,centerOfMassAveH,centerOfMassAveV;
extern long mass, massThreshold, massAve;
extern long massPrevious, massRunningThreshold,massDownThreshold,massUpThreshold;
extern long historyM[MAX_HISTORY], historyCMH[MAX_HISTORY], historyCMV[MAX_HISTORY];
extern int  historyCount, historyReady;
extern int sweepStatus;
```

```
extern int sensorCellCount; /* Number of readings on the latest sweep */
extern long sweepCount;/* Number of sweeps collected during initialization */
extern int plotCount, npts, x[],y1[],y2[],y3[];
extern int plotCountBar, nptsBar,xBar[],yBar[][MAX_BARS];
CursHandle myCursorHandle,openCursorHandle[5],moveCursorHandle[9];
CursPtr myCursorPtr,arrowPtr,openCursorPtr[5],moveCursorPtr[9],useCursorPtr[27];
extern int sizeMenuCode,targetMenuCode,windowMenuCode;
extern int showDisplay8,showDisplay16,showDisplay;
extern int useSensorButton,transformInteract,showData;
extern int plotSensor,autoScalePlot1,autoScalePlot2,autoScalePlot3;
extern int collectingData,processingData;
extern int initializingArray,singleSweep,pauseOnBadSweep;
extern int useHistory,useThreshold;
extern int tabletControl,mouseControl,joyStickControl;
extern int moveInWindow,moveInScreen;
extern long moveWidth,moveHeight;
extern int controllingCursor,playingGame,plotting,showBarGraph,continuousBarPlotting;

extern ControlHandle cntrlHndlArray[60];
extern ControlHandle plotHndlArray[25];

extern int sizeOfSensorArray,sizeSentToBoxH,sizeSentToBoxV;
extern int arraySizeCode,targetSizeCode,boardSizeCode,useHistoryCode;
extern int targetSize, useHistoryN;
extern int dataWindowCode;
extern int freezePlot,freezeBars;
#include "GeneralPrototypes.h"

int SystemCheck(void);
void InitializeApplication(void);
void InitializeMacintosh(void);
void InitializeControlVariables(void);
void InitializeData(void);
void InitializeMenus(void);
void InitializeWindows(void);
void InitializeCursors(void);
void InitNatlInstBd(void);
void SetUpNatlInstBd(int sizeSentToBoxH, int sizeSentToBoxV);

void HandleEvent(void);
void HandleNullEvent(void);
void HandleKeyEvent(EventRecord *theEvent);
void HandleMouseDown(EventRecord *theEvent);
void UpdateWindow(EventRecord *theEvent);
void ActivateWindow(EventRecord *theEvent);

void AdjustMenus(void);
void HandleMenu(long mSelect);

int  CollectASweep(void); /* Return "1" for "okay", "0" if not */
void InitializeForASweep(void);
void TriggerASweep(void);

void InitializeMinMax(void);
void UpdateMinMax(void);
void RangeAndValidData(void);
void ScaleTheData(void);
void CalcMCM(void);
void CalcMore(void);
```

```c
void DoModalError(int);

void ActionOnResizingSensorArray(void);
void ActionOnResizingTargetBoxes(void);
void ActionOnResizingGameBoard(void);
void InitializeControlWindow(void);
void UseControlWindow(int);
void MouseDownInControlWindow(Point globalWhere);
void OnGoAwayControlWindow(void);
void UpdateControlWindow(void);
void ActivateControlWindow(int active);

void InitializeDataWindow(void);
void UseDataWindow(int);
void MouseDownInDataWindow(Point globalWhere);
void OnGoAwayDataWindow(void)
void UpdateDataWindow(void);
void ActivateDataWindow(int active);

void InitializeDisplayWindow(void);
void UseDisplayWindow(int);
void MouseDownInDisplayWindow(Point globalWhere);
void OnGoAwayDisplayWindow(void);
void UpdateDisplayWindow(void);
void ActivateDisplayWindow(int active);
void InitDisplayArray(void);
void UpdateBitMap(void);
void GreyUnusedDisplayCells (void);
void SetSmallpicRect ( Rect *adrRect, int code);
void SetTargetRect ( Rect *adrRect, int i, int j, int size);

void InitializeGameWindow(void);
void UseGameWindow(int);
void MouseDownInGameWindow(Point globalWhere);
void OnGoAwayGameWindow(void);
void UpdateGameWindow(void);
void ActivateGameWindow(int active);
int     GetCol(int targetBoxCode);
int     GetRow(int targetBoxCode);
void    GetNewTargetBox(int *targetBoxCode);
void    MarkTargetBox(int targetBoxCode);
void    UnMarkTargetBox(int targetBoxCode);
void    HiLightBox(int targetBoxCode);
void    UnHiLightBox(int targetBoxCode);
void    GetBoxCode(int *firstBoxCode);
void    AnnotateTargetChoice(void);
int     CustomTrackControl(void);
void    IncrementCursor(void);

void InitializePlotWindow(void);
void UsePlotWindow(int);
void MouseDownInPlotWindow(Point globalWhere);
void OnGoAwayPlotWindow(void);
void UpdatePlotWindow(void);
void ActivatePlotWindow(int active);
void InitializeBarGraphWindow(void);
void UseBarGraphWindow(int);
void MouseDownInBarGraphWindow(Point globalWhere);
void OnGoAwayBarGraphWindow(void);
void UpdateBarGraphWindow(void);
```

```c
void ActivateBarGraphWindow(int active);
void BlankBarGraphs(void);

void DefineEraseRect(Rect *boundsRect, Rect *eraseRect);
void MousePos(Point newPos);
void IncrementMousePos(Point newPos);
void DoModalError(int bad);
#include <stdio.h>
include "AllPrototypes.h"
#include "PlottingPrototypes.h"
#include "ControlVariables.h"
#include "DataVariables.h"

WindowPtr   plotWindow;
Rect        plotWindowBounds;/* These are in global coordinates */
Rect        plotErase;/* These are in window-local coordinates */ char labelX[]="\pThe Last 600 Good Sweeps";

Rect plotRect1, gridRect1; char labelY1[]="\pMass";
Rect plotRect2, gridRect2; char labelY2[]="\pHorizontal CM";
Rect plotRect3, gridRect3; char labelY3[]="\pVertical CM";

int pWWidth,pWHeight;

void InitializePlotWindow(void)
{
    char drawAtFirst = true, goAway=true;

/* Create a "plot" window on the bottom left */ plotWindowBounds.top        =   screenBits.bounds.bottom-400;
    plotWindowBounds.bottom     =   screenBits.bounds.bottom-4;
    plotWindowBounds.left       =   screenBits.bounds.left+4;
    plotWindowBounds.right      =   screenBits.bounds.right-200;
    DefineEraseRect(&plotWindowBounds,&plotErase);
    plotWindow = NewWindow(0L, &plotWindowBounds, "\pPlot Window", drawAtFirst,
        noGrowDocProc, -1L, goAway, 0);

pWWidth=plotErase.right-plotErase.left;
    pWHeight=plotErase.bottom-plotErase.top;

/* Set up three windows, based upon equal division of plotErase space */ plotRect1.right=plotRect2.right=plotRect3.right=plotErase.right-4;
    plotRect1.left=plotRect2.left=plotRect3.left=plotErase.left+4;
    plotRect1.bottom=plotErase.bottom-4;
    plotRect1.top=plotErase.bottom-pWHeight/3;
    plotRect2.top=plotErase.bottom-(2*pWHeight)/3;
    plotRect3.top=plotErase.top;
    plotRect2.bottom=plotRect1.top-4;
    plotRect3.bottom=plotRect2.top-4;
    gridRect1=plotRect1;gridRect1.left+=70;gridRect1.bottom-=30;
    gridRect2=plotRect2;gridRect2.left+=70;gridRect2.bottom-=30;
    gridRect3=plotRect3;gridRect3.left+=70;gridRect3.bottom-=30;
    {int i; for(i=0;i<npts;i++) {x[i]=i; y1[i]=y2[i]=y3[i]=0;}}
} void MouseDownInPlotWindow(Point globalWhere)
```

```
.(
} void OnGoAwayPlotWindow(void)
{
    HideWindow(plotWindow);
    plotting=0;SetCtlValue(cntrlHndlArray[5],plotting);
} void ActivatePlotWindow(int active) /* !active means deactivate */
{
    if(active) {plotting=1;SetCtlValue(cntrlHndlArray[5],plotting);}
    else {plotting=0;SetCtlValue(cntrlHndlArray[5],plotting);}
} void UpdatePlotWindow(void)
{
    UsePlotWindow(1);
} void UsePlotWindow(int code)
{
    GrafPtr savePort;
    if(plotCount == npts-1 || code==1) /*Code=1 for update*/
    {
        GetPort(&savePort);
        SetPort(plotWindow);
        if(code==1) EraseRect(&plotErase);

SetUpPlotRects(&plotRect1,&gridRect1);
        EraseRect(&plotRect1);
        DrawGridOutline();
        if(autoScalePlot1) {PlotLineAutoAndLabel(npts,x,y1);}
        else {LabelEndPoints(0,npts-1,-20,sizeOfSensorArray*sizeOfSensorArray*scaleValue);
            PlotLineRanged(npts,x,y1,0,npts,-20,sizeOfSensorArray*sizeOfSensorArray*scaleValue);

SetUpPlotRects(&plotRect2,&gridRect2);
        EraseRect(&plotRect2);
        DrawGridOutline();
        if(autoScalePlot2) {PlotLineAutoAndLabel(npts,x,y2);}
        else {LabelEndPoints(0,npts-1,-20,(int)moveWidth);
            PlotLineRanged(npts,x,y2,0,npts-1,-20,(int)moveWidth);}

SetUpPlotRects(&plotRect3,&gridRect3);
        EraseRect(&plotRect3);
        DrawGridOutline();
        if(autoScalePlot3) {PlotLineAutoAndLabel(npts,x,y3);}
        else {LabelEndPoints(0,npts-1,-20,(int)moveHeight);
            PlotLineRanged(npts,x,y3,0,npts-1,-20,(int)moveHeight);}

SetPort(savePort);
#include <stdio.h>
include "AllPrototypes.h"
include "ControlVariables.h"
#include "DataVariables.h"
#include "CursorVariables.h"
#include "WindowVariables.h"

WindowPtr   gameWindow;
Rect        gameWindowBounds;/* These are in global coordinates */
```

```
    Rect        gameErase;/* These are in window-local coordinates */
    int         numberOfRows,numberOfCols,numberOfTargets;
    int         firstBoxCode,lastBoxCode,targetBoxCode;

void InitializeGameWindow(void)
{
    char drawAtFirst = true, goAway=true;
    int width,height;

/* Create a "game" window in the upper left of some size*/ gameWindowBounds.top       =   screenBits.bounds.top+40;
    gameWindowBounds.left      =   screenBits.bounds.left;
    if(boardSizeCode==1) {gameWindowBounds.bottom=screenBits.bounds.bottom;
                          gameWindowBounds.right =screenBits.bounds.right;}
    if(boardSizeCode==2) {gameWindowBounds.bottom=gameWindowBounds.top+150;
         gameWindowBounds.right=150;}
    if(boardSizeCode==3) {gameWindowBounds.bottom=gameWindowBounds.top+342;
         gameWindowBounds.right=512;}
    if(boardSizeCode==4) {gameWindowBounds.bottom=gameWindowBounds.top+480;
         gameWindowBounds.right=640;}
    if(boardSizeCode==5) {gameWindowBounds.bottom=gameWindowBounds.top+882;
         gameWindowBounds.right=1152;}
    if(boardSizeCode==6) {gameWindowBounds.bottom=gameWindowBounds.top+45;
         gameWindowBounds.right=45;}
    if(gameWindowBounds.bottom>screenBits.bounds.bottom)
         gameWindowBounds.bottom=screenBits.bounds.bottom;
    if(gameWindowBounds.right>screenBits.bounds.right)
         gameWindowBounds.right=screenBits.bounds.right;
width=gameErase.right-gameErase.left;
height=gameErase.bottom-gameErase.top;
numberOfRows=(height)/15; /* truncating integer divide */
numberOfCols=(width)/15;
numberOfTargets=numberOfRows*numberOfCols;
    firstBoxCode=lastBoxCode=targetBoxCode=-1; /*Count boxes from 0 to numberOfTargets-1 */
    GetNewTargetBox(&targetBoxCode);
} void MouseDownInGameWindow(Point globalWhere)
{
    GrafPtr savePort;

GetPort(&savePort);
    SetPort(gameWindow);
    GetBoxCode(&firstBoxCode);
    HiLightBox(firstBoxCode);
    SetCursor(myCursorPtr); /* changes to indicate mouse down state */
    if(CustomTrackControl())/* true only if started in target box */
    {
        UnHiLightBox(firstBoxCode);
        if(firstBoxCode==targetBoxCode)/* do all the stuff for a hit */
        {
            SysBeep((int)1);
            UnMarkTargetBox(targetBoxCode);
            GetNewTargetBox(&targetBoxCode);
            MarkTargetBox(targetBoxCode);
        }
    }
```

```
    SetPort(savePort);
} int CustomTrackControl(void)
{
    int        ok,currentBoxCode,currentHiLightState,firstHiLightState;
    EventRecord theEvent;

currentHiLightState=1; /* On, when we call this routine, unless targetBoxCode<0 */
    if(targetBoxCode<0)currentHiLightState=0;
    firstHiLightState=currentHiLightState;

for(;;) /* Do the below for ever, i.e., until mouseUp */
    {
     ok = GetNextEvent (everyEvent, &theEvent);
     if (ok || (theEvent.what==nullEvent))
      switch (theEvent.what)
      {
        case nullEvent: /* This is where I do most of my stuff! */
            HandleNullEvent();
            if(firstHiLightState) /* Only do below if started in a box */
            {
                GetBoxCode(¤tBoxCode);
                if(currentHiLightState==0 && currentBoxCode==firstBoxCode)
                {
                    HiLightBox(firstBoxCode);
                    currentHiLightState=1;
                }
                if(currentHiLightState==1 && currentBoxCode!=firstBoxCode)
                {
                    UnHiLightBox(firstBoxCode);
                    currentHiLightState=0;
                }
            }
            else IncrementCursor();
            break;

case mouseUp:
            SetCursor(arrowPtr);
            return currentHiLightState;
            break;
      }
    }
}
/* end CustomTrackControl */ void IncrementCursor(void)
{
    static int cursorIndex;
    cursorIndex+=1;
    if(cursorIndex<0) cursorIndex=0;
    if(cursorIndex>26) cursorIndex=0;
    SetCursor(useCursorPtr[cursorIndex]);
}
void OnGoAwayGameWindow(void)
{
    HideWindow(gameWindow);
    playingGame=0;
}
```

```c
void ActivateGameWindow(int active) /* !active means deactivate */
{
    if(active) /* on activation */
    {
        SetPort(gameWindow);
        MarkTargetBox(targetBoxCode);
        playingGame=1;
    }
    else /*  on deactivation */
    {
        UnMarkTargetBox(targetBoxCode);
        playingGame=0;
    }
} void UpdateGameWindow(void)
{
    Rect targetRect;
    int i,j,  l,r,t,b; /* last 4 are the offsets from upper left of target boxes*/
    GrafPtr savePort;

GetPort(&savePort);
    SetPort(gameWindow);
    EraseRect(&gameErase);
    /* make "targetSize" pixel boxes in center of 15 pixel grid, over whole window.
       For now, targetSize is either 1, 3, or 5 pixels on a side. */
    if(targetSize==1) {l=t=7; r=b=8;}
    if(targetSize==3) {l=t=6; r=b=9;}
    if(targetSize==5) {l=t=5; r=b=10;}
    for (j=0;j<numberOfRows;j++)
    {
     for (i=0;i<numberOfCols;i++)
     {
        SetRect(&targetRect,l+gameErase.left+15*i,t+gameErase.top+15*j,
            r+gameErase.left+15*i,b+gameErase.top+15*j);
        FrameRect(&targetRect);
     }
    }
    if(FrontWindow()==gameWindow) MarkTargetBox(targetBoxCode);
    SetPort(savePort);
} void ActionOnResizingGameBoard(void)
{
    DisposeWindow(gameWindow);
    InitializeGameWindow();
    if(moveInWindow)
    {
        moveWidth=gameWindowBounds.right-gameWindowBounds.left;
        moveHeight=gameWindowBounds.bottom-gameWindowBounds.top;
    }
} void ActionOnResizingTargetBoxes(void)
{
    UpdateGameWindow();
}
#include <stdio.h>
include "AllPrototypes.h"
```

```c
#include "GameVariables.h"
#include "ControlVariables.h"
#include "WindowVariables.h"
#include "DataVariables.h"

MenuHandle  appleMenu, fileMenu, sizeMenu, targetMenu, gameMenu, windowMenu,plotMenu,historyMenu;

enum{appleID = 1,fileID,sizeID,targetID,gameID,windowID,plotID,historyID};/* for Menu */
enum{quitItem = 1};/* for File Menu */
enum{controlItem=1,dataItem,displayItem,gameItem,plotItem,barGraphItem};/* for Window Menu */
enum{freezeItem = 1,halfNpts,doubleNpts,labelNpts,halfNptsBar,doubleNptsBar,labelNptsBar,
    freezeBarsItem};/* for Plot Menu */ void    InitializeMenus(void)
{
    InsertMenu(appleMenu = NewMenu(appleID, "\p\024"), 0);
    InsertMenu(fileMenu = NewMenu(fileID, "\pFile"), 0);
    InsertMenu(sizeMenu = NewMenu(sizeID, "\pSensor Size"),0);
    InsertMenu(targetMenu = NewMenu(targetID, "\pTarget Size"),0);
    InsertMenu(gameMenu = NewMenu(gameID, "\pGame Board Size"),0);
    InsertMenu(windowMenu = NewMenu(windowID, "\pWindows"), 0);
    InsertMenu(plotMenu = NewMenu(plotID, "\pPlots"), 0);
    InsertMenu(historyMenu = NewMenu(historyID, "\pHistory"), 0);
    DrawMenuBar();
    AddResMenu(appleMenu, 'DRVR');
    AppendMenu(fileMenu, "\pQuit/Q");
    AppendMenu(sizeMenu, "\pSize of Sensor Array = 1;Size of Sensor Array = 2;Size of Sensor
        Array = 3;Size of Sensor Array = 4;Size of Sen
    AppendMenu(targetMenu, "\p1x1 Pixel Target;3x3-Pixel Target;5x5 Pixel Target");
    AppendMenu(gameMenu, "\pWhole Screen;150 x 150 pixels;Classic Mac;13 \" Mac;Radius TPD;
        Tiny Board");
    AppendMenu(windowMenu, "\pControl Window;DataWindow;DisplayWindow;GameWindow;PlotWindow;
        BarGraphWindow");
    AppendMenu(plotMenu, "\pFreeze Plot/F;Halve Npts/H;Double Npts/D");
    AppendMenu(plotMenu,"\p0000"); /* for npts */
    AppendMenu(plotMenu,"\pHalve NptsBar/S;Double NptsBar/2;0000;Freeze Bars/B");
    SetItem(plotMenu,halfNptsBar,"\pNptsBar/2");
    SetItem(plotMenu,doubleNptsBar,"\pNptsBar*2");
    AppendMenu(historyMenu,"\p2;4;8;16;32");
} /* end InitializeMenus */
void    AdjustMenus(void)
{
    char forOutput[9],forOutputBar[9];/* This is room for 8 characters + the terminating
        zero in C */
    sprintf(forOutput,"%8u",npts);
    sprintf(forOutputBar,"%8u",nptsBar);
    CheckItem(sizeMenu, arraySizeCode, true);
    CheckItem(targetMenu,targetSizeCode,true);
    CheckItem(gameMenu,boardSizeCode,true);
    CheckItem(plotMenu,freezeItem,freezePlot);
    CheckItem(plotMenu,freezeBarsItem,freezeBars);
    CheckItem(historyMenu,useHistoryCode,useHistory);
    SetItem(plotMenu,labelNpts,CtoPstr(forOutput));
    SetItem(plotMenu,labelNptsBar,CtoPstr(forOutputBar));

}/* end AdjustMenus

/*****
 * HandleMenu(mSelect)
 *
 * Handle the menu selection. mSelect is what MenuSelect() and
```

```
 * MenuKey() return: the high word is the menu ID, the low word
 * is the menu item
 *
 *****/ void HandleMenu (mSelect)

long      mSelect;
{
    int       menuID = HiWord(mSelect);
    int       menuItem = LoWord(mSelect);
    Str255    name;
    GrafPtr   savePort;
    WindowPeek frontWindow;

switch (menuID)
       {
       case  appleID:
       GetPort(&savePort);
       GetItem(appleMenu, menuItem, name);
       OpenDeskAcc(name);
       SetPort(savePort);
       break;

case  fileID:
       switch (menuItem)
          {
          case  quitItem:
            ExitToShell();
            break;
          }
       break;

case  sizeID:
       CheckItem(sizeMenu, arraySizeCode, false);
       arraySizeCode = menuItem;
       sizeOfSensorArray=arraySizeCode;
       ActionOnResizingSensorArray();
       break;

case  targetID:
       CheckItem(targetMenu, targetSizeCode, false);
       targetSizeCode = menuItem;
       targetSize=2*targetSizeCode - 1;
       ActionOnResizingTargetBoxes();
       break;

case  gameID:
       CheckItem(gameMenu, boardSizeCode, false);
       boardSizeCode = menuItem;
       ActionOnResizingGameBoard();
       break;

case  windowID:
       switch(menuItem)
       {
            case  controlItem:   ShowWindow(controlWindow);  break;
            case  dataItem:      ShowWindow(dataWindow);     break;
            case  displayItem:   ShowWindow(displayWindow);  break;
```

```
                case gameItem:
                    ShowWindow(gameWindow);
                    if(FrontWindow()==gameWindow) MarkTargetBox(targetBoxCode);
                    break;
                case plotItem:      ShowWindow(plotWindow);     break;
                case barGraphItem:  ShowWindow(barGraphWindow); break;
            }
            break;

case plotID:
            switch(menuItem)
            {
                case freezeItem: Toggle(&freezePlot); break;
                case halfNpts: npts=npts/2; if(npts<2) npts=2; break;
                case doubleNpts: npts=2*npts; if(npts>MAX_POINTS) npts=MAX_POINTS; break;
                case halfNptsBar:   BlankBarGraphs(); nptsBar=nptsBar/2; if(nptsBar<1) nptsBar=1;
                    break;
                case doubleNptsBar: BlankBarGraphs(); nptsBar=2*nptsBar; if(nptsBar>MAX_BARS)
                    nptsBar=MAX_BARS; break;
                case freezeBarsItem: Toggle(&freezeBars); break;
            }
            break;

case historyID:
            CheckItem(historyMenu, useHistoryCode, false);
            useHistoryCode=menuItem;
            useHistoryN=IntPower(2,useHistoryCode);
            break;

}
}/* end HandleMenu */
#include "ControlVariableDeclarations.h"
#include "DataVariableDeclarations.h"
#include "AllPrototypes.h"
#include "GeneralPrototypes.h"

/* Below are prototypes for this file */

/* Below are the routines defined in this file */
void InitializeApplication(void)
{
    InitializeMacintosh();
    InitializeControlVariables(); /***This is HERE ***/
    InitializeData();
    InitializeMenus();
    InitializeWindows();
    InitializeCursors();
    InitNatlInstBd();
    SetUpNatlInstBd(sizeSentToBoxH,sizeSentToBoxV);

} void InitializeControlVariables(void)
{
    GetDateTime(&randSeed);

sizeOfSensorArray=5; sizeSentToBoxH=6,sizeSentToBoxV=6;
```

```
    showDisplay8=0; showDisplay16=0; showDisplay=0;
    useSensorButton=0; transformInteract=0; showData=0;
    plotSensor=0; autoScalePlot1=autoScalePlot2=autoScalePlot3=1;
    collectingData=1; processingData=1;
    initializingArray=0;singleSweep=0;pauseOnBadSweep=1;
    useHistory=1;useThreshold=1;
    tabletControl=1;mouseControl=0,joyStickControl=0;
    moveInWindow=0;moveInScreen=1;
        moveWidth=screenBits.bounds.right-screenBits.bounds.left;
        moveHeight=screenBits.bounds.bottom-screenBits.bounds.top;
    controllingCursor=0;playingGame=0;plotting=0; showBarGraph=0,continuousBarPlotting=1;
    arraySizeCode=5; targetSizeCode=3; boardSizeCode=2;useHistoryCode=2;
    targetSize=2*targetSizeCode - 1;
    useHistoryN=IntPower(2,useHistoryCode);
    dataWindowCode=-1; freezePlot=0,freezeBars=0;
    npts=MAX_POINTS; nptsBar=1;

massThreshold=scaleValue/10;
        massRunningThreshold=scaleValue/10;
        massDownThreshold=20;
        massUpThreshold=20;
#include "AllPrototypes.h"
#include "WindowVariables.h"

Point testMouse, testIncMouse, testJoyMouse, ourMousePos, ourOffSet;

void InitializeWindows()
{
    InitializeControlWindow();
    InitializeDataWindow();
    InitializeDisplayWindow();
    InitializeGameWindow();
    InitializePlotWindow();
    InitializeBarGraphWindow();
    ShowWindow(controlWindow);
    SelectWindow(controlWindow);
}
include "AllPrototypes.h"
#include "WindowVariables.h"

Point testMouse, testIncMouse, testJoyMouse, ourMousePos, ourOffSet;

void InitializeWindows()
{
    InitializeControlWindow();
    InitializeDataWindow();
    InitializeDisplayWindow();
    InitializeGameWindow();
    InitializePlotWindow();
    InitializeBarGraphWindow();
    ShowWindow(controlWindow);
    SelectWindow(controlWindow);
}
/****
 *
 * InitializeMacintosh()
 *
 * Initialize all the managers & memory
 *
 ****/

/* MacHeaders Included (automatically, as this project is set up) */ include "AllPrototypes.h"
```

```
void InitializeMacintosh(void)

{
    MaxApplZone();
    InitGraf(&thePort);
    InitFonts();
    FlushEvents(everyEvent, 0);
    InitWindows();
    InitMenus();
    TEInit();
    InitDialogs(0L);
    InitCursor();

return;
}
/* end InitMacintosh */
#include "AllPrototypes.h"
#include "DataVariables.h"
void InitializeData(void)
{
    InitializeMinMax();
    {int i; for (i=0;i<sizeOfSensorArray*sizeOfSensorArray;i++) validSensor[i]=0;}
    {int i; for (i=0;i<sizeOfSensorArray*sizeOfSensorArray;i++) validSensorOverride[i]=1;
}
include "AllPrototypes.h"
#include "CursorDeclarations.h"

void InitializeCursors(void)
{
    int i;
    myCursorHandle=GetCursor((int)130);
    HLock(myCursorHandle);
    myCursorPtr=*myCursorHandle;
    arrowPtr=&arrow;

for(i=0;i<5;i++)  {openCursorHandle[i]=GetCursor((int)(200+i));
                       HLock(openCursorHandle[i]);
                       openCursorPtr[i]=*(openCursorHandle[i]);}
    for(i=0;i<9;i++)  {moveCursorHandle[i]=GetCursor((int)(296+i));
                       HLock(moveCursorHandle[i]);
                       moveCursorPtr[i]=*(moveCursorHandle[i]);}
    for(i=0;i<5;i++) useCursorPtr[i]=openCursorPtr[i];
    for(i=0;i<4;i++) useCursorPtr[5+i]=moveCursorPtr[5+i];
    for(i=0;i<9;i++) useCursorPtr[9+i]=moveCursorPtr[8-i];
    for(i=0;i<4;i++) useCursorPtr[18+i]=moveCursorPtr[1+i];
    for(i=0;i<5;i++) useCursorPtr[22+i]=openCursorPtr[4-i];
}
include "AllPrototypes.h"
#include "WindowVariables.h"

void UpdateWindow(EventRecord *theEvent)
{
    BeginUpdate(theEvent->message);
        if(theEvent->message==(long)controlWindow)    UpdateControlWindow();
        if(theEvent->message==(long)dataWindow)       UpdateDataWindow();
        if(theEvent->message==(long)displayWindow)    UpdateDisplayWindow();
        if(theEvent->message==(long)gameWindow)       UpdateGameWindow();
        if(theEvent->message==(long)plotWindow)       UpdatePlotWindow();
        if(theEvent->message==(long)barGraphWindow)   UpdateBarGraphWindow();
    EndUpdate(theEvent->message);
}
```

```c
#include "AllPrototypes.h"
include "ControlVariables.h"
#include "DataVariables.h"

void HandleNullEvent(void)
{
    int okSweep;
    if(!collectingData) return;
    okSweep=CollectASweep();
    if(singleSweep)
    {
        singleSweep=false;
        collectingData=false;
        SetCtlValue(cntrlHndlArray[10],collectingData);

}/*reset after single sweep*/
    if (!okSweep) /* The following is what we do for a bad sweep */
    {
        if(pauseOnBadSweep) DoModalError(1); /* "1" indicates a bad sweep */
        return; /* don't continue after a bad sweep */
    }
    sweepCount+=1;
    if(initializingArray) UpdateMinMax();
    if(processingData) {ScaleTheData();CalcMCM();CalcMore();}
    if(showData) UseDataWindow(0);
    if(showDisplay) {UpdateBitMap(); UseDisplayWindow(0);}
    if(playingGame) UseGameWindow(0);
    if(plotting && !freezePlot) UsePlotWindow(0);
    if(showBarGraph && !freezeBars) UseBarGraphWindow(0);
}
include "AllPrototypes.h"
#include "WindowVariables.h"

/****
 * HandleMouseDown (theEvent)
 *
 * Take care of mouseDown events.
 *
 ****/ void HandleMouseDown(EventRecord *theEvent)

{
    WindowPtr   theWindow;
    int windowCode = FindWindow (theEvent->where, &theWindow);
    Rect dragRect = screenBits.bounds;
    Rect sizeRect = screenBits.bounds; unsigned long longSize;
    sizeRect.left=100;  sizeRect.top=200; /* Minimum size of Data Window is 100 wide x 200 long */
    sizeRect.right=640; sizeRect.bottom=480; /* Maximum size of Data Window is 640 wide x 480 long */
    switch (windowCode)
    {
      case inSysWindow:
        SystemClick (theEvent, theWindow);
        break;

case inMenuBar:
        AdjustMenus();
        HandleMenu(MenuSelect(theEvent->where));
        HiliteMenu(0);       /* Unhilights any hilighted menu */
        break;

case inDrag:
        if (theWindow != FrontWindow()) {SelectWindow(theWindow); return;}
```

```
            DragWindow(theWindow, theEvent->where, &dragRect);
            break;

case inGrow:
            if (theWindow != FrontWindow()) {SelectWindow(theWindow); return;}
            longSize=GrowWindow(theWindow, theEvent->where, &sizeRect);
            SizeWindow(theWindow, LoWord(longSize), HiWord(longSize), true);
            break;

case inContent:  /* If not the active window, just make it active */
            if (theWindow != FrontWindow()) {SelectWindow(theWindow); return;}
            if(theWindow==controlWindow)     MouseDownInControlWindow(theEvent->where);
            if(theWindow==dataWindow)        MouseDownInDataWindow(theEvent->where);
            if(theWindow==displayWindow)     MouseDownInDisplayWindow(theEvent->where);
            if(theWindow==gameWindow)        MouseDownInGameWindow(theEvent->where);
            if(theWindow==plotWindow)        MouseDownInPlotWindow(theEvent->where);
            if(theWindow==barGraphWindow)    MouseDownInBarGraphWindow(theEvent->where);
            break;

case inGoAway:
            if (theWindow != FrontWindow()) {SelectWindow(theWindow); return;}
            if (TrackGoAway(theWindow, theEvent->where))
                HideWindow(theWindow);
            if(theWindow==controlWindow)     OnGoAwayControlWindow();
            if(theWindow==dataWindow)        OnGoAwayDataWindow();
            if(theWindow==displayWindow)     OnGoAwayDisplayWindow();
            if(theWindow==gameWindow)        OnGoAwayGameWindow();
            if(theWindow==plotWindow)        OnGoAwayPlotWindow();
            if(theWindow==barGraphWindow)    OnGoAwayBarGraphWindow();
        }
}
/* end HandleMouseDown */
#include "AllPrototypes.h"

void HandleKeyEvent(EventRecord *theEvent)
{
    if ((theEvent->modifiers & cmdKey) != 0)
    {
        AdjustMenus();
        HandleMenu(MenuKey((char) (theEvent->message & charCodeMask)));
        HiliteMenu(0);        /* Unhilights any hilighted menu */
    }
}
#include "ControlVariables.h"
#include "AllPrototypes.h"

/****
 * HandleEvent()
 *
 *      The main event dispatcher. This routine should be called
 *      repeatedly (it handles only one event).
 *
 *****/ void HandleEvent(void)

{
    int       ok;
    EventRecord theEvent;

/*  SystemTask ();       /* Handle desk accessories */
```

```
    ok = GetNextEvent (everyEvent, &theEvent);
    if (ok || (theEvent.what==nullEvent))
      switch (theEvent.what)
        {
        case nullEvent: /* This is where I do most of my stuff! */
            HandleNullEvent();
            break;

case mouseDown:
            HandleMouseDown(&theEvent);
            break;

case keyDown:
        case autoKey:
            HandleKeyEvent(&theEvent);
            break;
        case updateEvt:
            UpdateWindow(&theEvent);
            break;

case activateEvt:
            ActivateWindow(&theEvent);
            break;
        }
}
/* end HandleEvent */
#include "AllPrototypes.h"
#include "WindowVariables.h"

void ActivateWindow(EventRecord *theEvent)
{
    int i=theEvent->modifiers & activeFlag;
    if(theEvent->message==(long)controlWindow)   ActivateControlWindow(i);
    if(theEvent->message==(long)dataWindow)      ActivateDataWindow(i);
    if(theEvent->message==(long)displayWindow)   ActivateDisplayWindow(i);
    if(theEvent->message==(long)gameWindow)      ActivateGameWindow(i);
    if(theEvent->message==(long)plotWindow)      ActivatePlotWindow(i);
    if(theEvent->message==(long)barGraphWindow)  ActivateBarGraphWindow(i);
}
/*
 *
 *
 *          General Purpose Window Routines
 *
 *
 *
 */
#include <stdio.h>
include "AllPrototypes.h"
#include "WindowVariables.h"
#include "DataVariables.h"

/*
 *
 *
 *      To define a rectangle in Local coordinates that can be used to erase
 *      the whole window.  The source *boundsRect should be the bounds rectangle for
 *      the window.
 *
 *
 */ void    DefineEraseRect(Rect *boundsRect, Rect *eraseRect)
{
    eraseRect->top=0;      /*  NOTE: The "->" dereferences the address to the Rect */
```

```
        eraseRect->left=0;     /*  So: erase->left is the sames as (*eraseRect).left */
        eraseRect->bottom    =   boundsRect->bottom   -   boundsRect->top;
        eraseRect->right     =   boundsRect->right    -   boundsRect->left;
}

/********
*
* MousePos()
*
* Set the mouse position
*
* August 22, 1989
* by Robert S. T. Gibson
* for MacTutor
*
********/
void MousePos(Point newPos)
{ int     *MTemp;
    char    *CrsrNew;
    int     i;

MTemp = (int *)  0x828; /* Set up our globals... */
    CrsrNew = (char *) 0x8CE;

/* Points are stored as (row, column) or (v, h) in memory... */
    /* Set our globals... */
    for (i=0;i<3;i++) {
        *(MTemp+2*i)   = newPos.v;
        *(MTemp+2*i+1) = newPos.h;
    }

*CrsrNew = -1;   /* There's a new position */
}

/********
*
* IncrementMousePos()
*
* Increment the mouse position.  Adapted from MousePos, above.
*
********/ void IncrementMousePos(Point newPos)
{ int     *MTemp;
    char    *CrsrNew;
    int     i;

MTemp = (int *)  0x828; /* Set up our globals... */
    CrsrNew = (char *) 0x8CE;
    /* Points are stored as (row, column) or (v, h) in memory... */
    /* Set our globals... */
    for (i=0;i<3;i++) {
        *(MTemp+2*i)   += newPos.v;
        *(MTemp+2*i+1) += newPos.h;
```

```
        *CrsrNew = -1;   /* There's a new position */
}

/*****
 *
 * DoModalError()
 *
 * Writes junk in the Data window
 *
 *****/
static long errorCount=0;
void DoModalError(int bad)
{
    char forOutput[200];
    int i,j,index,line=8;/*use "line" for line spacing */
    Point penPoint;
    GrafPtr savePort;

GetPort(&savePort);
    ShowWindow(dataWindow);
    SetPort(dataWindow);
    EraseRect(&dataErase);
    TextFont(22);
    TextFace(0);
    TextSize(9);
    MoveTo(0,10);/* First move is an absolute "MoveTo" in local coordinates.
                    All subsequent moves are relative "Move"s.    */
    errorCount+=1;
    sprintf(forOutput," Error Count= %8ld",errorCount);
    DrawString(CtoPstr(forOutput));
        GetPen(&penPoint); MoveTo(0,penPoint.v); Move(0,line); /* <RETURN><NEWLINE> */
        sprintf(forOutput,"Error Code Passed:  %6d",bad);
        DrawString(CtoPstr(forOutput));
    GetPen(&penPoint); MoveTo(0,penPoint.v); Move(0,line); /* <RETURN><NEWLINE> */
    GetPen(&penPoint); MoveTo(0,penPoint.v); Move(0,line); /* <RETURN><NEWLINE> */
    if(bad==1)
    {
        DrawString("\pThere has been an error: a Bad Sweep.");
        GetPen(&penPoint); MoveTo(0,penPoint.v); Move(0,line); /* <RETURN><NEWLINE> */
        if(sweepStatus==2) DrawString("\p There has been an OverRun error");
        if(sweepStatus==3) DrawString("\p There has been an OverFlow error");
        if(sweepStatus==4) DrawString("\p There has been an weirdCount error!");
        if(sweepStatus==1) DrawString("\p sweepStatus=1; okay for now ");
        if(sweepStatus==0) DrawString("\p sweepStatus=0; okay!");
        if(sweepStatus<0 || sweepStatus>4) DrawString("\p OOPS!!");
        GetPen(&penPoint); MoveTo(0,penPoint.v); Move(0,line); /* <RETURN><NEWLINE> */
        sprintf(forOutput,"sweepStatus=%6d   sensorCellCount=%6d",sweepStatus,sensorCellCount);
        DrawString(CtoPstr(forOutput));
        GetPen(&penPoint); MoveTo(0,penPoint.v); Move(0,line); /* <RETURN><NEWLINE> */
        sprintf(forOutput,"sweepCount=%8ld",sweepCount);
        DrawString(CtoPstr(forOutput));
        GetPen(&penPoint); MoveTo(0,penPoint.v); Move(0,line); /* <RETURN><NEWLINE> */
        sprintf(forOutput,"mass, (cmX,cmY):    %8ld    (%ld,%ld)",mass,centerOfMassH,centerOfMass
        DrawString(CtoPstr(forOutput));
    }
    if(bad!=1)
```

```c
        {
            DrawString("\p Sigma is out of range!");
        }

SetPort(savePort);
}                                   /**** end of DoModalError Cheating ****/
/*
 *
 *
 *      General Routines
 *
 *
 */
#include "GeneralPrototypes.h"

void Toggle(int *oneOrZero)
{
    *oneOrZero=1-*oneOrZero;
} int Parity(int n) /* return 0 if N is even, 1 if N is odd */
{
    return (n&1);
} int IntPower(int base, int exp) /* returns 1 for base^0, even if base==0 */
{
    int i,p=1;
    for(i=1;i<=exp;i++) p=p*base;
    return p;
}
/*  A first attempt at some decent programming These will be routines to plot 2-D data.

The data will be assumed to be integer [-32768,+32767], in arrays x and y of size [n]

Routines:   Find min and max of range
                Label axes
                Put tick marks on axis
                Label tick marks on axis
                Plot the data without symbols Create the plotting window: with go-away box

*/
#include <stdio.h>
#include "PlottingPrototypes.h"

int minX,minY,maxX,maxY,rangeX,offsetX,rangeY,offsetY;
int axisLengthX,axisLengthY;
Rect gridRect,plotRect;/* These are in local coordinates */ void SetUpPlotRects(Rect *plotRectPassed,  Rect *gridRectPassed)
{
    gridRect.top=gridRectPassed->top;
    gridRect.bottom=gridRectPassed->bottom;
    gridRect.left=gridRectPassed->left;
    gridRect.right=gridRectPassed->right;
```

```c
        plotRect.top=plotRectPassed->top;
        plotRect.bottom=plotRectPassed->bottom;
        plotRect.left=plotRectPassed->left;
        plotRect.right=plotRectPassed->right;
        axisLengthX=gridRect.right-gridRect.left;
        axisLengthY=gridRect.bottom-gridRect.top;
}
void DrawGridOutline(void)
{
    PenState pnState; Rect temRect;
    GetPenState(&pnState);
    PenPat(gray);
    temRect=gridRect;
    InsetRect(&temRect,-1,-1);
    FrameRect(&temRect);
    SetPenState(&pnState);
} void FindMinMaxOfArray(int *min, int *max, int n, int x[])
{
    int i;

*min=x[0];
    *max=x[0];
    if(n<2) return;
    for(i=1;i<n;i++)
    {
        if(x[i]<*min) *min=x[i];
        if(x[i]>*max) *max=x[i];
    }
    return;
} void FindRangeAndOffset(int *range, int *offset, int min, int max)
{
    *range=max-min;
    *offset=min;
} void LabelAxes(char *labelX, char *labelY)
{
        TextFont(22);
        TextFace(0);
        TextSize(9);
        MoveTo((gridRect.left+gridRect.right)/2,(gridRect.bottom+plotRect.bottom)/2);
        DrawString(labelX);
        MoveTo(gridRect.left-(4+StringWidth(labelY)),(gridRect.bottom+gridRect.top)/2);
        DrawString(labelY);
} void LabelEndPoints(int minXPassed, int maxXPassed, int minYPassed, int maxYPassed)
{
    char forOutput[20]; /* This is room for 19 characters + the terminating zero in C */
    FontInfo fontInfo; int textHigh;
    TextFont(22);TextFace(0);TextSize(9);
    GetFontInfo(&fontInfo);
    textHigh=fontInfo.ascent+fontInfo.descent+fontInfo.leading;
    sprintf(forOutput,"%4hd",minXPassed);
    MoveTo(gridRect.left,gridRect.bottom+textHigh);
```

```
    DrawString(CtoPstr(forOutput));
    sprintf(forOutput,"%4hd",maxXPassed);
    MoveTo(gridRect.right-StringWidth(CtoPstr(forOutput)),gridRect.bottom+textHigh);
    DrawString(forOutput);
    sprintf(forOutput,"%4hd",minYPassed);
    MoveTo(gridRect.left-(4+StringWidth(CtoPstr(forOutput))),gridRect.bottom);
    DrawString(forOutput);
    sprintf(forOutput,"%4hd",maxYPassed);
    MoveTo(gridRect.left-(4+StringWidth(CtoPstr(forOutput))),gridRect.top+textHigh);
    DrawString(forOutput);
} void PlotLineAuto(int npts, int x[], int y[])
{   int i;
    FindMinMaxOfArray(&minX,&maxX,npts,x);
    FindRangeAndOffset(&rangeX,&offsetX,minX,maxX);
    FindMinMaxOfArray(&minY,&maxY,npts,y);
    FindRangeAndOffset(&rangeY,&offsetY,minY,maxY);
/*  PlotIt(npts,x,y); */
    PlotItBar(npts,x,y);
} void PlotLineAutoAndLabel(int npts, int x[], int y[])
{   int i;
    FindMinMaxOfArray(&minX,&maxX,npts,x);
    FindRangeAndOffset(&rangeX,&offsetX,minX,maxX);
    FindMinMaxOfArray(&minY,&maxY,npts,y);
    FindRangeAndOffset(&rangeY,&offsetY,minY,maxY);
    LabelEndPoints(minX,maxX,minY,maxY);
/*  PlotIt(npts,x,y); */
    PlotItBar(npts,x,y);
} void PlotLineRanged(int npts, int x[], int y[], int minXpassed, int maxXpassed, int minYpassed,
    int maxYpassed)
{
    minX=minXpassed; maxX=maxXpassed; FindRangeAndOffset(&rangeX,&offsetX,minX,maxX);
    minY=minYpassed; maxY=maxYpassed; FindRangeAndOffset(&rangeY,&offsetY,minY,maxY);
    PlotIt(npts,x,y);
} void PlotIt(int npts, int x[], int y[])
{
    int i;                      /* Need this routine to handle special cases. */
    if(rangeY>0)
    {
        if(rangeX>0)
        {
            MoveTo(gridRect.left+((x[0]-offsetX)*axisLengthX)/rangeX,
                gridRect.bottom-((y[0]-offsetY)*axisLengthY)/rangeY);

for (i=0;i<npts;i++)
            {
                LineTo(gridRect.left + (int) ( ( ( (long)(x[i]-offsetX))   *  (long)
                    axisLengthX) / (long)rangeX), gridRect.bottom-(int)
            }
        }
        else /* Special case of zero length range in X */
        {
            MoveTo((gridRect.left+gridRect.right)/2,gridRect.bottom-((y[0]-offsetY)*
                axisLengthY)/rangeY);
```

```c
    for (i=0;i<npts;i++)
    {
        LineTo((gridRect.left+gridRect.right)/2, gridRect.bottom-(int)
            ( ( ( (long)(y[i]-offsetY))  *  (long) axisLengthY) / (lc
                )
            )
        }
    }
    else /* Special Case of zero length range in Y */
    {
        if(rangeX>0)
        {
            MoveTo(gridRect.left+((x[0]-offsetX)*axisLengthX)/rangeX,(gridRect.bottom+gridRect.top)
            for (i=0;i<npts;i++)
            {
                LineTo(gridRect.left + (int) ( ( ( (long)(x[i]-offsetX))  *  (long) axisLengthX)
                    (long)rangeX),(gridRect.bottom+gridRe
            }
        }
        else /* Special case of zero length range in X and Y */
        {
            MoveTo((gridRect.left+gridRect.right)/2,(gridRect.bottom+gridRect.top)/2);
            for (i=0;i<npts;i++)
            {
                LineTo((gridRect.left+gridRect.right)/2,(gridRect.bottom+gridRect.top)/2);
            }
        }
    }
}                   /* End of PlotIt */
void PlotItBar(int npts, int x[], int y[])
{
    int i,x1,x2,y1,y2;
                    /* Need this routine to handle special cases. */
    if(rangeY>0){
        if(rangeX>0)
        {
            for (i=0;i<npts-1;i++)
            {
                x1=gridRect.left+(int)((((long)(x[i]-offsetX))*(long) axisLengthX)/(long)rangeX);
                x2=gridRect.left+(int)((((long)(x[i+1]-offsetX))*(long) axisLengthX)/(long)rangeX);
                y1=gridRect.bottom-(int)((((long)(y[i]-offsetY))*(long) axisLengthY)/(long)rangeY);
                MoveTo(x1,y1);
                LineTo(x2,y1);
            }
            x1=gridRect.left+(int)((((long)(x[npts-2]-offsetX))*(long) axisLengthX)/(long)rangeX);
            x2=gridRect.left+(int)((((long)(x[npts-1]-offsetX))*(long) axisLengthX)/(long)rangeX);
            y1=gridRect.bottom-(int)((((long)(y[npts-1]-offsetY))*(long) axisLengthY)/(long)rangeY);
            MoveTo(x1,y1);
            LineTo(x2,y1);
        }
        {
            MoveTo((gridRect.left+gridRect.right)/2,gridRect.bottom-((y[0]-offsetY)*
                axisLengthY)/rangeY);
            for (i=0;i<npts;i++)
            {
                LineTo((gridRect.left+gridRect.right)/2, gridRect.bottom-(int)
                    ( ( ( (long)(y[i]-offsetY))  *  (long) axisLengthY) / (lc
                }
            }
        }
    }
    else /* Special Case of zero length range in Y */
```

```c
        {
            if(rangeX>0)
            {
                MoveTo(gridRect.left+((x[0]-offsetX)*axisLengthX)/rangeX,
                    (gridRect.bottom+gridRect.top)/2);
                for (i=0;i<npts;i++)
                {
                    LineTo(gridRect.left + (int) ( ( ( (long)(x[i]-offsetX)) *
                        (long) axisLengthX) / (long)rangeX),(gridRect.bottom+gridRe
                }
            }
            else /* Special case of zero length range in X and Y */
            {
                MoveTo((gridRect.left+gridRect.right)/2,(gridRect.bottom+gridRect.top)/2);
                for (i=0;i<npts;i++)
                {
                    LineTo((gridRect.left+gridRect.right)/2,(gridRect.bottom+gridRect.top)/2);
                }
            }
        }
    }
}                       /* End of PlotIt */
#include <stdio.h>
include "AllPrototypes.h"
include "ControlVariables.h"
#include "DataVariables.h"

WindowPtr   displayWindow;
Rect        displayWindowBounds;/* These are in global coordinates */
Rect        displayErase;/* These are in window-local coordinates */
Rect        for8Display, for16Display;
/****
 *
 *      The "smallpic" constructions are for the symbols to be used
 *      to indicate state and value of the individual sensors.
 *
 *      smallpic [0] is for negative values (which may not be displayed)
 *      smallpic [1-10] are for the positive intensities: 1=zero, 10=max
 *      smallpic [11] is for non-existent cells. (light grey)
 *      smallpic [12] is for inoperative cells. (dark grey)
 *
 ****/
QDByte smallpic[13][16];
QDPtr  smallpicPtr;
int smallpicRowBytes=2;
Rect smallpicRect={0,0,105,9};  /*NOTE: only the first byte of each word
                                    is used. This is because RowBytes
                                    must be an even number.
                                */
BitMap  smallpicBM;

QDByte      display8 [( 8*MAX_SENSOR_SIZE)*( 8*MAX_SENSOR_SIZE)/8];
QDPtr       display8Ptr;
int         display8RowBytes=( 8*MAX_SENSOR_SIZE)/8;
Rect        display8Rect={0,0,8*MAX_SENSOR_SIZE,8*MAX_SENSOR_SIZE};
BitMap      display8BM;

QDByte      display16[(16*MAX_SENSOR_SIZE)*(16*MAX_SENSOR_SIZE)/8];
```

```
QDPtr       display16Ptr;
int         display16RowBytes=(16*MAX_SENSOR_SIZE)/8;
Rect        display16Rect={0,0,16*MAX_SENSOR_SIZE,16*MAX_SENSOR_SIZE};
BitMap      display16BM;

void InitializeDisplayWindow(void)
{
    char drawAtFirst = true;
/* Create a "display" window in the upper left */
    displayWindowBounds.top     =   screenBits.bounds.top+40;
    displayWindowBounds.left    =   screenBits.bounds.right-234;
    displayWindowBounds.bottom  =   screenBits.bounds.top+180;
    displayWindowBounds.right   =   screenBits.bounds.right-4;
    DefineEraseRect(&displayWindowBounds,&displayErase);
    displayWindow = NewWindow(0L, &displayWindowBounds, "\pDisplay Window", drawAtFirst,
        noGrowDocProc, -1L, true, 0);
    InitDisplayArray();
} void MouseDownInDisplayWindow(Point globalWhere)
{
} void OnGoAwayDisplayWindow(void)
{
    HideWindow(displayWindow);
} void ActivateDisplayWindow(int active) /* !active means deactivate */
{
} void UpdateDisplayWindow(void)
{
    int i,j;
    GrafPtr savePort;

GetPort(&savePort);
    SetPort(displayWindow);
    SetRect(&for8Display,10,10,10+8*MAX_SENSOR_SIZE,10+8*MAX_SENSOR_SIZE);
    SetRect(&for16Display,for8Display.right+10,10,for8Display.right+10+16*
        MAX_SENSOR_SIZE,10+16*MAX_SENSOR_SIZE);
    /*  EraseRect(&displayErase);*/
    DrawControls(displayWindow);/* Aren't any, yet */

GreyUnusedDisplayCells();
    CopyBits(&display8BM,&((*displayWindow).portBits),&display8Rect,&for8Display,srcCopy,0);
    CopyBits(&display16BM,&((*displayWindow).portBits),&display16Rect,&for16Display,srcCopy,0);
    TextFont(22);
    TextFace(0);
    TextSize(9);
    MoveTo(0,80);/* First move is an absolute "MoveTo" in local coordinates.
                    All subsequent moves are relative "Move"s.       */

DrawString("\p mass    (CMX,CMY)");
    SetPort(savePort);
} void UseDisplayWindow(int code)
{
```

```c
    int i,j;
    char forOutput[200]; /* This is room for 199 characters + the terminating zero in C */
    int line=8;/*use "line" for line spacing */
    Point penPoint;
    Rect src8Rect, src16Rect, dst8Display, dst16Display;
    Rect massRect;
    GrafPtr savePort;

GetPort(&savePort);
    SetPort(displayWindow);
    if(showDisplay8)
    {
        SetRect(&dst8Display,10,10,10+8*sizeOfSensorArray,10+8*sizeOfSensorArray);
        SetRect(&src8Rect,0,0,8*sizeOfSensorArray,8*sizeOfSensorArray);
        CopyBits(&display8BM,&((*displayWindow).portBits),&src8Rect,&dst8Display,srcCopy,0);
    }
    if(showDisplay16)
    {
        SetRect(&dst16Display,for8Display.right+10,10,for8Display.right+10+16*sizeOfSensorArray,
            10+16*sizeOfSensorArray);
        SetRect(&src16Rect,0,0,16*sizeOfSensorArray,16*sizeOfSensorArray);
        CopyBits(&display16BM,&((*displayWindow).portBits),&src16Rect,&dst16Display,srcCopy,0);
    }
    if(showDisplay16 || showDisplay8)
    {
        SetRect(&massRect,0,80,80,90);
        EraseRect(&massRect);
        TextFont(22);
        TextFace(0);
        TextSize(9);
        MoveTo(0,90);/* First move is an absolute "MoveTo" in local coordinates.
                All subsequent moves are relative "Move"s.     */
        sprintf(&forOutput[0],"%4ld (%4ld,%4ld)",mass,centerOfMassH,centerOfMassV);
        /* Note: The above is an unsafe choice of format when mass get big */
        DrawString(CtoPstr(forOutput));

}
    SetPort(savePort);
}
                            /**** end of UseDisplayWindow ****/
/****
 * InitDisplayArray()
 *
 * Will set up the off screen bit maps, and the symbol bit maps here.
 *
 ****/
void InitDisplayArray(void)
{
    int i;
    smallpicPtr         =   &smallpic[0][0];
    smallpicBM.baseAddr =   smallpicPtr;
    smallpicBM.rowBytes =   smallpicRowBytes;
    smallpicBM.bounds   =   smallpicRect;
    StuffHex(&smallpic[0][0],"\p000000003c00240024003c0000000000");
    StuffHex(&smallpic[1][0],"\p00000000000000000000000000000000");
    StuffHex(&smallpic[2][0],"\p00000000000008000000000000000000");
    StuffHex(&smallpic[3][0],"\p00000000000018001800000000000000");
    StuffHex(&smallpic[4][0],"\p00000000240018001800240000000000");
    StuffHex(&smallpic[5][0],"\p00004200240018001800240042000000");
    StuffHex(&smallpic[6][0],"\p000042003c003c003c003c0042000000");
```

```
    StuffHex(&smallpic[7] [0],"\p81005a003c007e007e003c005a008100");
    StuffHex(&smallpic[8] [0],"\p99005a003c00ff00ff003c005a009900");
    StuffHex(&smallpic[9] [0],"\p99007e007e00ff00ff007e007e009900");
    StuffHex(&smallpic[10][0],"\pff00ff00ff00ff00ff00ff00ff00ff00");
    StuffHex(&smallpic[11][0],"\paa00000055000000aa00000055000000");
    StuffHex(&smallpic[12][0],"\paa005500aa005500aa005500aa005500");

display8Ptr         =   &display8[0];
    display8BM.baseAddr =   display8Ptr;
    display8BM.rowBytes =   display8RowBytes;
    display8BM.bounds   =   display8Rect;

display16Ptr         =   &display16[0];
    display16BM.baseAddr =   display16Ptr;
    display16BM.rowBytes =   display16RowBytes;
    display16BM.bounds   =   display16Rect;
}
/* end InitDisplayArray */ void SetSmallpicRect ( Rect *adrRect, int code)
{
    SetRect(adrRect,0,8*code,8,8*(code+1));
}                                       /* end of SetSmallpicRect */ void SetTargetRect ( Rect *adrRect, int i, int j, int size)
{
    SetRect(adrRect,i*size,j*size,(i+1)*size,(j+1)*size);
}                                       /* end of SetTargetRect */ void GreyUnusedDisplayCells (void)
{
    int i,j;
    Rect sRect, dRect;
    SetSmallpicRect(&sRect,11); /* 11 is code for light gray: unused */ for (i=0;i<MAX_SENSOR_SIZE;i++)
    {
        for (j=0;j<MAX_SENSOR_SIZE;j++)
        {
            if( (i<sizeOfSensorArray) && (j<sizeOfSensorArray) ); /*NOTE: No "break"!! */
            else
            {
                SetTargetRect(&dRect,i,j,8);
                CopyBits(&smallpicBM,&display8BM, &sRect,&dRect,srcCopy,0);
                SetTargetRect(&dRect,i,j,16);
                CopyBits(&smallpicBM,&display16BM,&sRect,&dRect,srcCopy,0);
            }
        }
    }
}                                       /* end of GreyUnusedDisplayCells */ void UpdateBitMap (void)
{
    int i,j,index,code;
    Rect sRect, dRect;
```

```
    SetSmallpicRect(&sRect,11); /* 11 is code for light gray: unused */ for (i=0;i<sizeOfSensorArray;i++)
    {
        for (j=0;j<sizeOfSensorArray;j++)
        {
            index=i*sizeOfSensorArray+j;
            code=(10*scaleData[index])/scaleValue;
            if(code>10) code=10;
            if(code<1) code=1;
            if(validSensor[index]*validSensorOverride[index]) SetSmallpicRect(&sRect,code);
            else SetSmallpicRect(&sRect,12); /* 12 is code for dead cell */
            if(showDisplay8)
            {
                SetTargetRect(&dRect,i,j,8);
                CopyBits(&smallpicBM,&display8BM, &sRect,&dRect,srcCopy,0);
            }
            if(showDisplay16)
            {
                SetTargetRect(&dRect,i,j,16);
                CopyBits(&smallpicBM,&display16BM,&sRect,&dRect,srcCopy,0);
            }
        }
    }
}                       /* end of UpdateBitMap */
/*****
 *
 *      Program   "Demo"   to be both useful for demonstrating
 *                RIS-31 / Jabberwocky
 *                   AND
 *      to serve as a general Macintosh Application Template for me.
 *
 *****/ include "AllPrototypes.h"

main()
{
/*  if(!SystemCheck())
    {
        {int i; for(i=0;i<10;i++) SysBeep((int)1);}
        ExitToShell();
    }*/
    InitializeApplication();
    OnGoAwayBarGraphWindow();
    OnGoAwayPlotWindow();
    for (;;)  HandleEvent(); /*Eternal "HandleEvent" loop */
}                                       /* end main */ int SystemCheck(void)
{
    int         error ;    /* type of error    */
    SysEnvRec   theWorld ; /*the system environment record pointer */ error = SysEnvirons(2,&theWorld) ;
    if(error)
    {
        {int i; for(i=0;i<3;i++) SysBeep((int)1);}
```

```
        ExitToShell();
    }
    if (theWorld.machineType==envMacII) return 1;
    if (theWorld.machineType==envMacIIx) return 1;
/*
*/
    if (theWorld.machineType==9) return 1;
/*  if (theWorld.machineType==envMacIIci) return 1;
    if (theWorld.machineType==envMacIIfx) return 1;     */
        {int i; for(i=0;i<5;i++) SysBeep((int)1);}
        ExitToShell();
}
#include <stdio.h>
include "AllPrototypes.h"
include "ControlVariables.h"
#include "DataVariables.h"

WindowPtr   dataWindow;
Rect        dataWindowBounds;/* These are in global coordinates */
Rect        dataErase;/* These are in window-local coordinates */ void InitializeDataWindow(void)
{
    char drawAtFirst = true;
/* Create a "data" window in the upper middle */
    dataWindowBounds.top    =   screenBits.bounds.top+40;
    dataWindowBounds.left   =   screenBits.bounds.left+160;
    dataWindowBounds.bottom =   screenBits.bounds.top+400;
    dataWindowBounds.right  =   dataWindowBounds.left+300;
    DefineEraseRect(&dataWindowBounds,&dataErase);
    dataWindow = NewWindow(0L, &dataWindowBounds, "\pData Window", drawAtFirst,
        documentProc, -1L, true, 0);
} void MouseDownInDataWindow(Point globalWhere)
{
} void OnGoAwayDataWindow(void)
{
    HideWindow(dataWindow);
} void ActivateDataWindow(int active) /* !active means deactivate */
{
    DrawGrowIcon(dataWindow);
} void UpdateDataWindow(void)
{
    GrafPtr savePort;
    GetPort(&savePort);
    SetPort(dataWindow);
    EraseRect(&dataWindow->portRect);
    DrawGrowIcon(dataWindow);
    SetPort(savePort);
    UseDataWindow(dataWindowCode);
}                                   /** end of IntializeDisplayWindow **/ void UseDataWindow(int code)
```

```c
{
    char forOutput[200]; /* This is room for 199 characters + the terminating zero in C */
    int i,j,index,line=8;/*use "line" for line spacing */
    Point penPoint;
    GrafPtr savePort;

dataWindowCode=code; /* Keep a record of the last call, for UpdateDataWindow */
    GetPort(&savePort);
    SetPort(dataWindow);
    EraseRect(&dataErase);

if(code==0)
    {
        TextFont(22);
        TextFace(0);
        TextSize(9);
        MoveTo(0,10);/* First move is an absolute "MoveTo" in local coordinates.
                       All subsequent moves are relative "Move"s.      */

DrawString("\p swpStatus snsrCllCnt swpCount    mass cntrOfMass");
        GetPen(&penPoint); MoveTo(0,penPoint.v); Move(0,line); /* <RETURN><NEWLINE> */
        sprintf(&forOutput[0]," %6d    %6d   %8ld    %8ld   (%ld,%ld)",
            sweepStatus,sensorCellCount,sweepCount,mass,centerOfMassH,centerOfMas
        DrawString(CtoPstr(forOutput));
        GetPen(&penPoint); MoveTo(0,penPoint.v); Move(0,line); /* <RETURN><NEWLINE> */

DrawString("\pSome of minData,raw,max,range,scale");

GetPen(&penPoint); MoveTo(0,penPoint.v); Move(0,line); /* <RETURN><NEWLINE> */
        for(j=0;j<sizeOfSensorArray;j++)
        {
            for(i=0;i<sizeOfSensorArray;i++)
    {
        index=sizeOfSensorArray*i+j;
        sprintf(&forOutput[i*6],"%6d",minData[index]);
    }
    GetPen(&penPoint); MoveTo(0,penPoint.v); Move(0,line); /* <RETURN><NEWLINE> */
    DrawString(CtoPstr(forOutput));
}
GetPen(&penPoint); MoveTo(0,penPoint.v); Move(0,line); /* <RETURN><NEWLINE> */
for(j=0;j<sizeOfSensorArray;j++)
{
    for(i=0;i<sizeOfSensorArray;i++)
    {
        index=sizeOfSensorArray*i+j;
        sprintf(&forOutput[i*6],"%6d",rawData[index]);
    }
    GetPen(&penPoint); MoveTo(0,penPoint.v); Move(0,line); /* <RETURN><NEWLINE> */
    DrawString(CtoPstr(forOutput));
}
GetPen(&penPoint); MoveTo(0,penPoint.v); Move(0,line); /* <RETURN><NEWLINE> */
for(j=0;j<sizeOfSensorArray;j++)
{
    for(i=0;i<sizeOfSensorArray;i++)
    {
        index=sizeOfSensorArray*i+j;
        sprintf(&forOutput[i*6],"%6d",maxData[index]);
    }
    GetPen(&penPoint); MoveTo(0,penPoint.v); Move(0,line); /* <RETURN><NEWLINE> */
    DrawString(CtoPstr(forOutput));
```

```
          }
          GetPen(&penPoint); MoveTo(0,penPoint.v); Move(0,line); /* <RETURN><NEWLINE> */
          for(j=0;j<sizeOfSensorArray;j++)
          {
              for(i=0;i<sizeOfSensorArray;i++)
              {
                  index=sizeOfSensorArray*i+j;
                  sprintf(&forOutput[i*6],"%6d",rangeData[index]);
              }
              GetPen(&penPoint); MoveTo(0,penPoint.v); Move(0,line); /* <RETURN><NEWLINE> */
              DrawString(CtoPstr(forOutput));
          }
          GetPen(&penPoint); MoveTo(0,penPoint.v); Move(0,line); /* <RETURN><NEWLINE> */
          for(j=0;j<sizeOfSensorArray;j++)
          {
              for(i=0;i<sizeOfSensorArray;i++)
              {
                  index=sizeOfSensorArray*i+j;
                  sprintf(&forOutput[i*6],"%6d",scaleData[index]);
              }
              GetPen(&penPoint); MoveTo(0,penPoint.v); Move(0,line); /* <RETURN><NEWLINE> */
              DrawString(CtoPstr(forOutput));
          }
      }/* end of "active == 1", i.e., good data: sweep was ok */
      if(code == 1)
      {
          MoveTo(0,10);/* First move is an absolute "MoveTo" in local coordinates.
                         All subsequent moves are relative "Move"s.      */

DrawString("\p sweepStatus.  THERE WAS A BAD SWEEP:");
          GetPen(&penPoint); MoveTo(0,penPoint.v); Move(0,line); /* <RETURN><NEWLINE> */
          GetPen(&penPoint); MoveTo(0,penPoint.v); Move(0,line); /* <RETURN><NEWLINE> */
          sprintf(&forOutput[0]," %6d",sweepStatus);
          DrawString(CtoPstr(forOutput));
          GetPen(&penPoint); MoveTo(0,penPoint.v); Move(0,line); /* <RETURN><NEWLINE> */
          GetPen(&penPoint); MoveTo(0,penPoint.v); Move(0,line); /* <RETURN><NEWLINE> */
          GetPen(&penPoint); MoveTo(0,penPoint.v); Move(0,line); /* <RETURN><NEWLINE> */
          if( sweepStatus == 0) DrawString("\pSweep was good, so we shouldn't be here!!");
          if( sweepStatus == 1) DrawString("\pWe shouldn't be here!!");
          if( sweepStatus == 2) DrawString("\pOverrun Error (too FAST data)");
          if( sweepStatus == 3) DrawString("\pOverflow Error (too MUCH data)");
          if( sweepStatus == 4) DrawString("\pImpossible!  We shouldn't be here!!");
      }
      SetPort(savePort);
}
#include <stdio.h>
include "AllPrototypes.h"
#include "PlottingPrototypes.h"
#include "ControlVariables.h"
#include "DataVariables.h"

WindowPtr   barGraphWindow;
Rect        barGraphWindowBounds;/* These are in global coordinates */
Rect        barGraphErase;/* These are in window-local coordinates */ char labelBarX[]="\pThe Last 10 Values";

Rect plotBarRect1, gridBarRect1; char labelBarY1[]="\pMass";
Rect plotBarRect2, gridBarRect2; char labelBarY2[]="\pHorizontal CM";
Rect plotBarRect3, gridBarRect3; char labelBarY3[]="\pVertical CM";
```

```
int nPlotsDown=6,nPlotsAcross=6;
int barWidth=MAX_BARS,barHeight=100;
int barPlotSeparation=4;

void InitializeBarGraphWindow(void)
{
    char drawAtFirst = true, goAway=true;

/* Create a "bar graph" window in the upper middle */ barGraphWindowBounds.top      =   screenBits.bounds.top+40;
    barGraphWindowBounds.left     =   screenBits.bounds.left;
    barGraphWindowBounds.bottom   =   barGraphWindowBounds.top+barPlotSeparation+nPlotsDown*
        (barHeight+4+barPlotSeparation);
    barGraphWindowBounds.right    =   barGraphWindowBounds.left+barPlotSeparation+nPlotsAcross*
        (barWidth+4+barPlotSeparation);
    DefineEraseRect(&barGraphWindowBounds,&barGraphErase);
    barGraphWindow = NewWindow(0L, &barGraphWindowBounds, "\pBarGraph Window", drawAtFirst,
        noGrowDocProc, -1L, goAway, 0);
/* Initialize Arrays */

{int j; for(j=0;j<MAX_BARS;j++) {xBar[j]=j; {int i; for (i=0;i<MAX_BAR_PLOTS;i++) yBar[i][j]=0;}}
} void MouseDownInBarGraphWindow(Point globalWhere)
{
} void OnGoAwayBarGraphWindow(void)
{
    HideWindow(barGraphWindow);
    showBarGraph=0;SetCtlValue(cntrlHndlArray[15],showBarGraph);
} void ActivateBarGraphWindow(int active) /* !active means deactivate */
{
    /********
            if(active) {showBarGraph=1;SetCtlValue(cntrlHndlArray[15],showBarGraph);}
            else {showBarGraph=0;SetCtlValue(cntrlHndlArray[15],showBarGraph);}
    ********/
} void UpdateBarGraphWindow(void)
{
    UseBarGraphWindow(1);
} void UseBarGraphWindow(int code)
{
    int i,j, ih,iv; Rect temRect;
    int hgo,vgo,h,v,m;/*hgo,vgo will be lower left of a given bar graph*/
    PenState pnState;
    GrafPtr savePort;

GetPenState(&pnState);
    GetPort(&savePort);
    SetPort(barGraphWindow);

if(code==1)/* Set up nPlotsDown X nPlotsAcross plotting rectangles. */
    {
        PenState pnState;
        GetPenState(&pnState);
        PenPat(gray);
        for(ih=0;ih<nPlotsAcross;ih++)
```

```
            {
                for(iv=0;iv<nPlotsDown;iv++)
                {
                    temRect.left=barPlotSeparation+ih*(barWidth+4+barPlotSeparation);
                    temRect.right=temRect.left+barWidth+4;
                    temRect.top=barPlotSeparation+iv*(barHeight+4+barPlotSeparation);
                    temRect.bottom=temRect.top+barHeight+4;
                    FrameRect(&temRect);
                }
            }
            SetPenState(&pnState);
}
if(!continuousBarPlotting && plotCountBar!=nptsBar-1) return;
for(iv=0;iv<nPlotsDown;iv++)
{
    for(ih=0;ih<nPlotsAcross;ih++)
    {
        hgo=barPlotSeparation+ih*(barWidth+4+barPlotSeparation)+2;
        hgo=hgo + barWidth/2 - nptsBar/2; /* to center it in plot */
        vgo=barPlotSeparation+iv*(barHeight+4+barPlotSeparation)+barHeight+1;
        if(iv<sizeOfSensorArray && ih<sizeOfSensorArray) /* if it is part of sensor array */
        {
            i=iv+ih*sizeOfSensorArray;
            if(GetCtlValue(plotHndlArray[i]))
            {
                for(j=0;j<nptsBar;j++)
                {
                    h=hgo+j;
                    m=(int)   (((long)yBar[i][j] * (long)barHeight)/(long)scaleValue);
                    MoveTo(h,vgo); /* Absolute (window) coordinates */
                    PenPat(black);
                    Line(0,-m);      /* Relative Coordinates */
                    PenPat(white);
                    Line(0,-(barHeight-m));/* Relative Coordinates */
                }
            }
        } /* end of plotting individual sensors */
        if(ih==5 && iv ==0) /* location of # 25, i.e., mass */
        {
            for(j=0;j<nptsBar;j++)
            {
                h=hgo+j;
                m=(int)   (((long)yBar[25][j] * (long)barHeight)/( (long)sizeOfSensorArray*
                    (long)sizeOfSensorArray* (long)scaleValue));
                MoveTo(h,vgo); /* Absolute (window) coordinates */
                PenPat(black);
                Line(0,-m);      /* Relative Coordinates */
                PenPat(white);
                Line(0,-(barHeight-m));/* Relative Coordinates */
            }
        }
        if(ih==5 && iv ==1) /* location of # 26, i.e., center of mass X */
        {
            for(j=0;j<nptsBar;j++)
            {
                h=hgo+j;
                m=(int)   (((long)yBar[26][j] * (long)barHeight)/(long)moveWidth);
                MoveTo(h,vgo); /* Absolute (window) coordinates */
                PenPat(black);
                Line(0,-m);      /* Relative Coordinates */
                PenPat(white);
                Line(0,-(barHeight-m));/* Relative Coordinates */
```

```
            }
        }
        if(ih==5 && iv ==2) /* location of # 27, i.e., center of Mass Y */
        {
            for(j=0;j<nptsBar;j++)
            {
                h=hgo+j;
                m=(int)   (((long)yBar[27][j] * (long)barHeight)/(long)moveHeight);
                MoveTo(h,vgo); /* Absolute (window) coordinates */
                PenPat(black);
                Line(0,-m);     /* Relative Coordinates */
                PenPat(white);
                Line(0,-(barHeight-m));/* Relative Coordinates */
            }
        }
        if(ih==5 && iv ==3) /*Scan of latest going across horizontally*/
        {
            hgo=barPlotSeparation+ih*(barWidth+4+barPlotSeparation)+2;
            hgo=hgo + barWidth/2 - (sizeOfSensorArray*sizeOfSensorArray)/2;
                /* to center it in plot */
    vgo=barPlotSeparation+iv*(barHeight+4+barPlotSeparation)+barHeight+1;
    {
        int iiv,iih;
        for(iiv=0;iiv<sizeOfSensorArray;iiv++)
        {
            for(iih=0;iih<sizeOfSensorArray;iih++)
            {
                j=iiv+iih*sizeOfSensorArray;
                h=hgo+j;
                m=(int)   (((long)yBar[j][nptsBar-1] * (long)barHeight)/(long)scaleValue);
                MoveTo(h,vgo); /* Absolute (window) coordinates */
                PenPat(black);
                Line(0,-m);     /* Relative Coordinates */
                PenPat(white);
                Line(0,-(barHeight-m));/* Relative Coordinates */
            }
        }
    }
}
if(ih==5 && iv ==4) /* Scan of Latest going across vertically */
{
    hgo=barPlotSeparation+ih*(barWidth+4+barPlotSeparation)+2;
    hgo=hgo + barWidth/2 - (sizeOfSensorArray*sizeOfSensorArray)/2; /* to center it in plot */
    vgo=barPlotSeparation+iv*(barHeight+4+barPlotSeparation)+barHeight+1;
    {
        int iiv,iih,index;
        for(iiv=0;iiv<sizeOfSensorArray;iiv++)
        {
            for(iih=0;iih<sizeOfSensorArray;iih++)
            {
                j=iih+iiv*sizeOfSensorArray;
                index=iiv+iih*sizeOfSensorArray;
                h=hgo+j;
                m=(int)   (((long)yBar[index][nptsBar-1] * (long)barHeight)/(long)scaleValue);
                MoveTo(h,vgo); /* Absolute (window) coordinates */
                PenPat(black);
                Line(0,-m);     /* Relative Coordinates */
                PenPat(white);
                Line(0,-(barHeight-m));/* Relative Coordinates */
```

```
            }
        }
    }
}
if(ih==5 && iv ==5 && nptsBar>1) /* Sum of  + 0 - changes at each sensor */
{
    int item, index, sigma, histoChange[MAX_SENSOR_SIZE*MAX_SENSOR_SIZE*2+1];
    for(index=0;index<sizeOfSensorArray*sizeOfSensorArray*2+1;index++) histoChange[index=0;
    for(i=0;i<nptsBar-1;i++) /* For each array in time (minus one) */
    {
        sigma=0;
        for(j=0;j<sizeOfSensorArray*sizeOfSensorArray;j++)/* For each sensor in the array
        {
            item=yBar[j][i+1]-yBar[j][i];
            if(item<0) sigma-=1;
            if(item>0) sigma+=1;
        }
        if(sizeOfSensorArray*sizeOfSensorArray+sigma < 0) DoModalError(sigma);
        if(sizeOfSensorArray*sizeOfSensorArray+sigma > MAX_SENSOR_SIZE*MAX_SENSOR_SIZE*2)
            DoModalError(sigma);
        histoChange[sizeOfSensorArray*sizeOfSensorArray+sigma]+=1;
    }
    hgo=barPlotSeparation+ih*(barWidth+4+barPlotSeparation)+2;
    hgo=hgo + barWidth/2 - (sizeOfSensorArray*sizeOfSensorArray); /* to center it in plot */
    vgo=barPlotSeparation+iv*(barHeight+4+barPlotSeparation)+barHeight+1;
    for(index=0;index<sizeOfSensorArray*sizeOfSensorArray*2+1;index++)
    {
        h=hgo+index;
        m=histoChange[index];
        MoveTo(h,vgo); /* Absolute (window) coordinates */
        if(index==0 || index==sizeOfSensorArray*sizeOfSensorArray || index==
            sizeOfSensorArray*sizeOfSensorArray*2.)
        {
            PenPat(black);
            Move(0, 2); /* down 2 pixels */
            Line(0, 3); /* Draw down three pixels */
            Move(0,-5); /* move back up 5 pixels to starting point */
        }
        PenPat(black);
        Line(0,-m);     /* Relative Coordinates */
        PenPat(white);
        Line(0,-(barHeight-m));/* Relative Coordinates */
    }
            }
        }
    }
    SetPenState(&pnState);
    SetPort(savePort);
} void BlankBarGraphs()
{
    int ih,iv; Rect temRect;
    GrafPtr savePort;

GetPort(&savePort);
    SetPort(barGraphWindow);

for(ih=0;ih<nPlotsAcross;ih++)
    {
        for(iv=0;iv<nPlotsDown;iv++)
```

```
        {
            temRect.left=barPlotSeparation+ih*(barWidth+4+barPlotSeparation);
            temRect.right=temRect.left+barWidth+4;
            temRect.top=barPlotSeparation+iv*(barHeight+4+barPlotSeparation);
            temRect.bottom=temRect.top+barHeight+4;
            InsetRect(&temRect,1,1);
            EraseRect(&temRect);
        }
    }
    SetPort(savePort);
}
#include <stdio.h>
include "AllPrototypes.h"
include "ControlVariables.h"
#include "DataVariables.h"
#include "GameVariables.h"
#include "WindowVariables.h"

int GetCol(int targetBoxCode)
{
    return targetBoxCode-(targetBoxCode/numberOfCols)*numberOfCols;
} int GetRow(int targetBoxCode)
{
    return targetBoxCode/numberOfCols;
} void    GetNewTargetBox(int *targetBoxCode) /* Loop prevents repeating a target */
{
    int currentBoxCode=*targetBoxCode;
    long longIndex;
    do
    {
        longIndex=(long)Random()+(long)32767;/* so in range 0-65534 */
        *targetBoxCode=(int) (longIndex/(((long)65536)/((long)(numberOfTargets))));
        if(*targetBoxCode>=numberOfTargets) *targetBoxCode=numberOfTargets-1;
    }
    while (currentBoxCode==*targetBoxCode);
} void    MarkTargetBox(int targetBoxCode)
{
    Rect temRect;
    if(targetBoxCode<0)return;
    temRect.top=5+15*GetRow(targetBoxCode)+1;
    temRect.bottom=temRect.top+3;
    temRect.left=5+15*GetCol(targetBoxCode)+1;
    temRect.right=temRect.left+3;
    InsetRect(&temRect,-3,-3);
    FrameRect(&temRect);
    InsetRect(&temRect,-1,-1);
    FrameRect(&temRect);
    InsetRect(&temRect,-1,-1);
    FrameRect(&temRect);
    AnnotateTargetChoice();
} void    UnMarkTargetBox(int targetBoxCode)
{
    Rect temRect;
```

```
    PenState pnState;
    if(targetBoxCode<0)return;
    GetPenState(&pnState);
    PenMode(patBic);
    temRect.top=5+15*GetRow(targetBoxCode)+1;
    temRect.bottom=temRect.top+3;
    temRect.left=5+15*GetCol(targetBoxCode)+1;
    temRect.right=temRect.left+3;
    InsetRect(&temRect,-3,-3);
    FrameRect(&temRect);
    InsetRect(&temRect,-1,-1);
    FrameRect(&temRect);
    InsetRect(&temRect,-1,-1);
    FrameRect(&temRect);
    SetPenState(&pnState);
} void    HiLightBox(int targetBoxCode)
{
    Rect temRect;
    if(targetBoxCode<0)return;
    temRect.top=15*GetRow(targetBoxCode)+4;
    temRect.bottom=temRect.top+7;
    temRect.left=15*GetCol(targetBoxCode)+4;
    temRect.right=temRect.left+7;
    FrameRect(&temRect);
    InsetRect(&temRect,1,1);
    if(targetSize!=5) FrameRect(&temRect);
    InsetRect(&temRect,1,1);
    if(targetSize!=3) FrameRect(&temRect);
    InsetRect(&temRect,1,1);
    if(targetSize!=1) FrameRect(&temRect);
} void    UnHiLightBox(int targetBoxCode)
{
    Rect temRect;
    PenState pnState;
    if(targetBoxCode<0)return;
    GetPenState(&pnState);
    PenMode(patBic);
    temRect.top=15*GetRow(targetBoxCode)+4;
    temRect.bottom=temRect.top+7;
    temRect.left=15*GetCol(targetBoxCode)+4;
    temRect.right=temRect.left+7;
    FrameRect(&temRect);
    InsetRect(&temRect,1,1);
    if(targetSize!=5) FrameRect(&temRect);
    InsetRect(&temRect,1,1);
    if(targetSize!=3) FrameRect(&temRect);
    InsetRect(&temRect,1,1);
    if(targetSize!=1) FrameRect(&temRect);
    SetPenState(&pnState);
} void    GetBoxCode(int *firstBoxCode) /* Get Box Code from mouse Location */
{
    Point temPoint;
    int temH,temV;
    GetMouse(&temPoint);/*local coordinates of active window (i.e.,gameWindow)*/
    *firstBoxCode=-1; /*assume not valid location*/
    temH= temPoint.h - (temPoint.h/15)*15; /* Get horizontal location, mod 15 */
    if(targetSize==5) if(temH<5 || temH>10) return; /* Not in a box */
```

```
    if(targetSize==3) if(temH<6 || temH>9) return; /* Not in a box */
    if(targetSize==1) if(temH<7 || temH>8) return; /* Not in a box */
    temV= temPoint.v - (temPoint.v/15)*15; /* Get vertical location mod 15 */
    if(targetSize==5) if(temV<5 || temV>10) return; /* Not in a box */
    if(targetSize==3) if(temV<6 || temV>9) return; /* Not in a box */
    if(targetSize==1) if(temV<7 || temV>8) return; /* Not in a box */
    *firstBoxCode=   numberOfCols*(temPoint.v/15) + temPoint.h/15;
} void AnnotateTargetChoice(void)
{
    char forOutput[200]; /* This is room for 199 characters + the terminating zero in C */
    int line=8;/*use "line" for line spacing */
    Point penPoint;
    Rect massRect;
    GrafPtr savePort;

GetPort(&savePort);
    SetPort(displayWindow);

SetRect(&massRect,0,100,90,120);
    EraseRect(&massRect);
    TextFont(22);
    TextFace(0);
    TextSize(9);
    MoveTo(0,110);/* First move is an absolute "MoveTo" in local coordinates.
                   All subsequent moves are relative "Move"s.    */
    sprintf(&forOutput[0],"%5hd %5hd %5hd",targetBoxCode,GetCol(targetBoxCode),GetRow(targetBoxCode));
    DrawString(CtoPstr(forOutput));
    SetPort(savePort);
}                        /**** end of Annotate ****/
#include <stdio.h>
include "AllPrototypes.h"
include "ControlVariables.h"
#include "DataVariables.h"
#include "WindowVariables.h"

WindowPtr   controlWindow;
Rect        controlWindowBounds;/* These are in global coordinates */
Rect        controlErase;/* These are in window-local coordinates */ void InitializeControlWindow(void)
{
    char drawAtFirst = false;
    int i,item;
    Rect temRect;

Create a "control" window in the middle */
    controlWindowBounds.top     =  screenBits.bounds.bottom-(4+200);
    controlWindowBounds.left    =  screenBits.bounds.left+4;
    controlWindowBounds.bottom  =  screenBits.bounds.bottom-4;
    controlWindowBounds.right   =  screenBits.bounds.right-4;
    /* controlWindowBounds.right -= (controlWindowBounds.right-controlWindowBounds.left)/3;*/
    DefineEraseRect(&controlWindowBounds,&controlErase);
    controlWindow = NewWindow(0L, &controlWindowBounds, "\pControl Window", drawAtFirst,
         noGrowDocProc, -1L, true, 0);

SetRect(&temRect,0,0,(controlErase.right-controlErase.left)/4,20);
    cntrlHndlArray[0]=NewControl(controlWindow,&temRect,"\pShow Display 8",true,
         showDisplay8,0,1,checkBoxProc,(long)0);
    temRect.top+=16;temRect.bottom+=16;
```

```
cntrlHndlArray[1]=NewControl(controlWindow,&temRect,"\pShow Display 16",true,
    showDisplay16,0,1,checkBoxProc,(long)0);
temRect.top+=16;temRect.bottom+=16;
cntrlHndlArray[2]=NewControl(controlWindow,&temRect,"\pSensor Button",true,
    useSensorButton,0,1,checkBoxProc,(long)0);
temRect.top+=16;temRect.bottom+=16;
cntrlHndlArray[3]=NewControl(controlWindow,&temRect,"\pTransform",true,
    transformInteract,0,1,checkBoxProc,(long)0);
temRect.top+=16;temRect.bottom+=16;
cntrlHndlArray[4]=NewControl(controlWindow,&temRect,"\pDraw Data",true,showData,0,1,
    checkBoxProc,(long)0);
temRect.top+=16;temRect.bottom+=16;
cntrlHndlArray[5]=NewControl(controlWindow,&temRect,"\pDraw Plots",true,plotting,0,1,
    checkBoxProc,(long)0);
temRect.top+=16;temRect.bottom+=16;
cntrlHndlArray[6]=NewControl(controlWindow,&temRect,"\pPlot I Sensors",true,plotSensor,0,1,
    checkBoxProc,(long)0);
temRect.top+=16;temRect.bottom+=16;
cntrlHndlArray[7]=NewControl(controlWindow,&temRect,"\pAuto Scale Plot 1",true,
    autoScalePlot1,0,1,checkBoxProc,(long)0);
temRect.top+=16;temRect.bottom+=16;
cntrlHndlArray[8]=NewControl(controlWindow,&temRect,"\pAuto Scale Plot 2",true,
    autoScalePlot2,0,1,checkBoxProc,(long)0);
temRect.top+=16;temRect.bottom+=16;
cntrlHndlArray[9]=NewControl(controlWindow,&temRect,"\pAuto Scale Plot 3",true,
    autoScalePlot3,0,1,checkBoxProc,(long)0);

SetRect(&temRect,temRect.right,0,2*(controlErase.right-controlErase.left)/4,20);
cntrlHndlArray[10]=NewControl(controlWindow,&temRect,"\pCollect Data",true,
    collectingData,0,1,checkBoxProc,(long)0);
temRect.top+=16;temRect.bottom+=16; temRect.left+=16;
cntrlHndlArray[11]=NewControl(controlWindow,&temRect,"\pProcess Data",true,
    processingData,0,1,checkBoxProc,(long)0);
temRect.top+=16;temRect.bottom+=16; temRect.left-=16;
temRect.top+=9;temRect.bottom+=9;
cntrlHndlArray[12]=NewControl(controlWindow,&temRect,"\pStart Init",true,0,0,1,
    checkBoxProc,(long)0);
temRect.top+=20;temRect.bottom+=20;
cntrlHndlArray[13]=NewControl(controlWindow,&temRect,"\pEnd Init",true,0,0,1,
    pushButProc,(long)0);
temRect.top+=25;temRect.bottom+=25;
cntrlHndlArray[14]=NewControl(controlWindow,&temRect,"\pSingle Sweep",true,0,0,1,
    pushButProc,(long)0);
temRect.top+=25;temRect.bottom+=25;
cntrlHndlArray[15]=NewControl(controlWindow,&temRect,"\pBar Graph",true,showBarGraph,0,1,
    checkBoxProc,(long)0);
temRect.top+=16;temRect.bottom+=16;
    temRect.left+=20;
cntrlHndlArray[16]=NewControl(controlWindow,&temRect,"\pContinuous Plotting",true,
    continuousBarPlotting,0,1,checkBoxProc,(long)0); temRect.left-=20;
SetRect(&temRect,temRect.right,0,3*(controlErase.right-controlErase.left)/4,20);
cntrlHndlArray[20]=NewControl(controlWindow,&temRect,"\pUse History",true,useHistory,0,1,
    checkBoxProc,(long)0);

temRect.top+=16;temRect.bottom+=16;
cntrlHndlArray[21]=NewControl(controlWindow,&temRect,"\pThreshold",true,useThreshold,0,1,
    checkBoxProc,(long)0);
```

```
item=14;
SetRect(&temRect,temRect.left+10,temRect.bottom+10,temRect.left+10+item,temRect.bottom+10+item);
temRect.top+=(sizeOfSensorArray-1)*item;
temRect.bottom+=(sizeOfSensorArray-1)*item;
temRect.left-=item;
temRect.right-=item;
for (i=0;i<sizeOfSensorArray*sizeOfSensorArray;i++)
{
    if((i/sizeOfSensorArray)*sizeOfSensorArray==i)
    {
        temRect.left+=item;temRect.right+=item;
        temRect.top-=item*(sizeOfSensorArray-1);temRect.bottom-=item*
            (sizeOfSensorArray-1);
    }
    else
    {
        temRect.top+=item;temRect.bottom+=item;
    }
    cntrlHndlArray[30+i]=NewControl(controlWindow,&temRect,"\p",true,
        validSensorOverride[i],0,1,checkBoxProc,(long)0);
    temRect.right+=(sizeOfSensorArray+1)*item;
    temRect.left+=(sizeOfSensorArray+1)*item;
    plotHndlArray[i]=NewControl(controlWindow,&temRect,"\p",true,1,0,1,checkBoxProc,
        (long)0);
    temRect.right-=(sizeOfSensorArray+1)*item;
    temRect.left-=(sizeOfSensorArray+1)*item;
} temRect.top-=item*(sizeOfSensorArray-1);temRect.bottom-=item*(sizeOfSensorArray-1);
temRect.left+=item+10;temRect.right+=item+10+26;
/*  cntrlHndlArray[29]=NewControl(controlWindow,&temRect,"\pGame",true,0,0,1,pushButProc,
        (long)0);*/
    temRect.top+=16;temRect.bottom+=16;
/*  cntrlHndlArray[28]=NewControl(controlWindow,&temRect,"\pPlot",true,0,0,1,pushButProc,
        (long)0);*/

SetRect(&temRect,3*(controlErase.right-controlErase.left)/4,0,4*
    (controlErase.right-controlErase.left)/4,20);
cntrlHndlArray[22]=NewControl(controlWindow,&temRect,"\pTablet Control",
    true,tabletControl,0,1,radioButProc,(long)0);
temRect.top+=16;temRect.bottom+=16;
cntrlHndlArray[23]=NewControl(controlWindow,&temRect,"\pMouse Control",
    true,mouseControl,0,1,radioButProc,(long)0);
    temRect.top+=16;temRect.bottom+=16;
    cntrlHndlArray[24]=NewControl(controlWindow,&temRect,"\pJoy Stick Control",true,
        joyStickControl,0,1,radioButProc,(long)0);
    temRect.top+=24;temRect.bottom+=24;
    cntrlHndlArray[25]=NewControl(controlWindow,&temRect,"\pMove in Window",true,
        moveInWindow,0,1,radioButProc,(long)0);
    temRect.top+=16;temRect.bottom+=16;
    cntrlHndlArray[26]=NewControl(controlWindow,&temRect,"\pMove in Screen",true,
        moveInScreen,0,1,radioButProc,(long)0);
} void MouseDownInControlWindow(Point globalWhere)
```

```
{
    ControlHandle theControl;
    Point temPoint;
    int partCode,takeButtonAction;
    GrafPtr savePort;

GetPort(&savePort);
    temPoint=globalWhere;
    GlobalToLocal(&temPoint); /* Already set to this port by activate event, I think */
    partCode=FindControl(temPoint,controlWindow,&theControl);
    if(partCode==inCheckBox)
    {
        if(TrackControl(theControl,temPoint,0L)) /* Does mouse come back up within CheckBox? */
        {
            int i;
            for (i=0;i<25;i++)/* switches to choose sensor plot */
            {
                if(theControl==plotHndlArray[i])
                {
                    SetCtlValue(theControl,1-(**plotHndlArray[i]).contrlValue);
                }
            }
            for (i=30;i<55;i++)/* switches to disable sensors */
            {
                if(theControl==cntrlHndlArray[i])
                {
                    Toggle(&validSensorOverride[i-30]);
                    SetCtlValue(theControl,validSensorOverride[i-30]);
                }
            }
            if(theControl==cntrlHndlArray[0])
            {
                Toggle(&showDisplay8);
                SetCtlValue(theControl,showDisplay8);
                showDisplay=showDisplay8+showDisplay16; /*on if either is on*/
            }
            if(theControl==cntrlHndlArray[1])
            {
                Toggle(&showDisplay16);
                SetCtlValue(theControl,showDisplay16);
                showDisplay=showDisplay8+showDisplay16; /*on if either is on*/
            }
            if(theControl==cntrlHndlArray[2])
            {
                Toggle(&useSensorButton);
                SetCtlValue(theControl,useSensorButton);
            }
            if(theControl==cntrlHndlArray[3])
            {
                Toggle(&transformInteract);
                SetCtlValue(theControl,transformInteract);
            }
            if(theControl==cntrlHndlArray[4])
            {
                Toggle(&showData);
                SetCtlValue(theControl,showData);
            }
            if(theControl==cntrlHndlArray[5])
            {
                Toggle(&plotting);
```

```
         SetCtlValue(theControl,plotting);
    }
    if(theControl==cntrlHndlArray[6])
    {
         Toggle(&plotSensor);
         SetCtlValue(theControl,plotSensor);
    }
    if(theControl==cntrlHndlArray[7])
    {
         Toggle(&autoScalePlot1);
         SetCtlValue(theControl,autoScalePlot1);
    }
    if(theControl==cntrlHndlArray[8])
    {
         Toggle(&autoScalePlot2);
         SetCtlValue(theControl,autoScalePlot2);
    }
    if(theControl==cntrlHndlArray[9])
    {
         Toggle(&autoScalePlot3);
         SetCtlValue(theControl,autoScalePlot3);
    }
    if(theControl==cntrlHndlArray[10])
    {
         Toggle(&collectingData);
         SetCtlValue(theControl,collectingData);
    }
    if(theControl==cntrlHndlArray[11])
    {
         Toggle(&processingData);
         SetCtlValue(theControl,processingData);
    }
    if(theControl==cntrlHndlArray[12])
    {
         if(initializingArray==0)
         {
            Toggle(&initializingArray);
            SetCtlValue(theControl,initializingArray);
            InitializeData();
         }
    }
    if(theControl==cntrlHndlArray[15])
    {
         Toggle(&showBarGraph);
         SetCtlValue(theControl,showBarGraph);
    }
    if(theControl==cntrlHndlArray[16])
    {
         Toggle(&continuousBarPlotting);
         SetCtlValue(theControl,continuousBarPlotting);
    }
    if(theControl==cntrlHndlArray[20])
    {
         Toggle(&useHistory);
         SetCtlValue(theControl,useHistory);
    }
    if(theControl==cntrlHndlArray[21])
    {
         Toggle(&useThreshold);
```

```
            SetCtlValue(theControl,useThreshold);
        }
        /*Next 5 are two groups of radio buttons and get handled differently*/
        if(theControl==cntrlHndlArray[22])
        {
            if(!tabletControl)
            {
                tabletControl=1;mouseControl=joyStickControl=0;
                SetCtlValue(cntrlHndlArray[22],tabletControl);
                SetCtlValue(cntrlHndlArray[23],mouseControl);
                SetCtlValue(cntrlHndlArray[24],joyStickControl);
            }
        }
        if(theControl==cntrlHndlArray[23])
        {
            if(!mouseControl)
            {
                mouseControl=1;tabletControl=joyStickControl=0;
                SetCtlValue(cntrlHndlArray[22],tabletControl);
                SetCtlValue(cntrlHndlArray[23],mouseControl);
                SetCtlValue(cntrlHndlArray[24],joyStickControl);
            }
        }
        if(theControl==cntrlHndlArray[24])
        {
            if(!joyStickControl)
            {
                joyStickControl=1;tabletControl=mouseControl=0;
                SetCtlValue(cntrlHndlArray[22],tabletControl);
                SetCtlValue(cntrlHndlArray[23],mouseControl);
                SetCtlValue(cntrlHndlArray[24],joyStickControl);
            }
        }
        if(theControl==cntrlHndlArray[25])
        {
            if(!moveInWindow)
            {
                Toggle(&moveInWindow);
                SetCtlValue(cntrlHndlArray[25],moveInWindow);
                Toggle(&moveInScreen);
                SetCtlValue(cntrlHndlArray[26],moveInScreen);
                moveWidth=gameWindowBounds.right-gameWindowBounds.left;
                moveHeight=gameWindowBounds.bottom-gameWindowBounds.top;
            }
        }
        if(theControl==cntrlHndlArray[26])
        {
            if(!moveInScreen)
            {
                Toggle(&moveInWindow);
                SetCtlValue(cntrlHndlArray[25],moveInWindow);
                Toggle(&moveInScreen);
                SetCtlValue(cntrlHndlArray[26],moveInScreen);
                moveWidth=screenBits.bounds.right-screenBits.bounds.left;
                moveHeight=screenBits.bounds.bottom-screenBits.bounds.top;
            }
        }
    }/* if TrackControl returned true */
}/* if partCode = inCheckBox */
if(partCode==inButton)
```

```
    {
        if(TrackControl(theControl,temPoint,0L))    /* 12:StartInit; 13:EndInit; 14: SingleSweep */
        {
            if(theControl==cntrlHndlArray[13])
            {
                initializingArray=0;
                SetCtlValue(cntrlHndlArray[12],initializingArray);
                RangeAndValidData();
            }
            if(theControl==cntrlHndlArray[14])
            {
                singleSweep=1;
                collectingData=1;
                processingData=1;
                SetCtlValue(cntrlHndlArray[11],processingData);
            }
        } /* end of TrackControl */
    }/* end of "inButton"*/
    SetPort(savePort);
}/* end of MouseDown */ void OnGoAwayControlWindow(void)
{
    HideWindow(controlWindow);
} void ActivateControlWindow(int active) /* !active means deactivate */
{
    if(active) /* activate */
    {
        SetPort(controlWindow);
    }
} void UpdateControlWindow(void)
{
    DrawControls(controlWindow);
} void UseControlWindow(int code)
{
}
```

We claim:

1. A keyboard for a electronic device comprising
a first key having
   a touch surface which, in one mode, is responsive to pressing by a user's finger to indicate a selection associated with the first key, and
   an array of sensors exposed at the touch surface to detect, in another mode, the location where a finger is positioned on the touch surface as an indication of information to be conveyed by a user, and
a second key having an array of sensors which are exposed at a touch surface of the second key and are sensitive to manipulations of a finger on the touch surface to provide signals for switching the first key from the one mode to the other mode.

2. The keyboard of claim 1 wherein said first key comprises
   a discrete key body bearing said touch surface and mounted to be movable in a direction to render said touch surface responsive, in said one mode, to said pressing by a user's finger.

3. The keyboard of claim 1 wherein each of said sensors of said first key comprises electro-optical elements.

4. The keyboard of claim 3 wherein said electro-optical elements operate in the infra-red spectrum.

5. The keyboard of claim 1 wherein each of said sensors of said first key comprises a phototransistor and a light emitting diode.

6. The keyboard of claim 1 wherein each of said sensors of said first key comprises a beam source and a beam detector oriented so that the beam detector can detect a beam which originates from said beam source and is reflected by the finger.

7. The keyboard of claim 6 wherein said beam detector and said beam source define optical axes which are parallel.

8. The keyboard of claim 7 wherein said touch surface is perpendicular to said optical axes.

9. The keyboard of claim 1 wherein said array of said first key is rectangular.

10. The keyboard of claim 1 wherein said array of said second key is linear.

11. The keyboard of claim 1 wherein said sensors of said first key number twenty-five and are arranged in a square array.

12. The keyboard of claim 1 wherein said array of sensors of said second key are arranged in a row, said sensors of said second key being arranged to produce said provided signals as signal patterns in response to said manipulations of a finer on the touch surface.

13. The keyboard of claim 1 further comprising circuitry for responding to the sensors of said first key and for providing corresponding signals representing the finger position.

14. The keyboard of claim 13 wherein said circuitry includes timing elements for causing said first key to operate in scans, a signal pattern being derived from said sensors for each scan.

15. The keyboard of claim 14 wherein said circuitry includes analysis elements for generating a value representative of the signal pattern for each scan, each signal pattern corresponding to information to be conveyed by the user.

16. The keyboard of claim 15 wherein said value represents a position.

17. The keyboard of claim 15 wherein said value represents a velocity.

18. The keyboard of claim 15 wherein said value represents a point within a possible range of a continuous parameter.

19. The keyboard of claim 18 wherein said continuous parameter comprises a parameter associated with audio or video signals.

20. The keyboard of claim 13 wherein said circuitry comprises
 a noise suppressor for reducing the effect of background noise on the signals.

21. The keyboard of claim 13 wherein said circuitry comprises a center-of-mass computational element which determines a center of mass of output signals provided by said sensors of said first key using the signal from each sensor as a weight and the horizontal and vertical positions of the sensor within the array serve as coordinates.

22. The keyboard of claim 1 wherein said sensors of said first key comprise light sensitive detectors.

23. The keyboard of claim 1 wherein the array of sensors of said first key can detect m different finger positions on the touch surface of said first key, m an order of magnitude greater than the number of sensors of said first key.

24. The keyboard of claim 1 further comprising beam sources exposed at said touch surface of said first key numbering fewer than the number of sensors of said first key.

25. The keyboard of claim 1 further comprising a beam source exposed at said touch surface of said first key.

26. The keyboard of claim 1 wherein said second key comprises a <SPACE> bar.

* * * * *

UNITED STATES PATENT AND TRADEMARK OFFICE
CERTIFICATE OF CORRECTION

PATENT NO. : 5,341,133

DATED : August 23, 1994

INVENTOR(S) : Robert L. Savoy et al.

It is certified that error appears in the above-identified patent and that said Letters Patent is hereby corrected as shown below:

Title page, under [56] References Cited, OTHER PUBLICATIONS, after "Touch-and Feel Interfaces: Built-in pointing devices replace mice in notebooks and laptops", insert --Reinhardt--.

Col. 5, line 2, after "6'" insert a comma.

Col. 5, line 16, after "array" insert --is--.

Col. 13, line 8, replace ") ." with --).--.

Col. 13, line 26, pushed should be in quotes.

Col. 131, claim 12, line 15, "finer" should be --finger--.

Col. 132, claim 21, line 15, "the" should be --that--.

Signed and Sealed this

Second Day of July, 1996

Attest:

BRUCE LEHMAN

*Attesting Officer*     *Commissioner of Patents and Trademarks*